(12) United States Patent
Masuoka et al.

(10) Patent No.: US 10,483,366 B2
(45) Date of Patent: *Nov. 19, 2019

(54) SEMICONDUCTOR DEVICE

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 29 days.

This patent is subject to a terminal disclaimer.

(21) Appl. No.: 15/680,724

(22) Filed: Aug. 18, 2017

(65) Prior Publication Data

US 2017/0345909 A1  Nov. 30, 2017

Related U.S. Application Data

(63) Continuation of application No. 14/743,570, filed on Jun. 18, 2015, now Pat. No. 9,780,179.

(30) Foreign Application Priority Data

Jul. 14, 2014  (WO) .................. PCT/JP2014/068707

(51) Int. Cl.
*H01L 29/423* (2006.01)
*H01L 29/78* (2006.01)
(Continued)

(52) U.S. Cl.
CPC ...... *H01L 29/42392* (2013.01); *H01L 21/762* (2013.01); *H01L 21/8221* (2013.01);
(Continued)

(58) Field of Classification Search
CPC ......... H01L 29/42392; H01L 29/66666; H01L 29/7827; H01L 27/0688; H01L 27/092
See application file for complete search history.

(56) References Cited

U.S. PATENT DOCUMENTS 1,804,286 A      5/1931  Speno
5,208,172 A  *  5/1993  Fitch ............... H01L 21/823487
                                                257/E21.41
(Continued)

FOREIGN PATENT DOCUMENTS

EP      1 804 286 A1    7/2007
JP      H02-071556 A    3/1990
(Continued)

OTHER PUBLICATIONS

International Preliminary Report on Patentability in corresponding International Application No. PCT/JP2014/068707, dated Jan. 26, 2017, 7 pages.
(Continued)

*Primary Examiner* — Victoria K. Hall
(74) *Attorney, Agent, or Firm* — Brinks Gilson & Lione

(57) ABSTRACT

A semiconductor device includes a third first-conductivity-type semiconductor layer on a semiconductor substrate, and a first pillar-shaped semiconductor layer on the semiconductor substrate. The first pillar-shaped semiconductor layer including a first first-conductivity-type semiconductor layer, a first body region, a second first-conductivity-type semiconductor layer, a first second-conductivity-type semiconductor layer, a second body region, a second second-conductivity-type semiconductor layer, and a third second-conductivity-type semiconductor layer. A first gate insulating film is around the first body region, and a first gate is around the first gate insulating film. A second gate insulating film is around the second body region and a second gate is around the second gate insulating film. An
(Continued)

output terminal is connected to the second first-conductivity-type semiconductor layer and the first second-conductivity-type semiconductor layer, and a first contact connects the first gate and the second gate.

1 Claim, 70 Drawing Sheets

(51) Int. Cl.
    *H01L 29/66*     (2006.01)
    *H01L 29/40*     (2006.01)
    *H01L 21/762*     (2006.01)
    *H01L 27/06*     (2006.01)
    *H01L 21/8238*     (2006.01)
    *H01L 21/822*     (2006.01)
    *H01L 27/092*     (2006.01)

(52) U.S. Cl.
    CPC .. *H01L 21/823885* (2013.01); *H01L 27/0688* (2013.01); *H01L 27/092* (2013.01); *H01L 29/401* (2013.01); *H01L 29/66666* (2013.01); *H01L 29/7827* (2013.01)

(56) References Cited

U.S. PATENT DOCUMENTS

| | | | |
|---|---|---|---|
| 5,308,778 A | | 5/1994 | Fitch et al. |
| 5,308,782 A | * | 5/1994 | Mazure ............... H01L 21/8221 438/154 |
| 5,324,673 A | * | 6/1994 | Fitch ................. H01L 21/28525 257/329 |
| 5,398,200 A | * | 3/1995 | Mazure ............. H01L 21/76897 257/296 |
| 5,612,563 A | * | 3/1997 | Fitch ................. H01L 21/76897 257/329 |
| 9,431,501 B2 | * | 8/2016 | Masuoka ............ H01L 29/7827 |
| 9,627,494 B2 | * | 4/2017 | Masuoka ........ H01L 21/823814 |
| 9,780,179 B2 | * | 10/2017 | Masuoka ........... H01L 29/42392 |
| 9,947,670 B2 | * | 4/2018 | Masuoka ............ H01L 27/0207 |
| 10,026,739 B2 | * | 7/2018 | Masuoka ............ H01L 23/5286 |
| 10,217,665 B2 | * | 2/2019 | Masuoka .......... H01L 21/76883 |
| 2003/0047749 A1 | | 3/2003 | Chaudhry et al. |
| 2003/0057477 A1 | | 3/2003 | Hergenrother et al. |
| 2007/0252201 A1 | | 11/2007 | Kito et al. |
| 2010/0308422 A1 | * | 12/2010 | Masuoka ............ H01L 27/0207 257/401 |
| 2011/0241122 A1 | * | 10/2011 | Masuoka ................ H01L 27/11 257/369 |

FOREIGN PATENT DOCUMENTS

| | | |
|---|---|---|
| JP | H02-188966 A | 7/1990 |
| JP | H03-145761 A | 6/1991 |
| JP | 06-013623 A | 1/1994 |
| JP | 10-112543 A | 4/1998 |
| JP | 2001-28399 A | 1/2001 |
| JP | 2003-163280 A | 6/2003 |
| JP | 2007-059680 A | 3/2007 |
| JP | 2007-250652 A | 9/2007 |
| JP | 2008-300558 A | 12/2008 |
| JP | 2011-23543 A | 2/2011 |
| JP | 2014-057068 A | 3/2014 |

OTHER PUBLICATIONS

Office Action in corresponding U.S. Appl. No. 14/743,570, dated May 18, 2016, 11 pages.
Office Action in corresponding U.S. Appl. No. 14/743,570, dated Oct. 5, 2016, 10 pages.
Office Action in corresponding U.S. Appl. No. 14/743,570, dated Mar. 6, 2017, 10 pages.
Notice of Allowance in corresponding U.S. Appl. No. 14/743,570, dated Jun. 28, 2017, 11 pages.

* cited by examiner

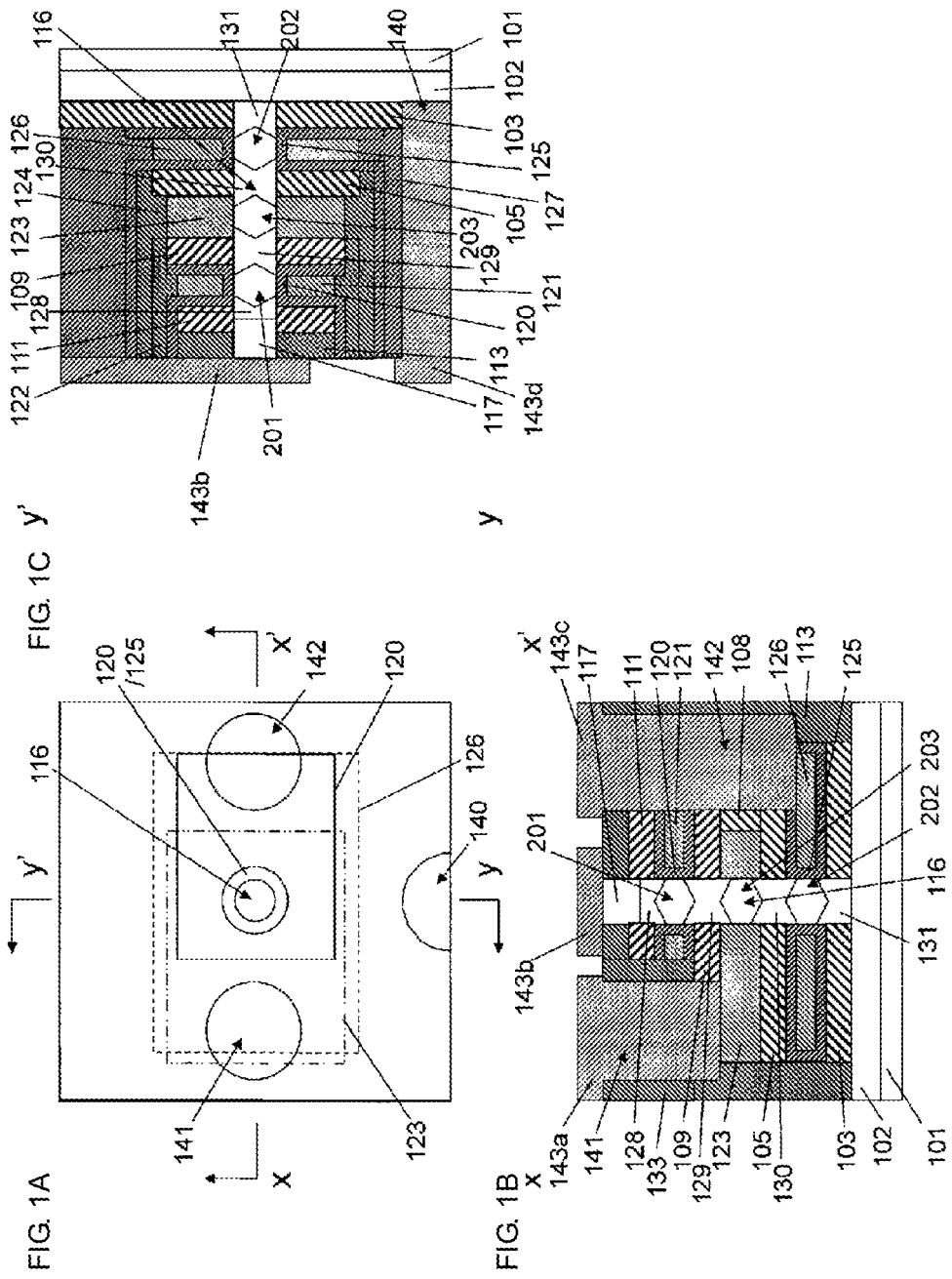

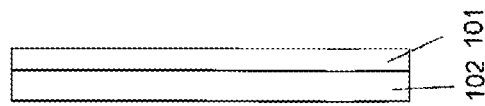
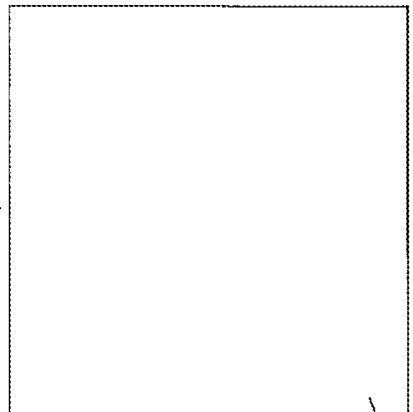
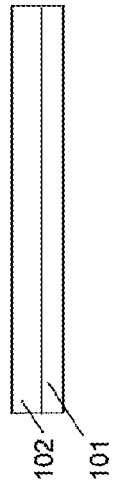

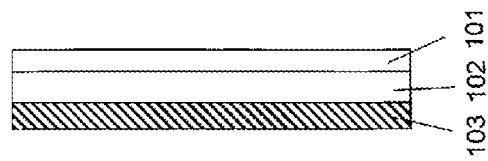
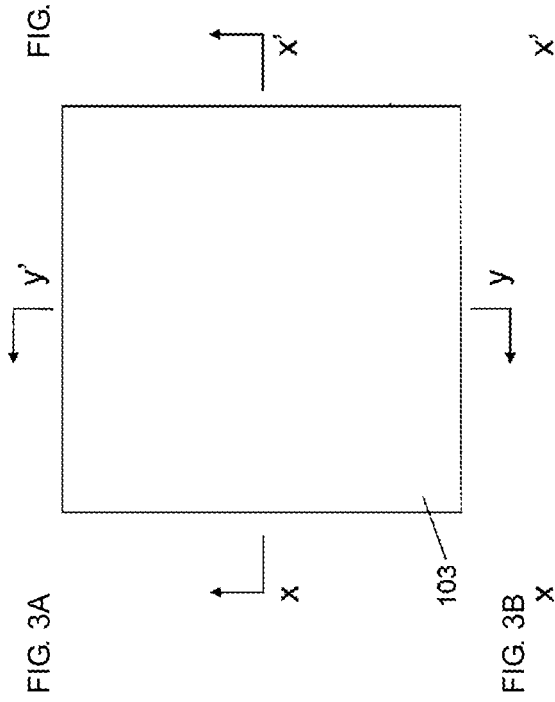
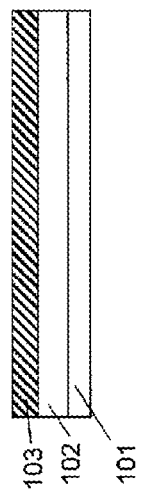

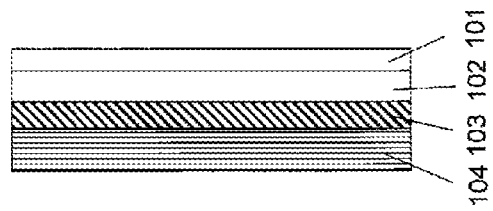
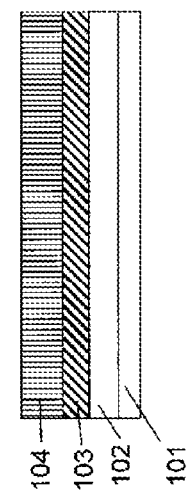
FIG. 4A
FIG. 4B
FIG. 4C

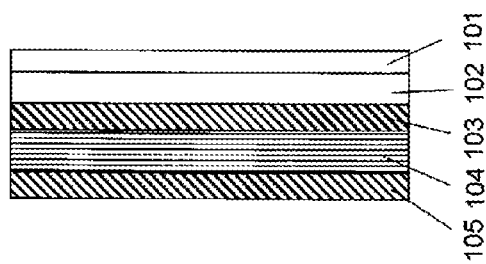
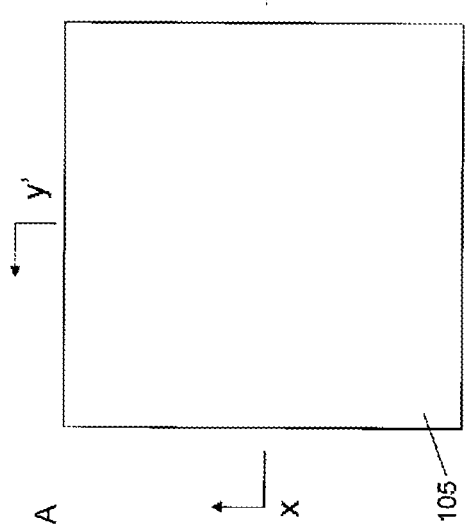
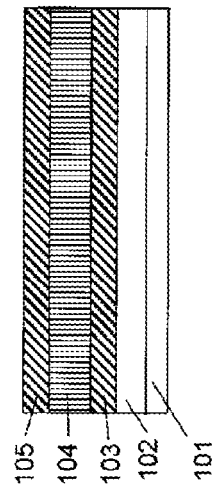
FIG. 5C
FIG. 5A
FIG. 5B

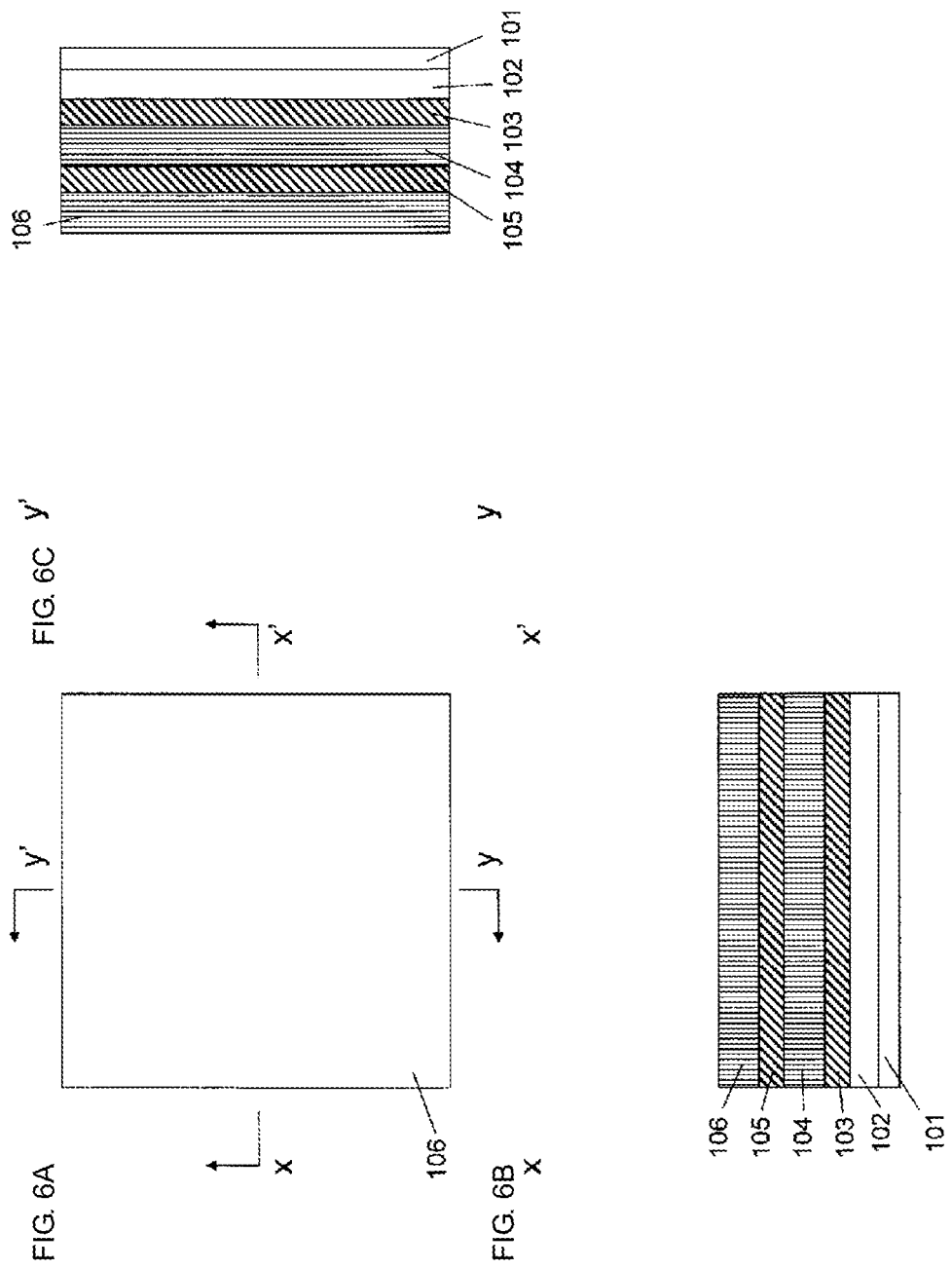

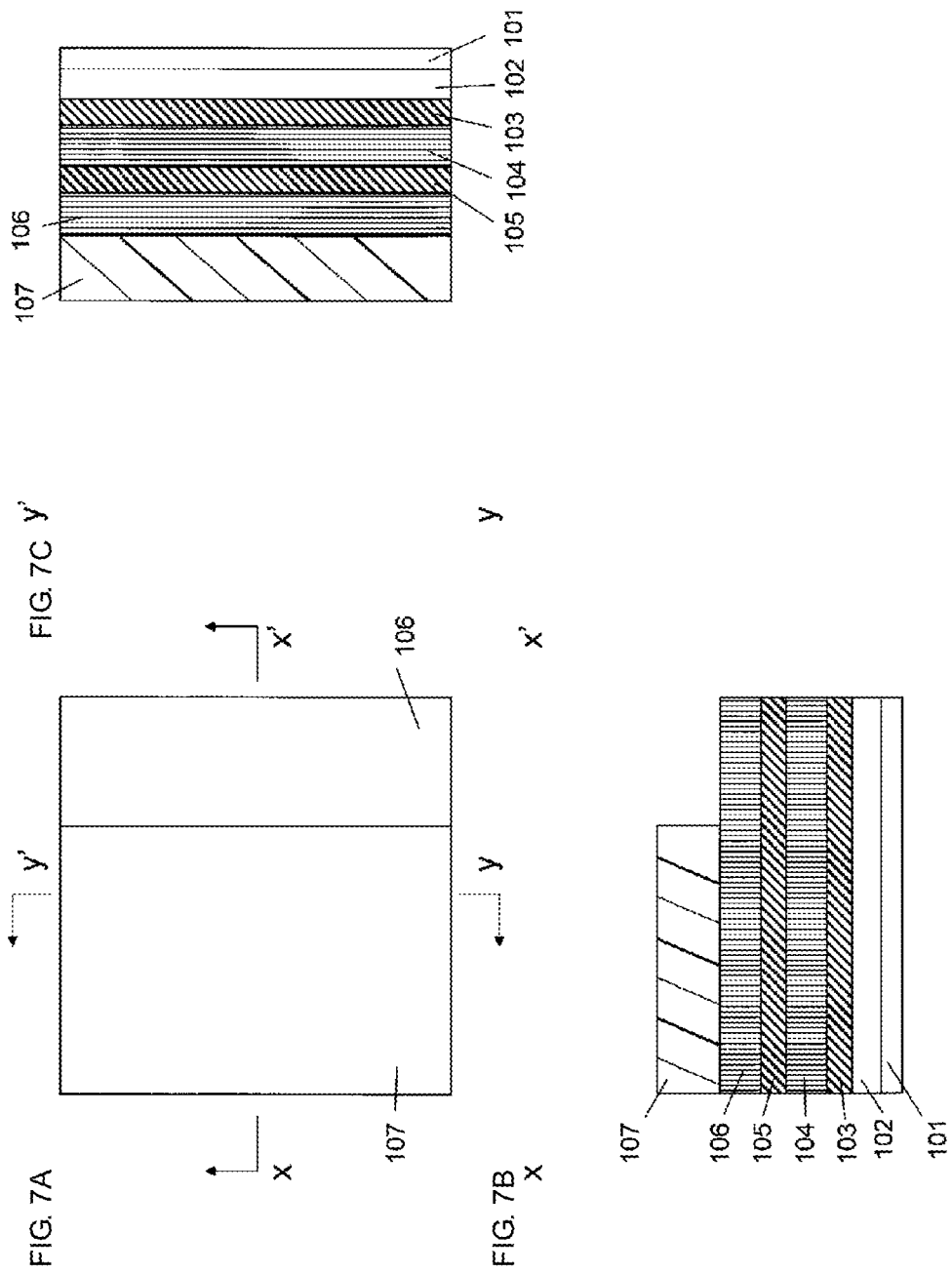

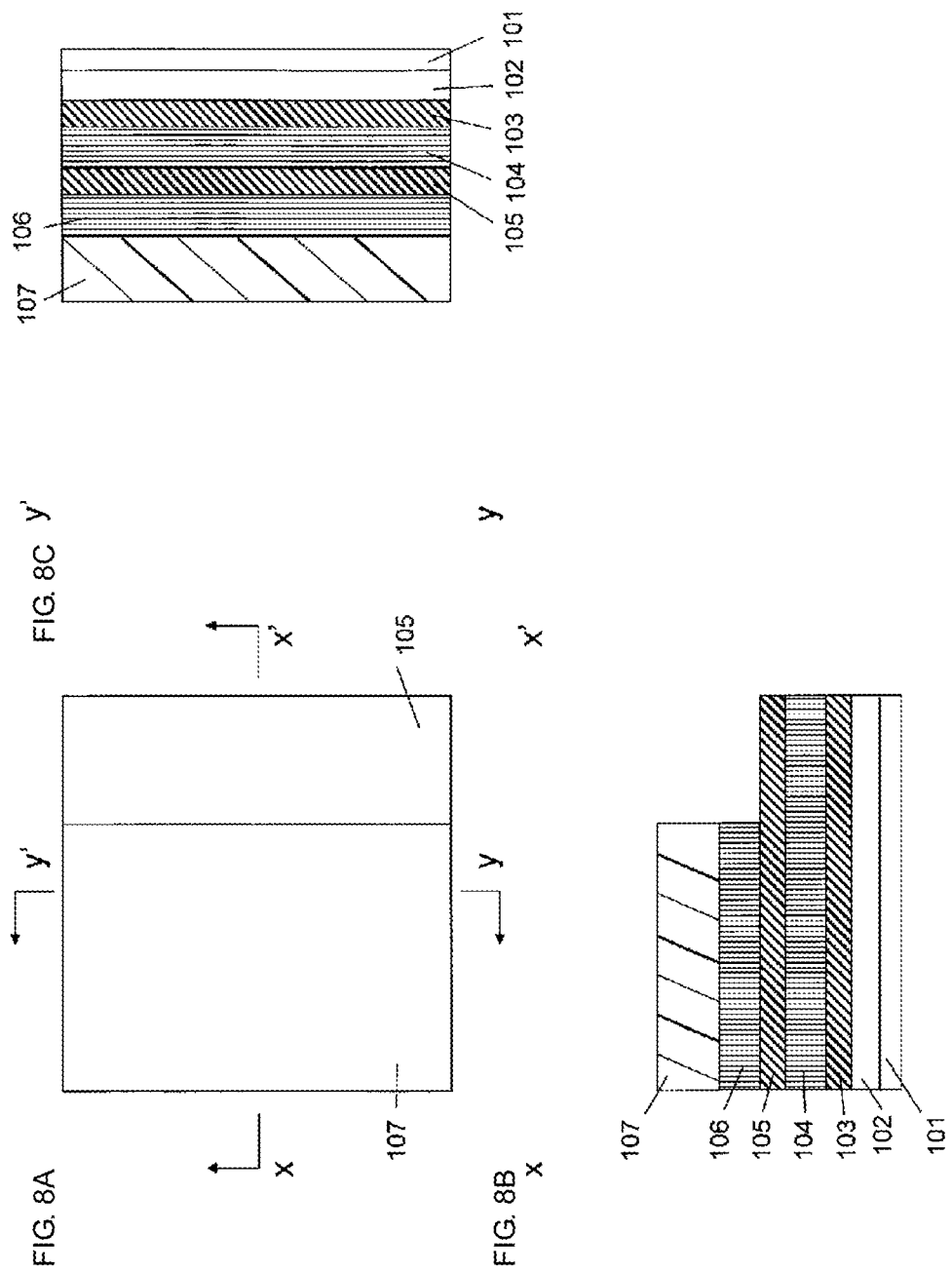

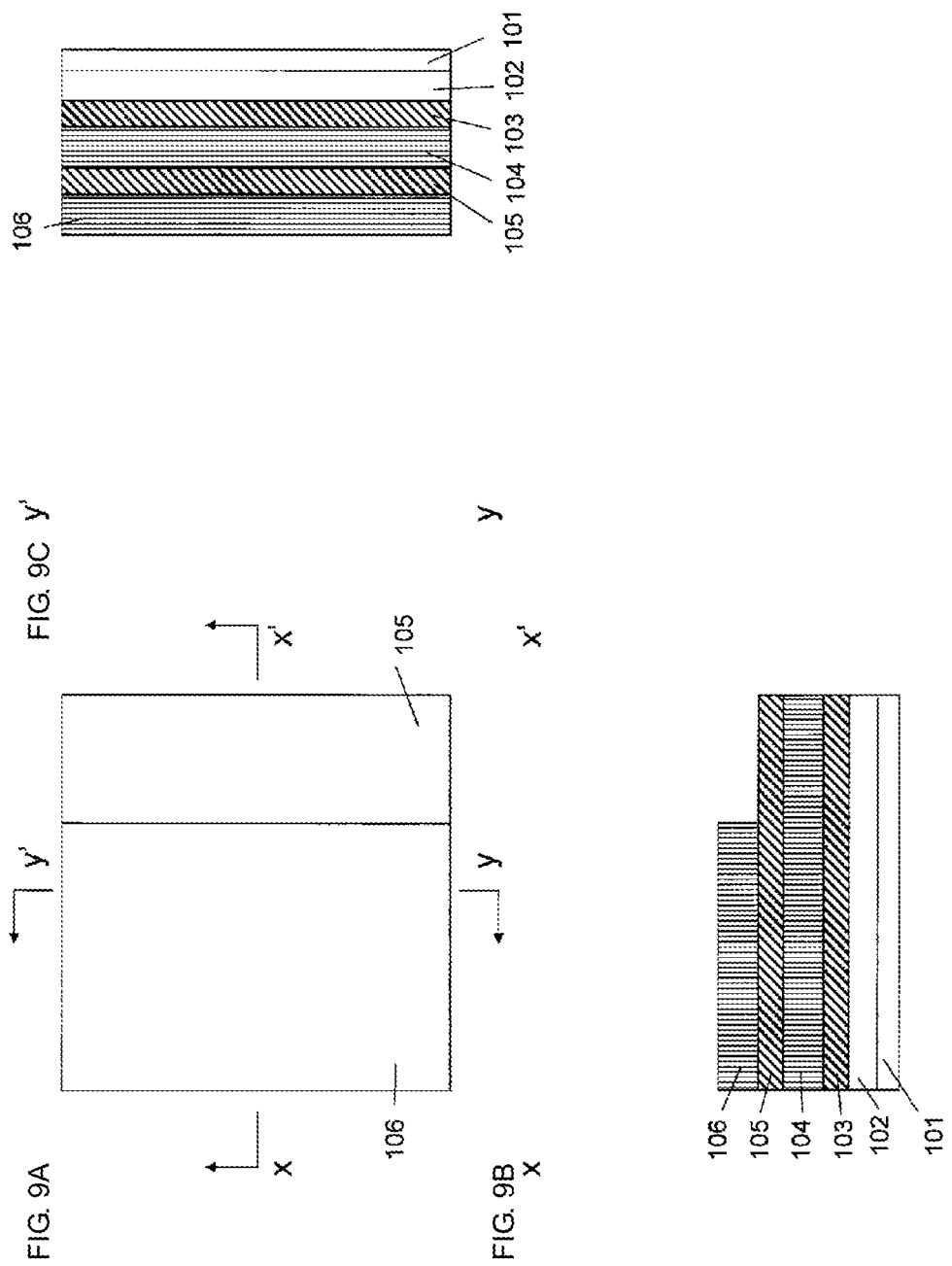

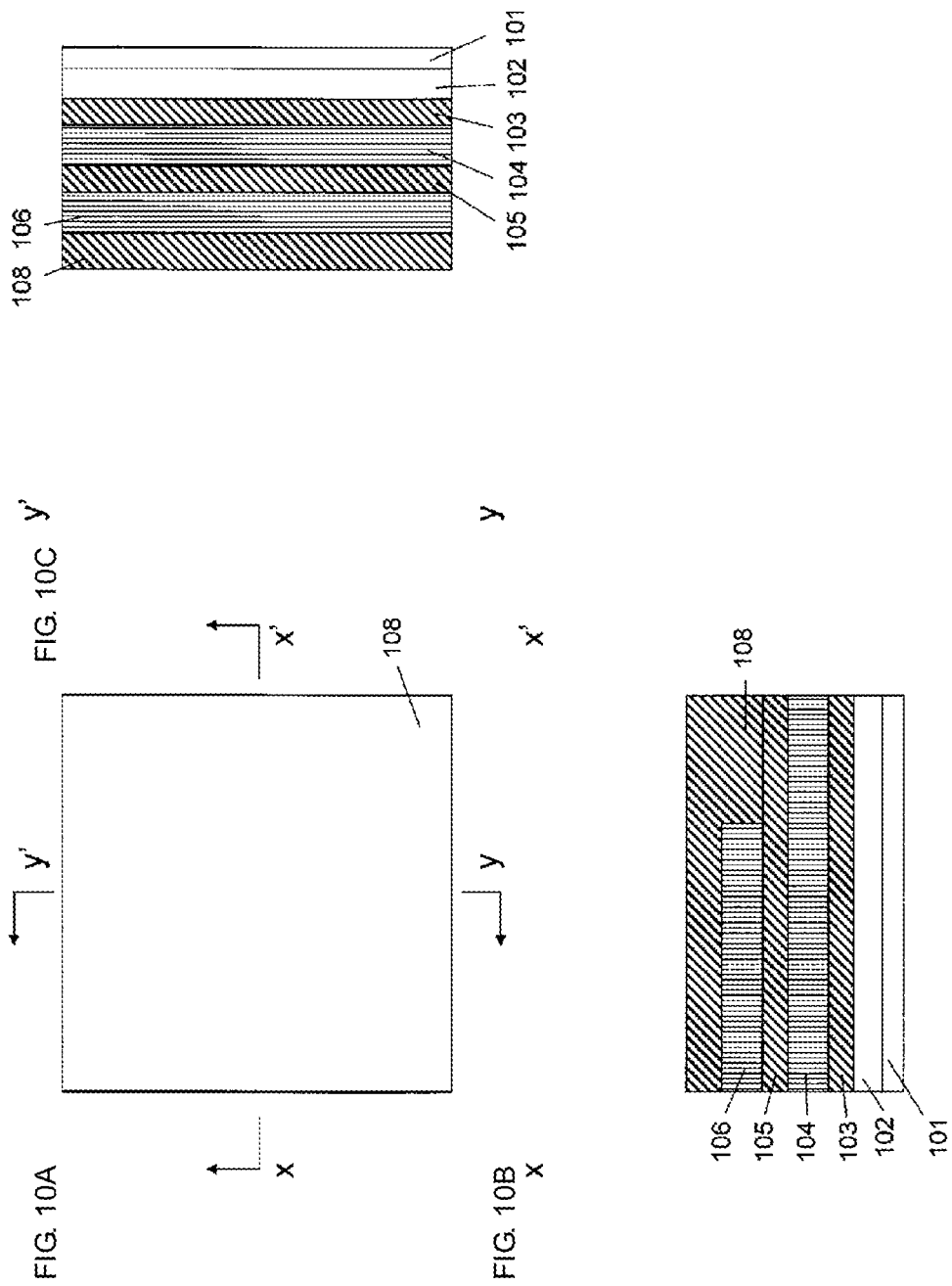

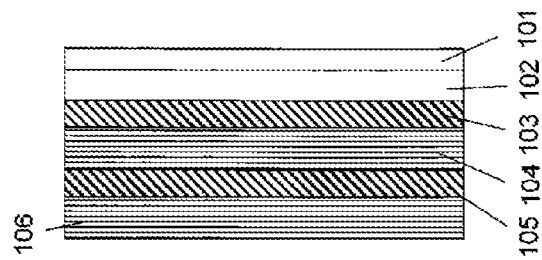
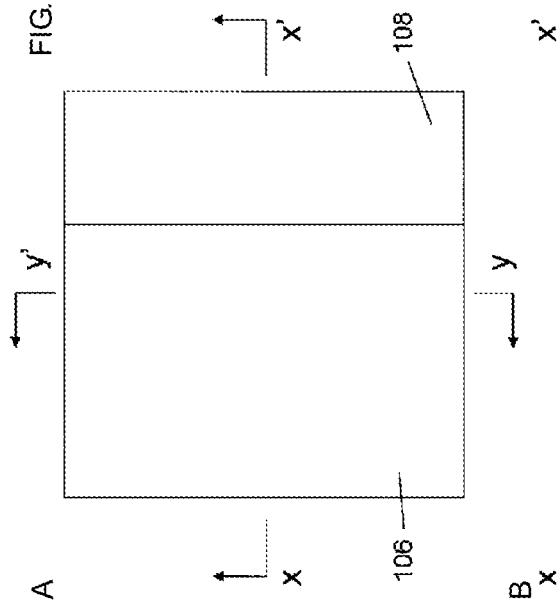
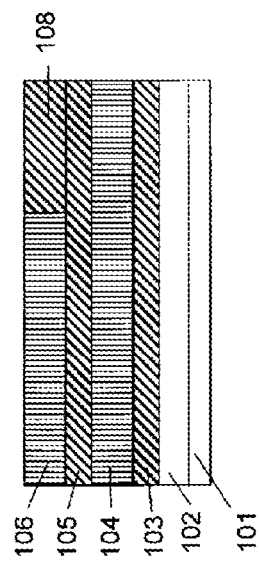

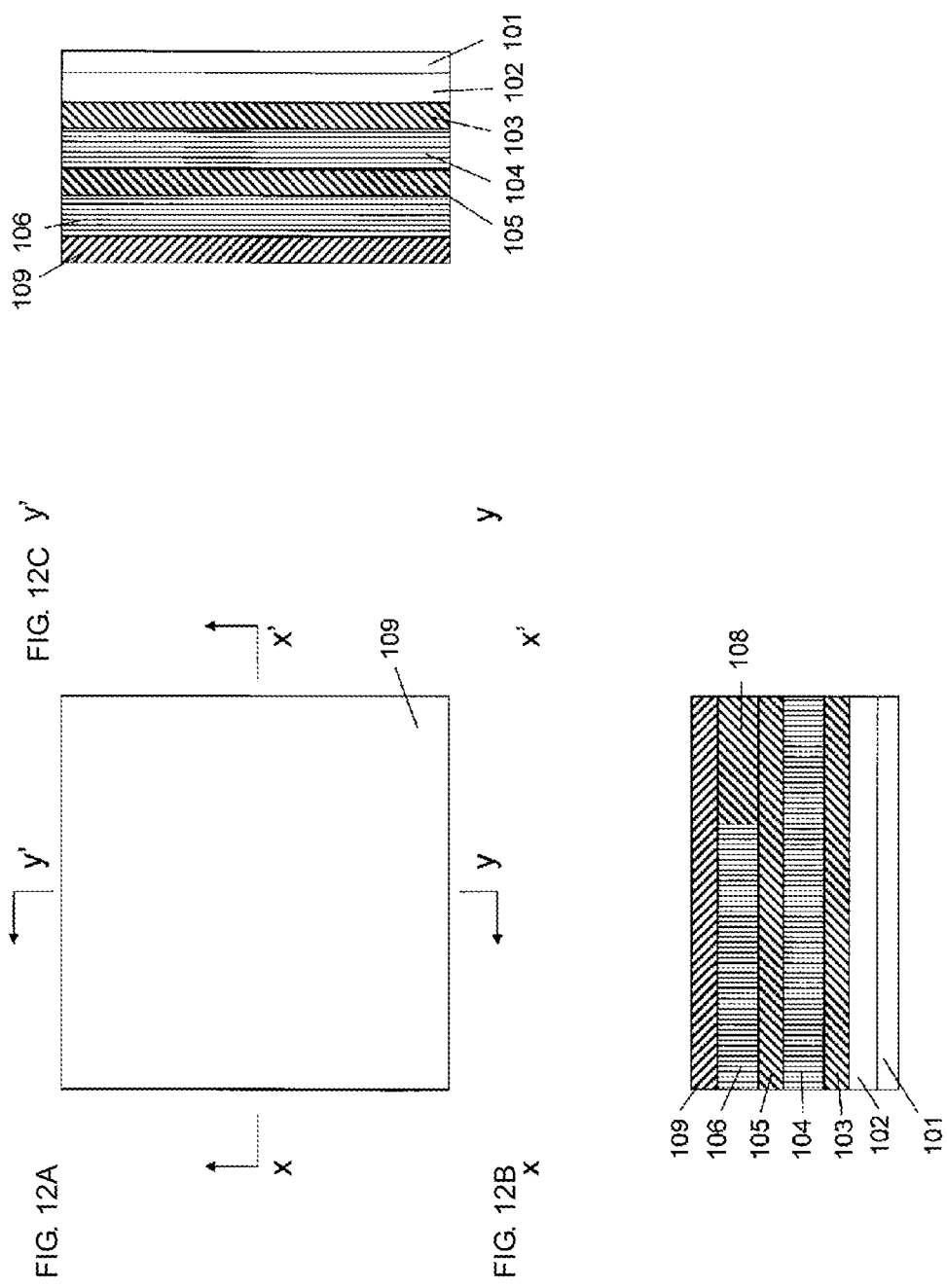

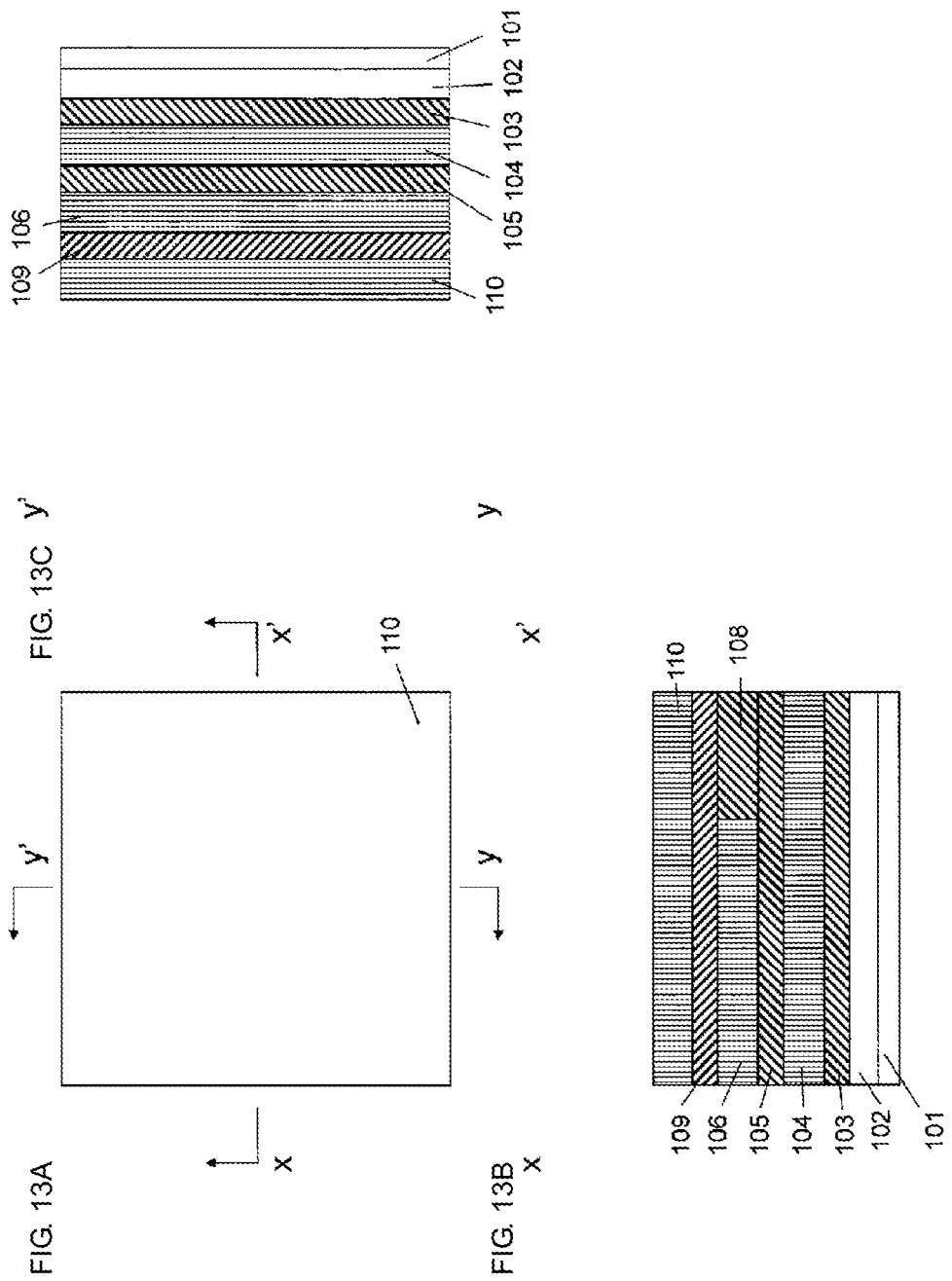

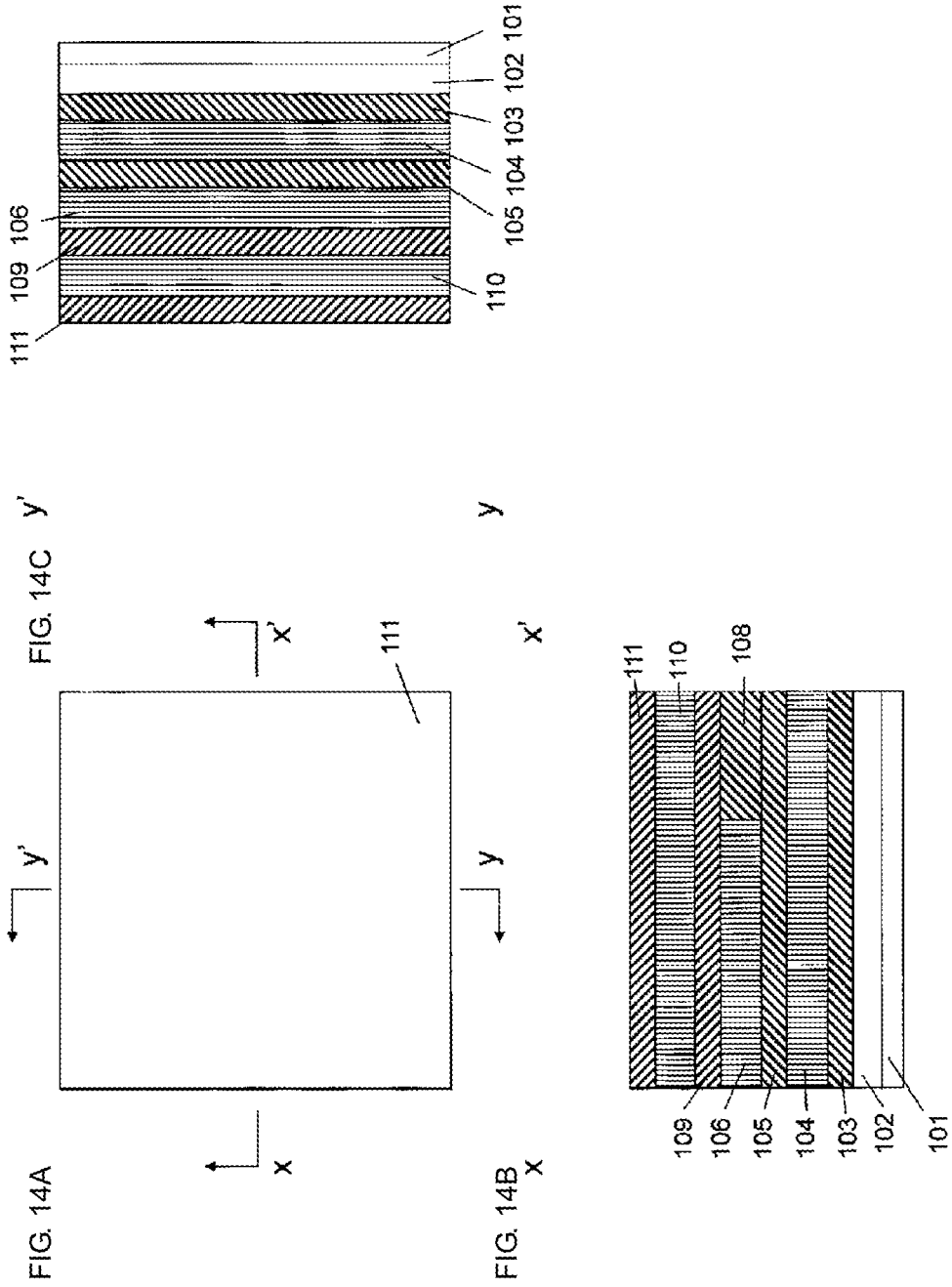

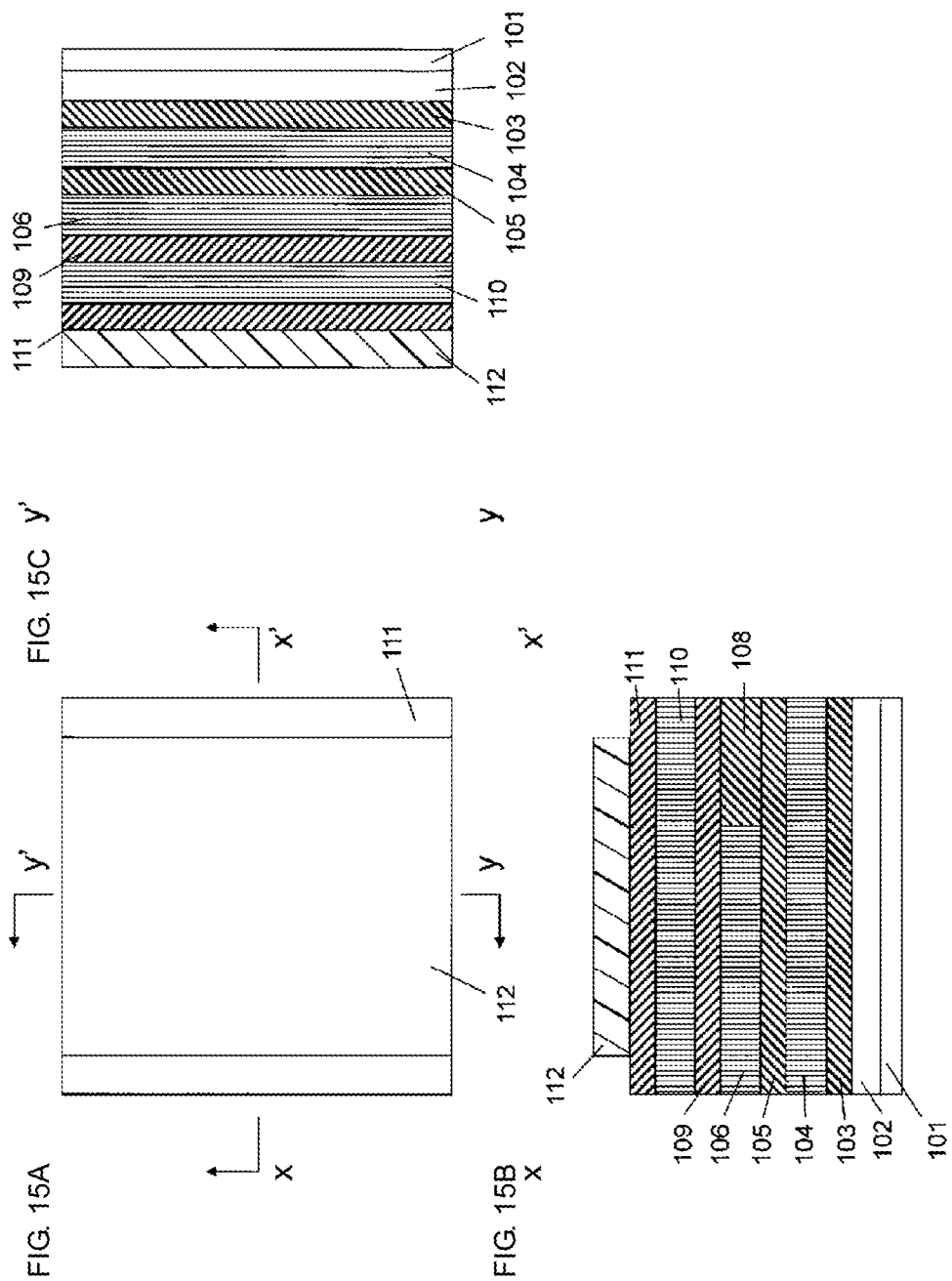

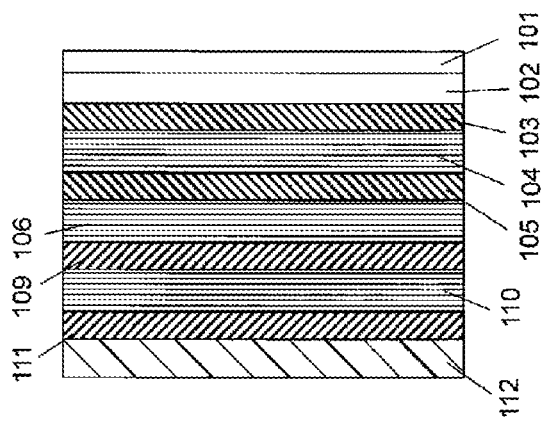
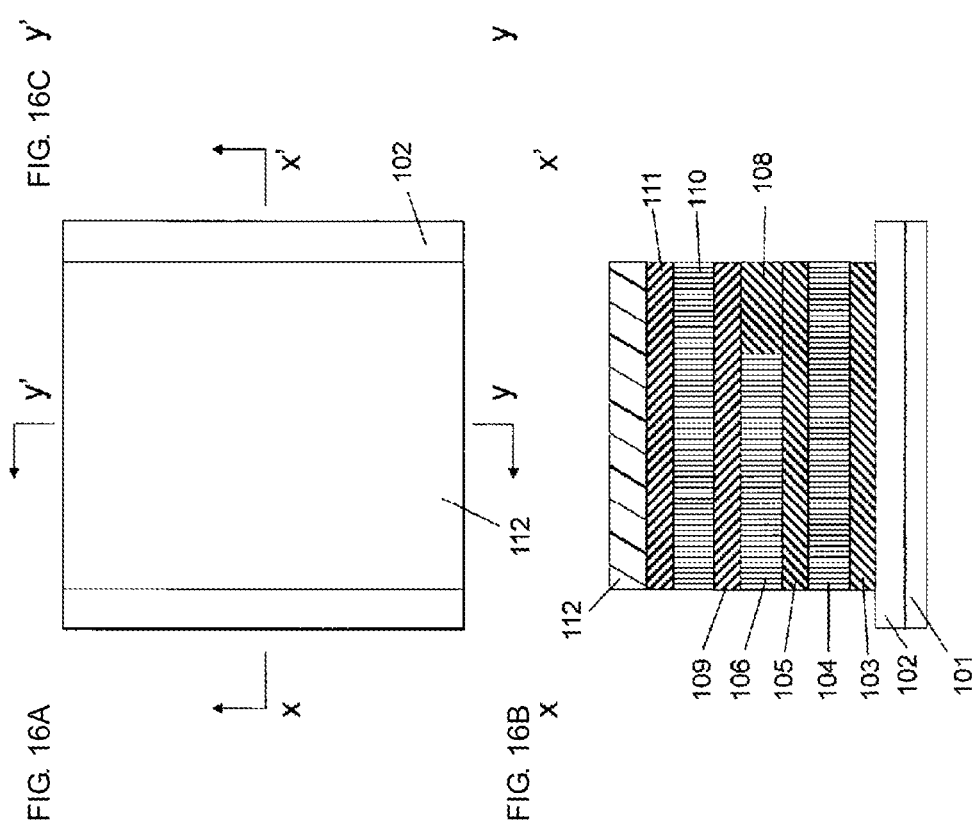
FIG. 16A
FIG. 16B
FIG. 16C

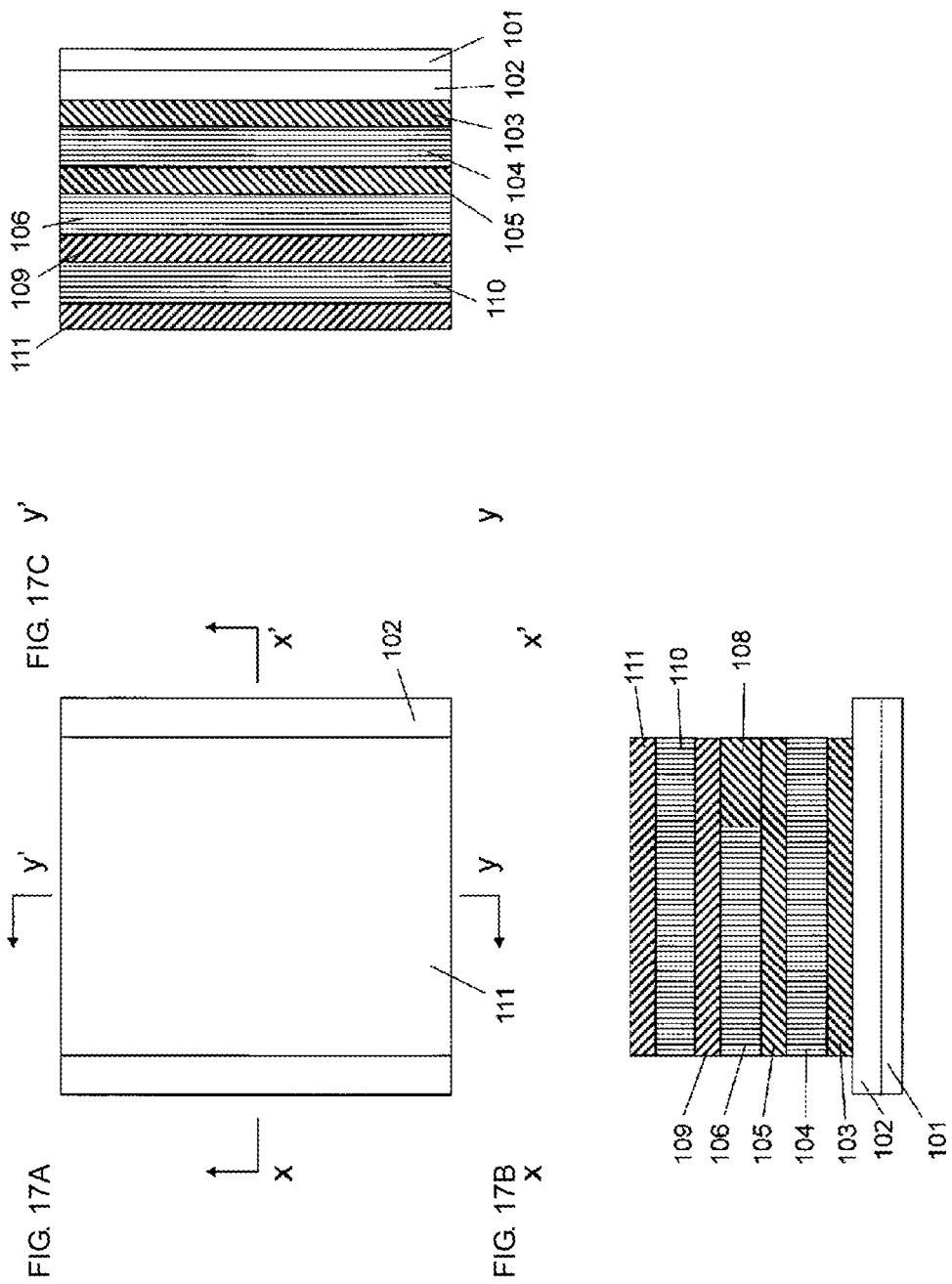

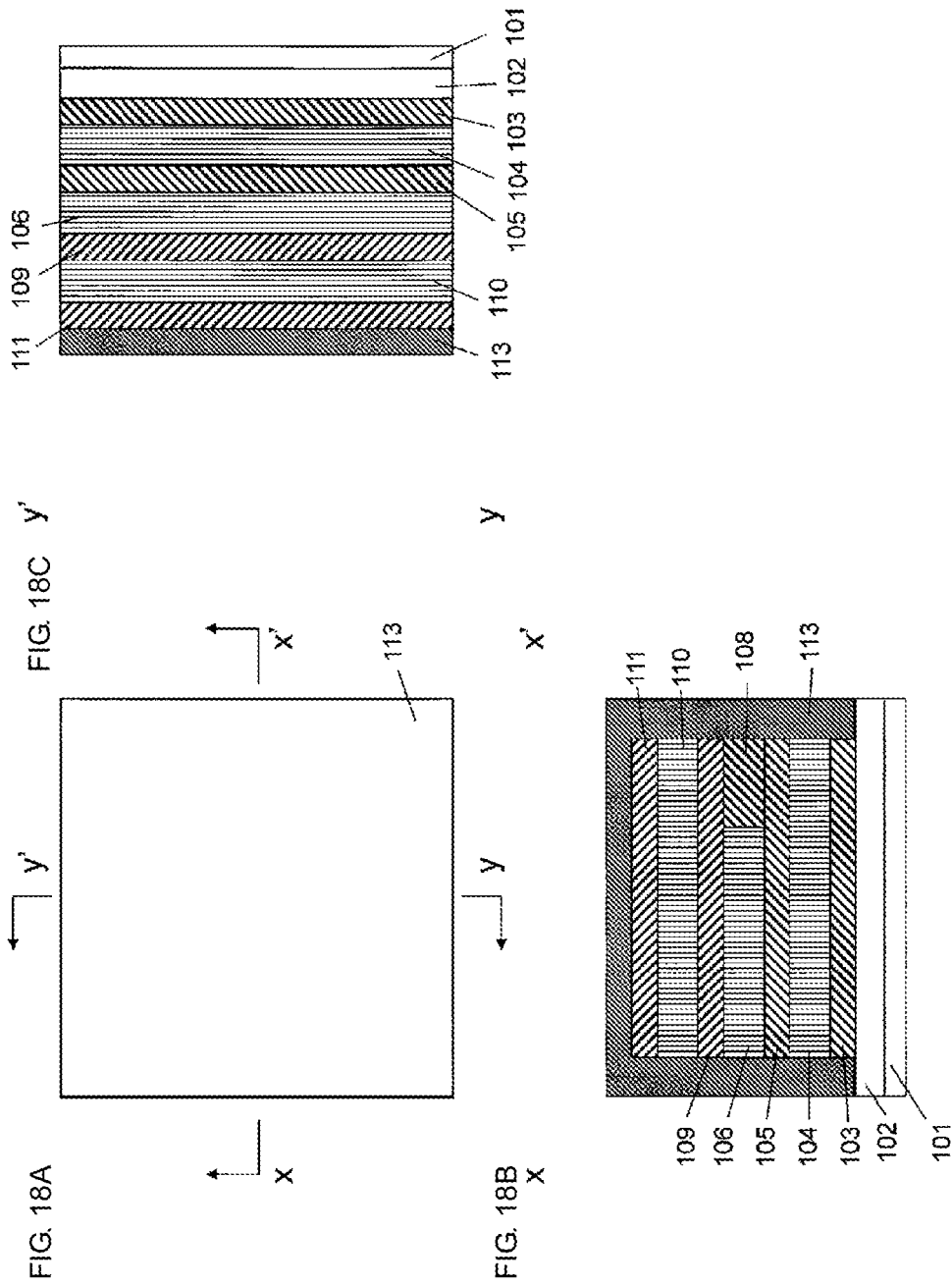

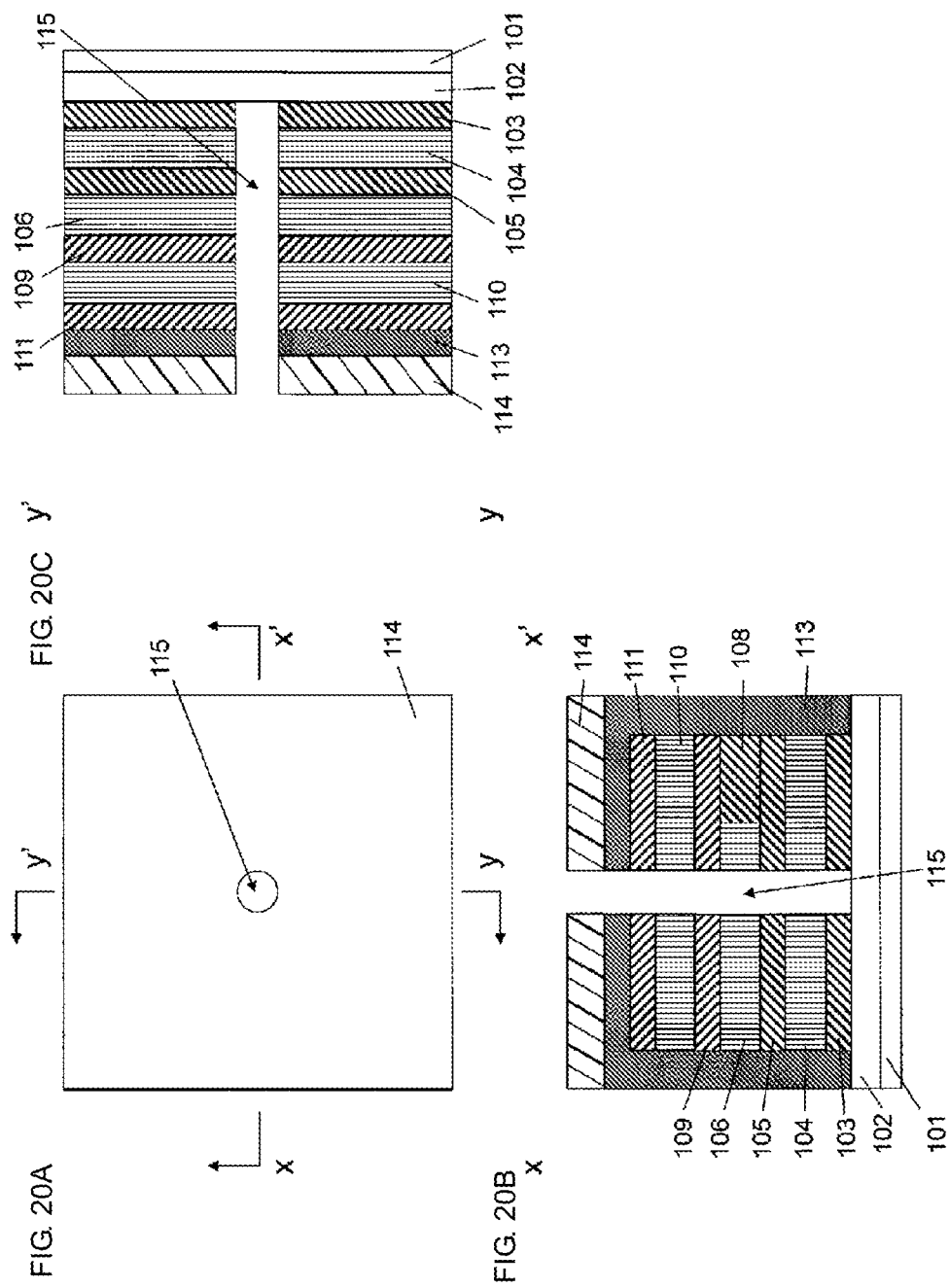

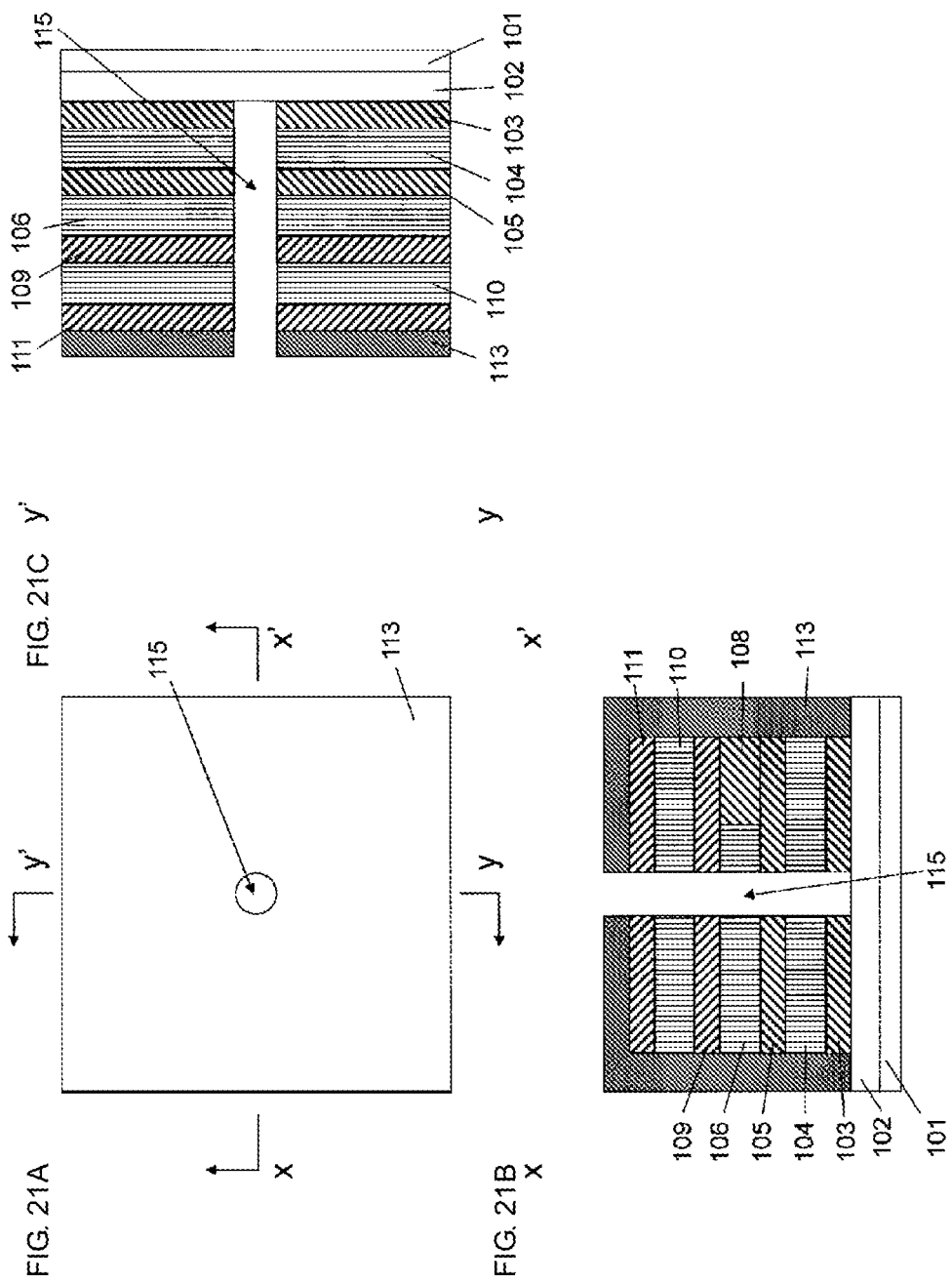

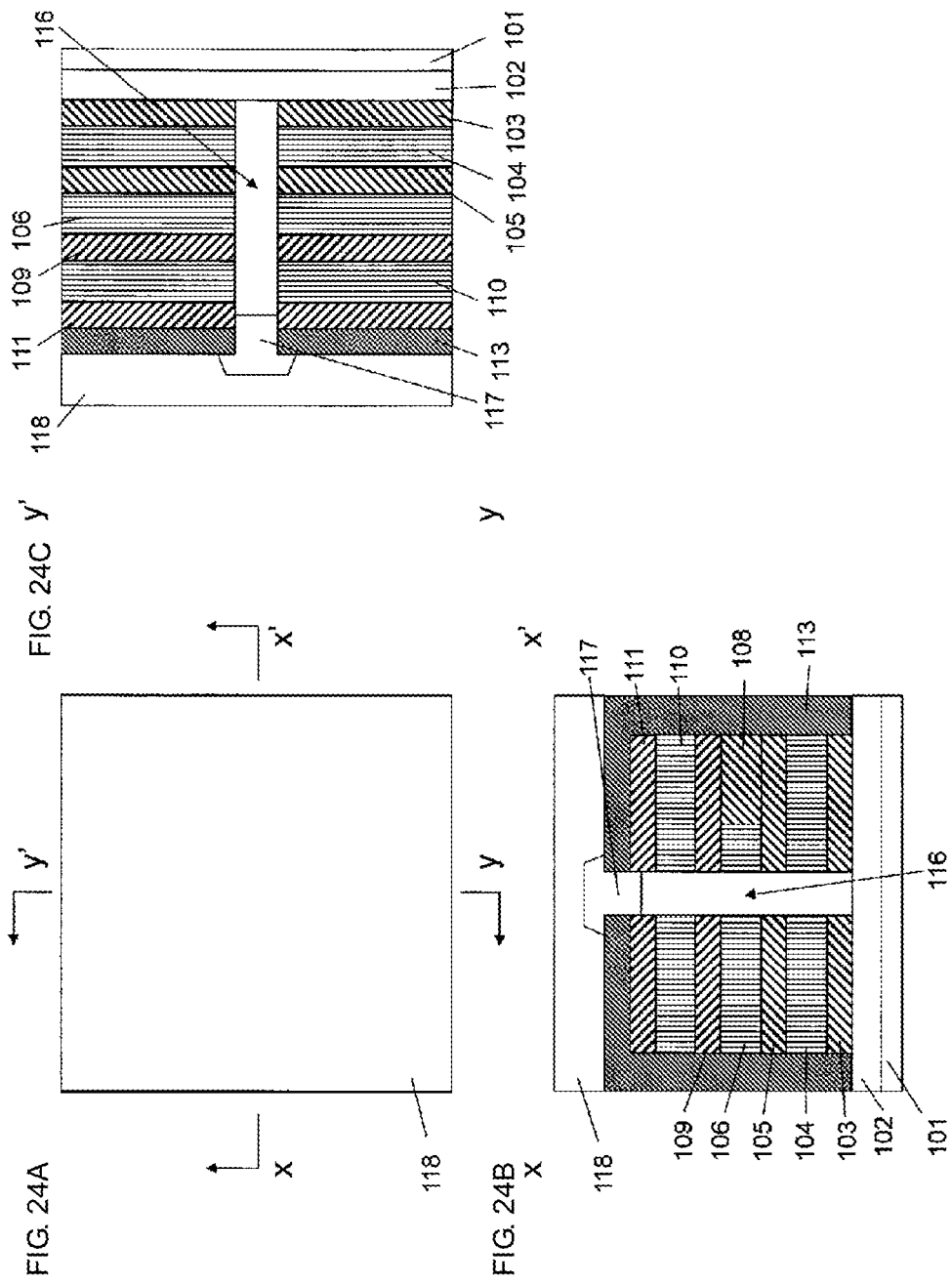

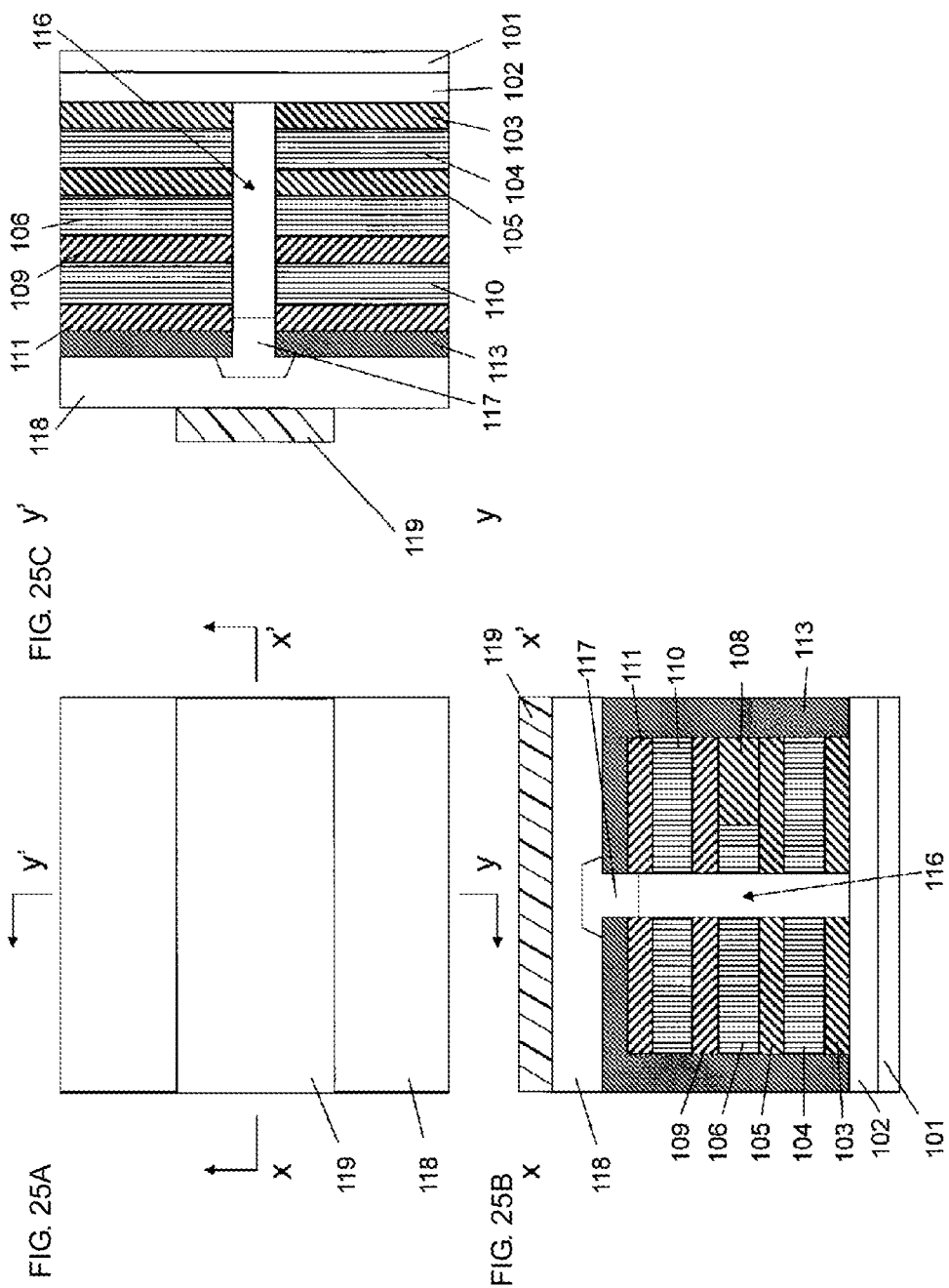

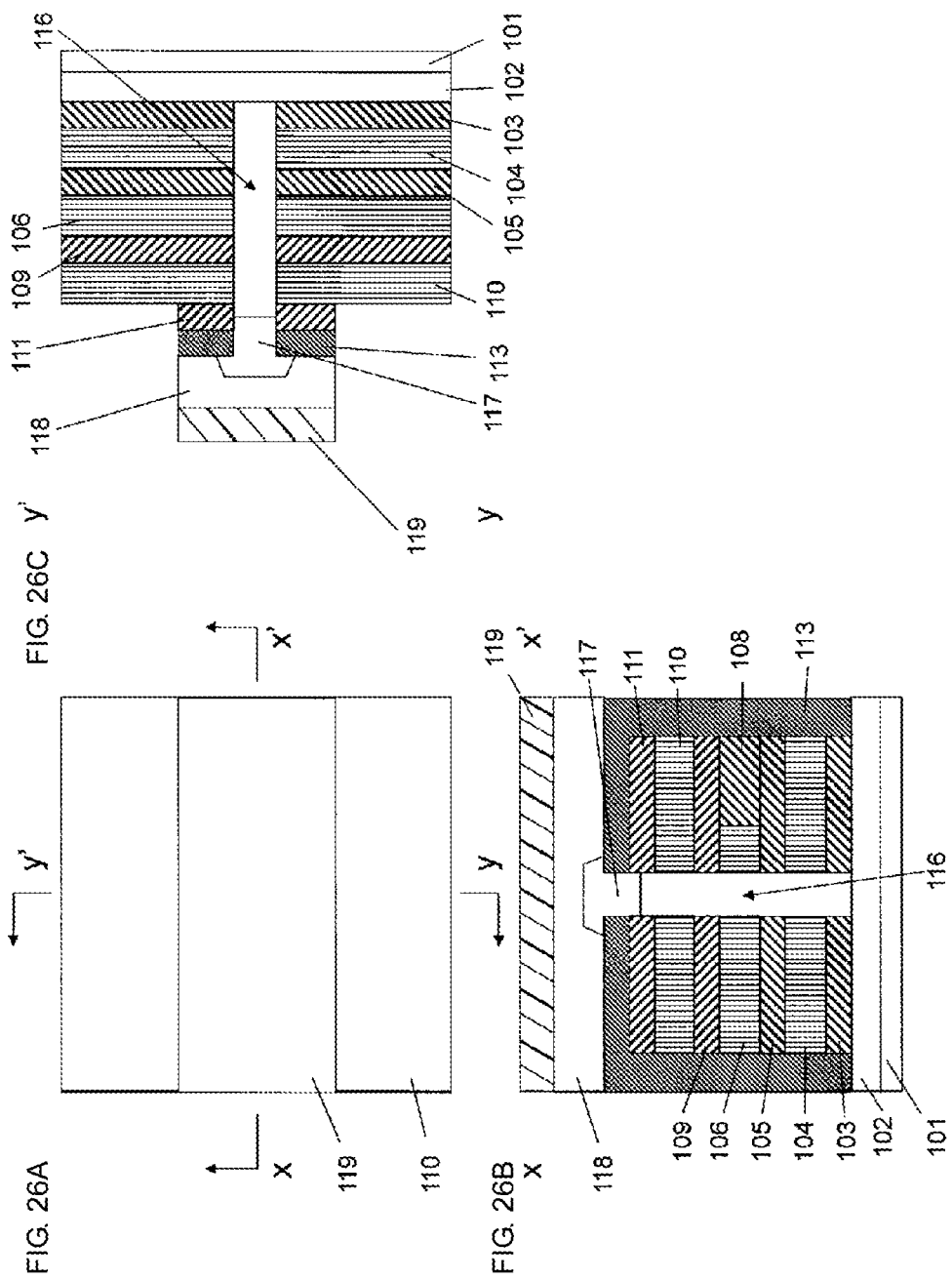

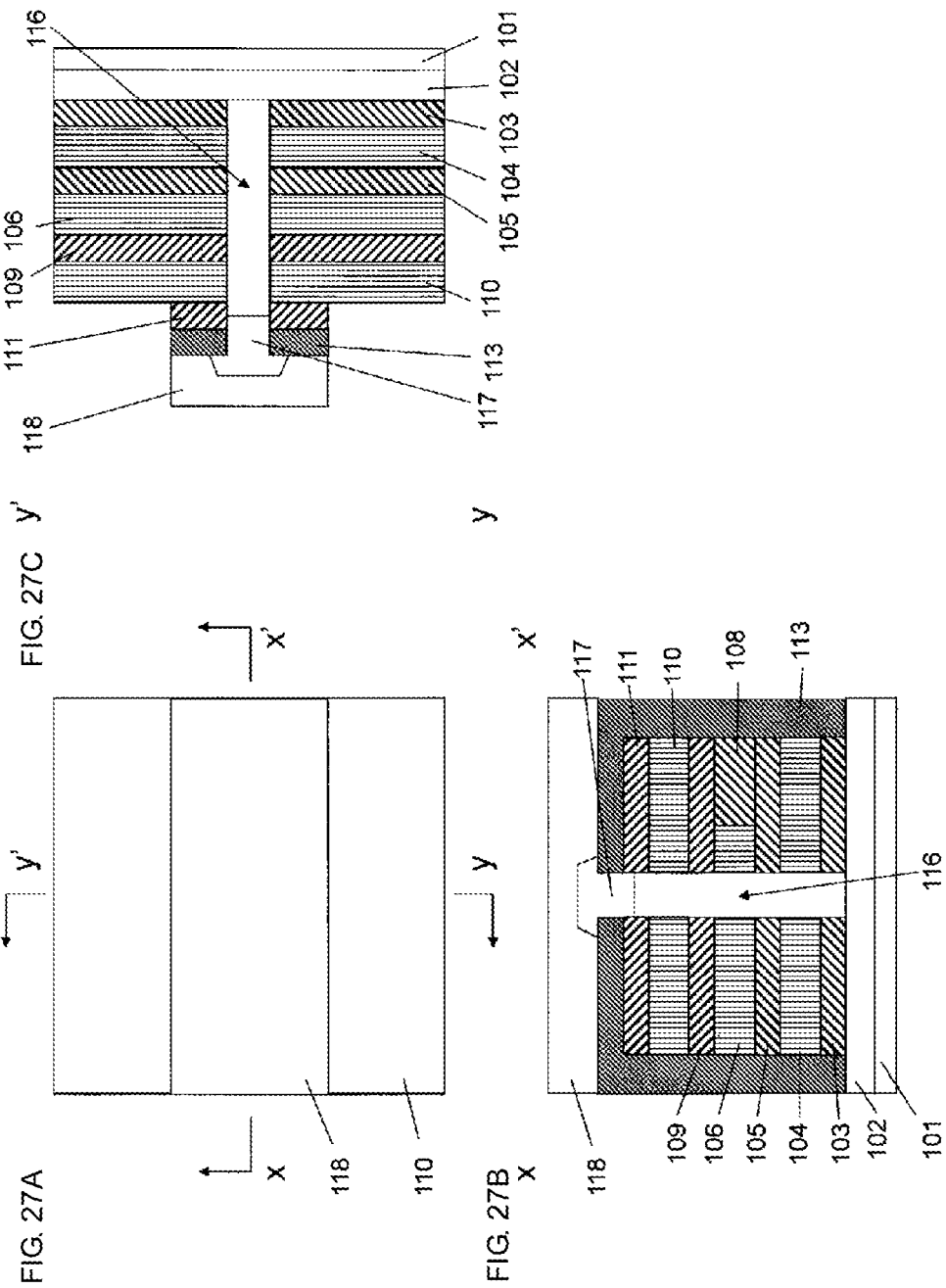

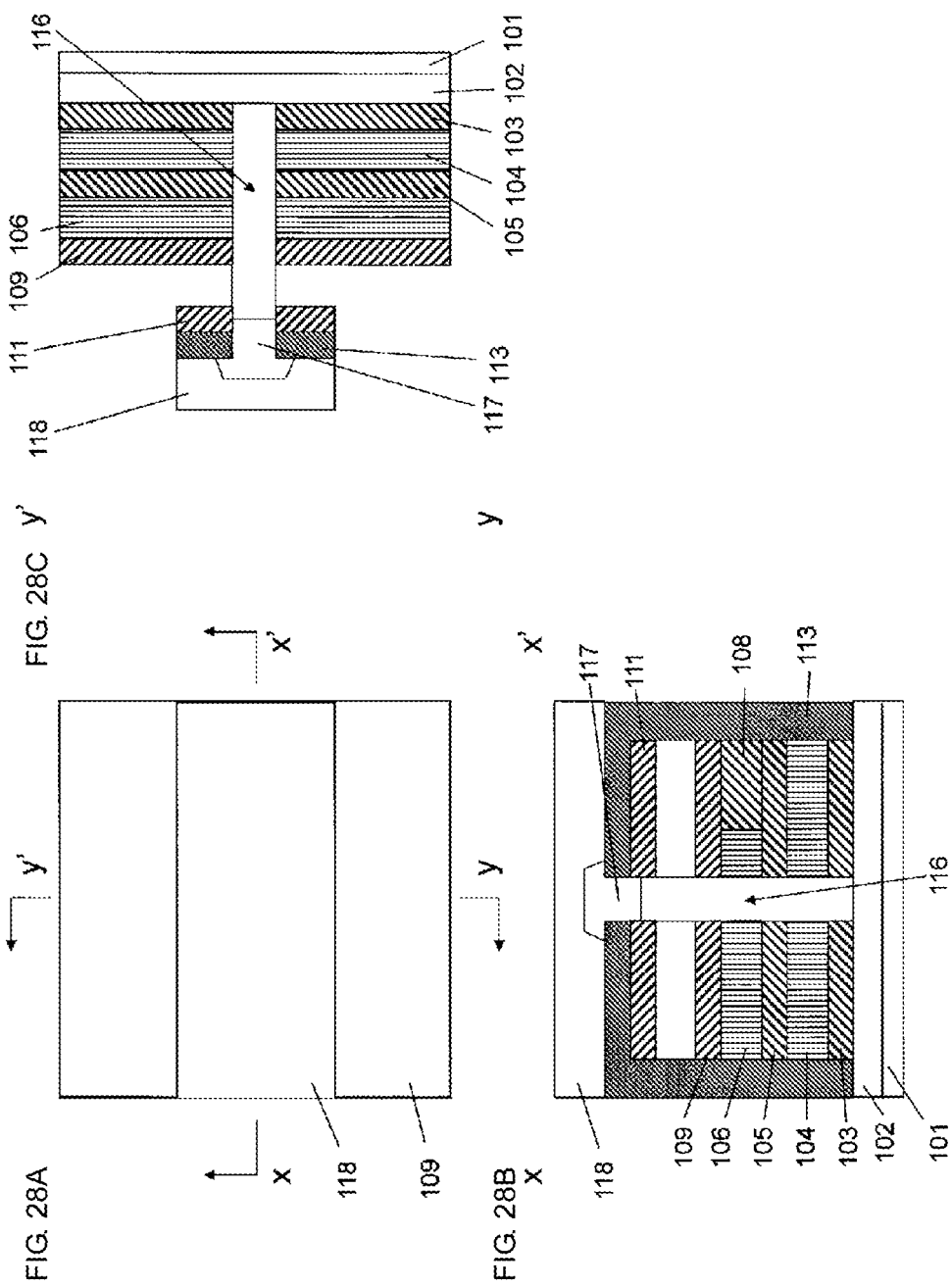

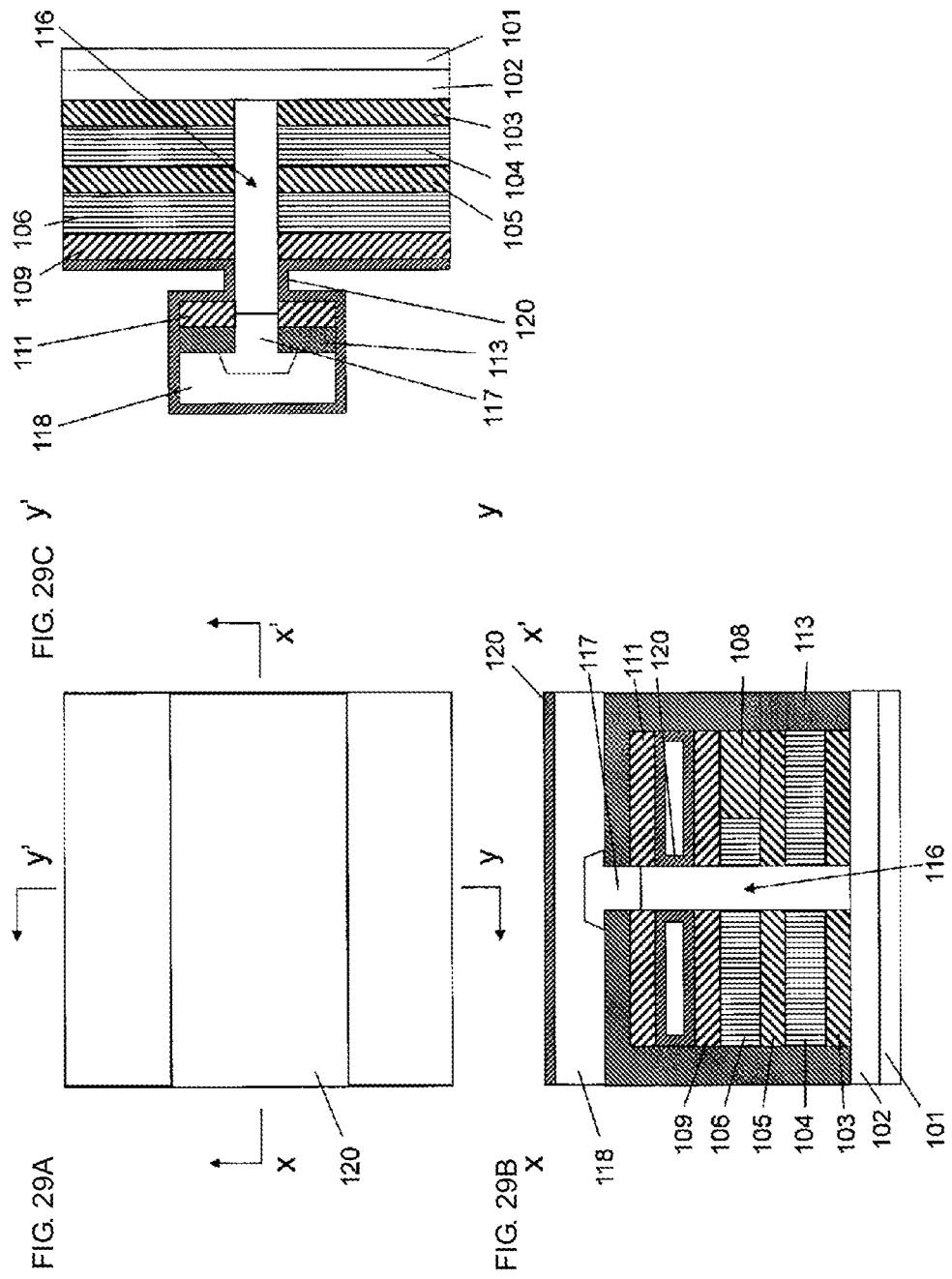

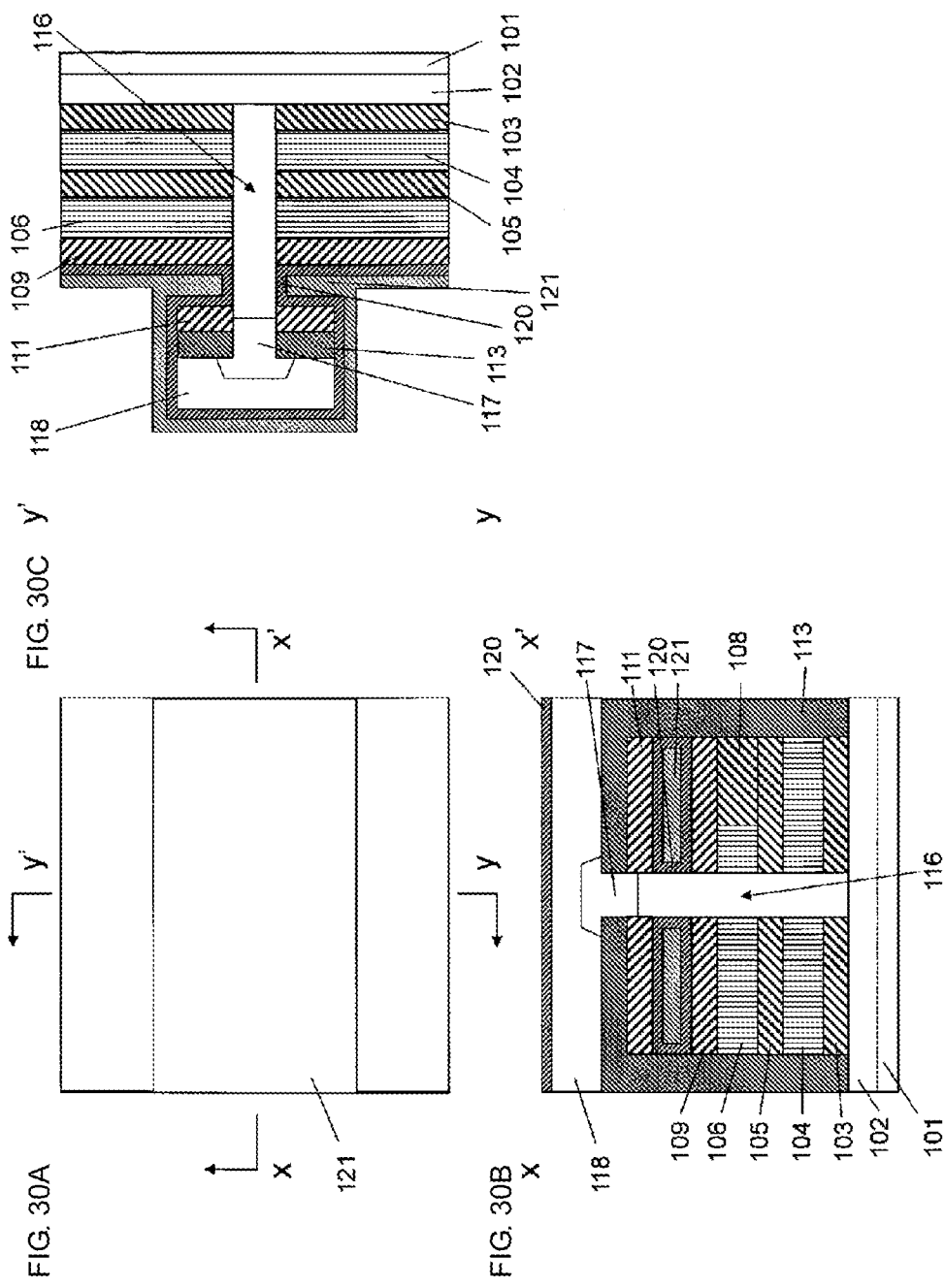

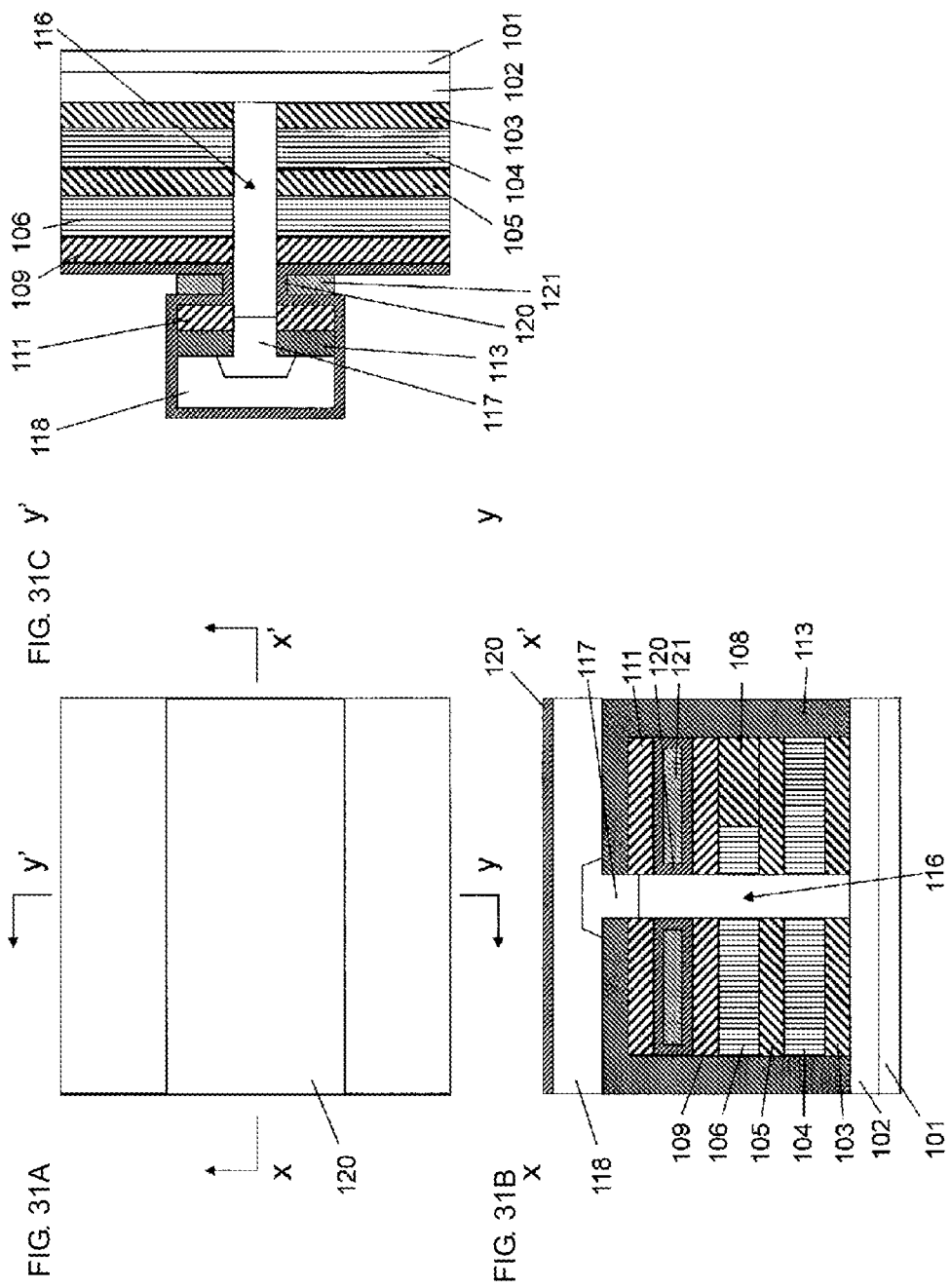

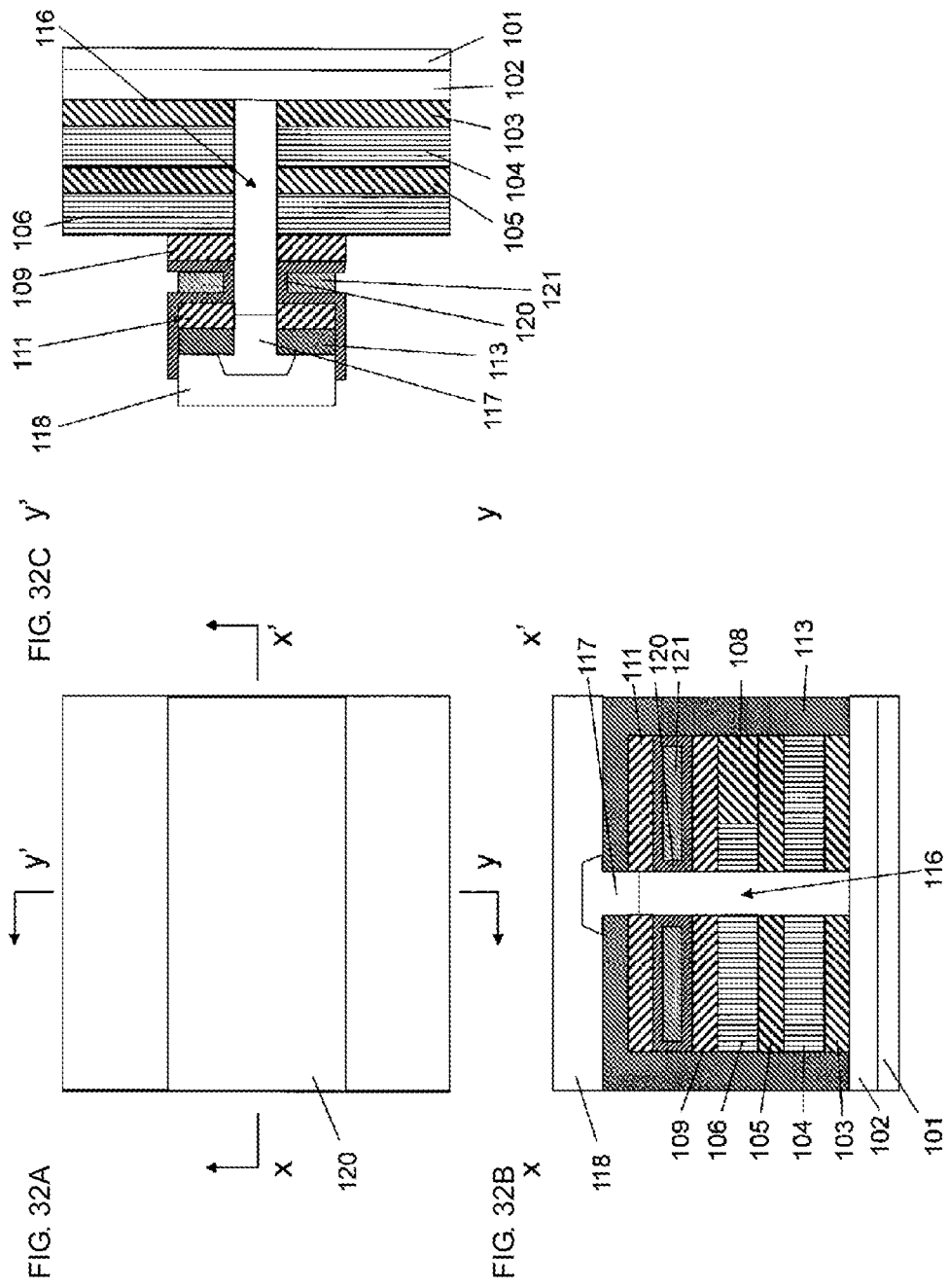

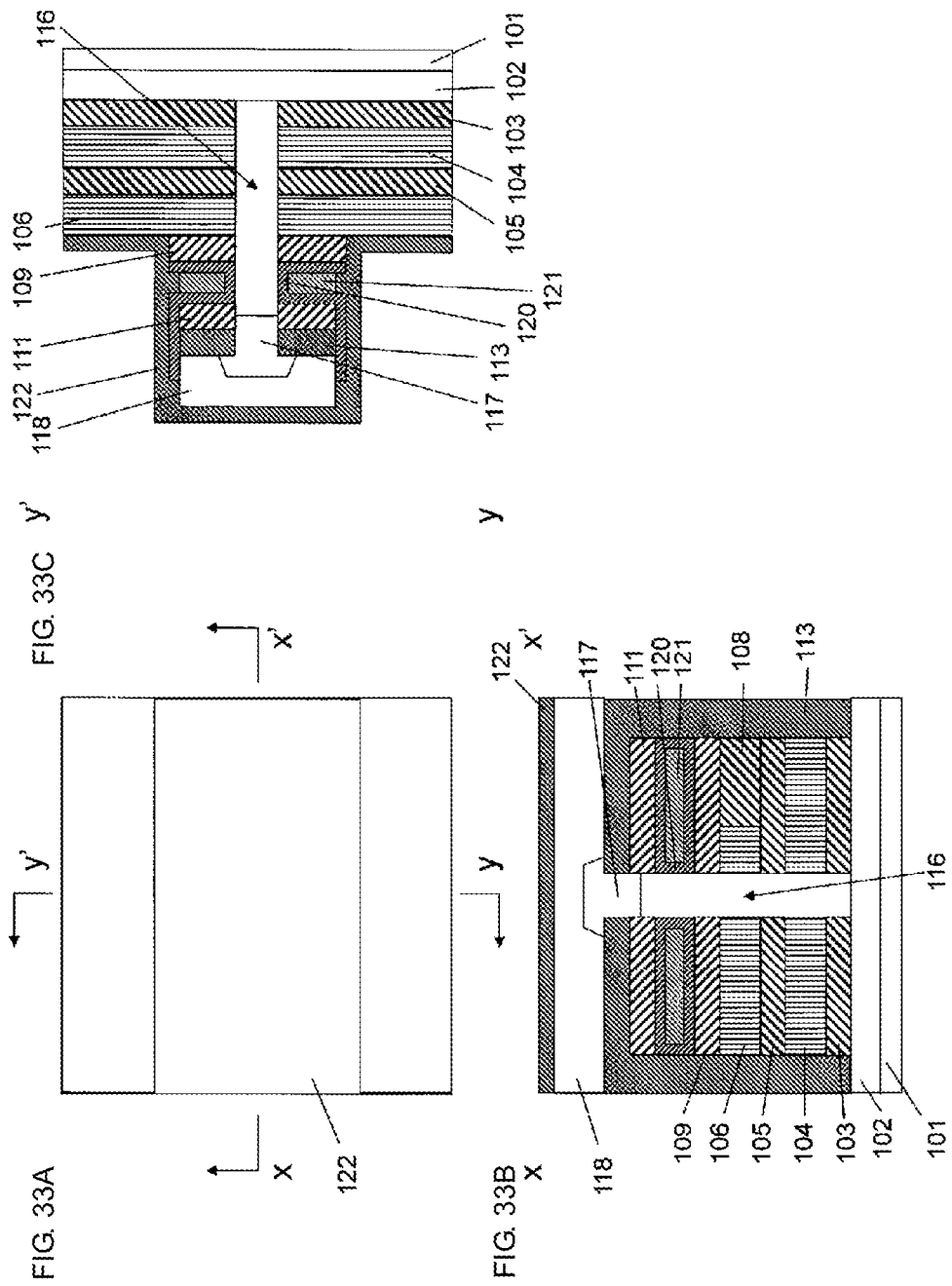

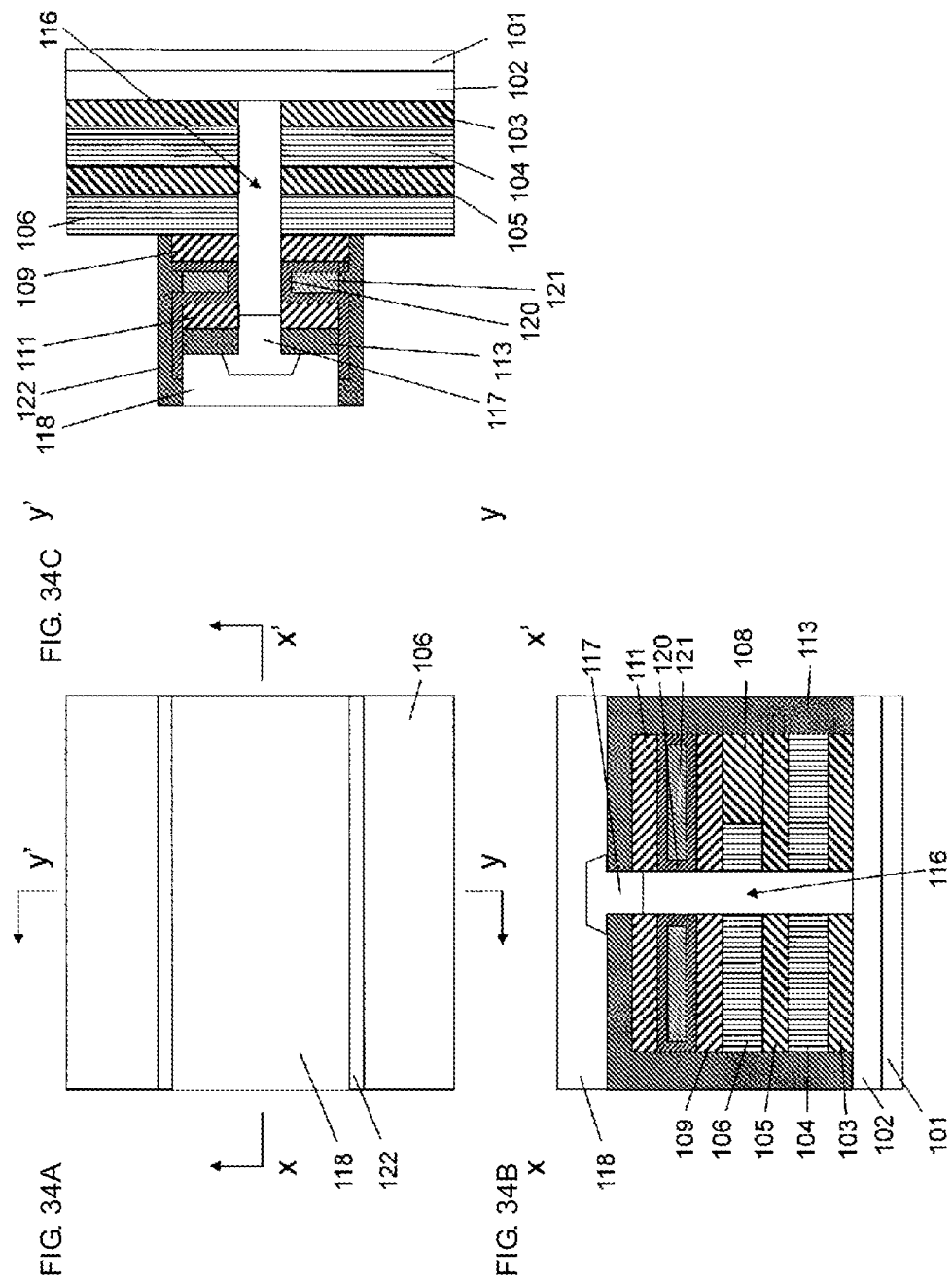

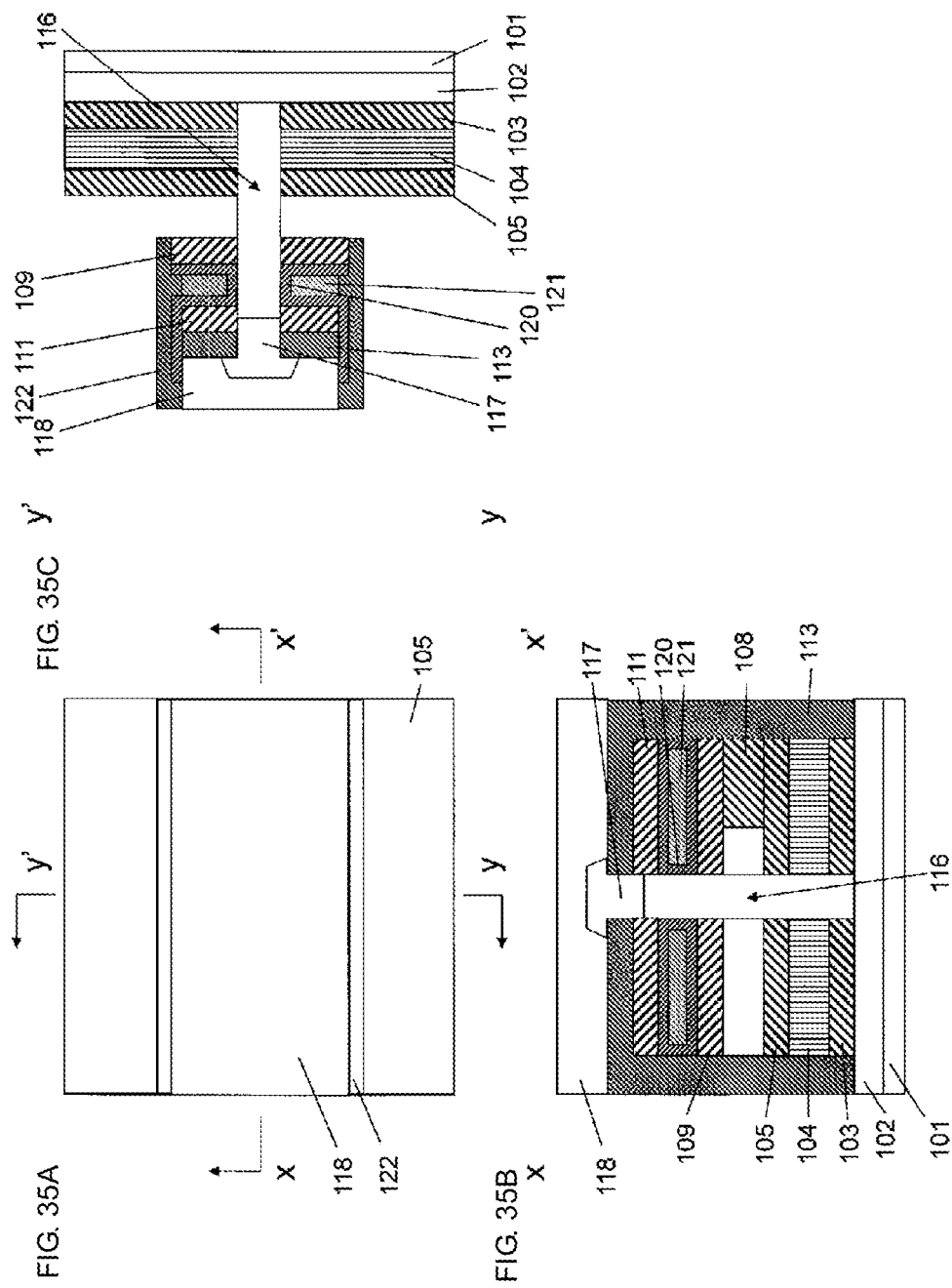

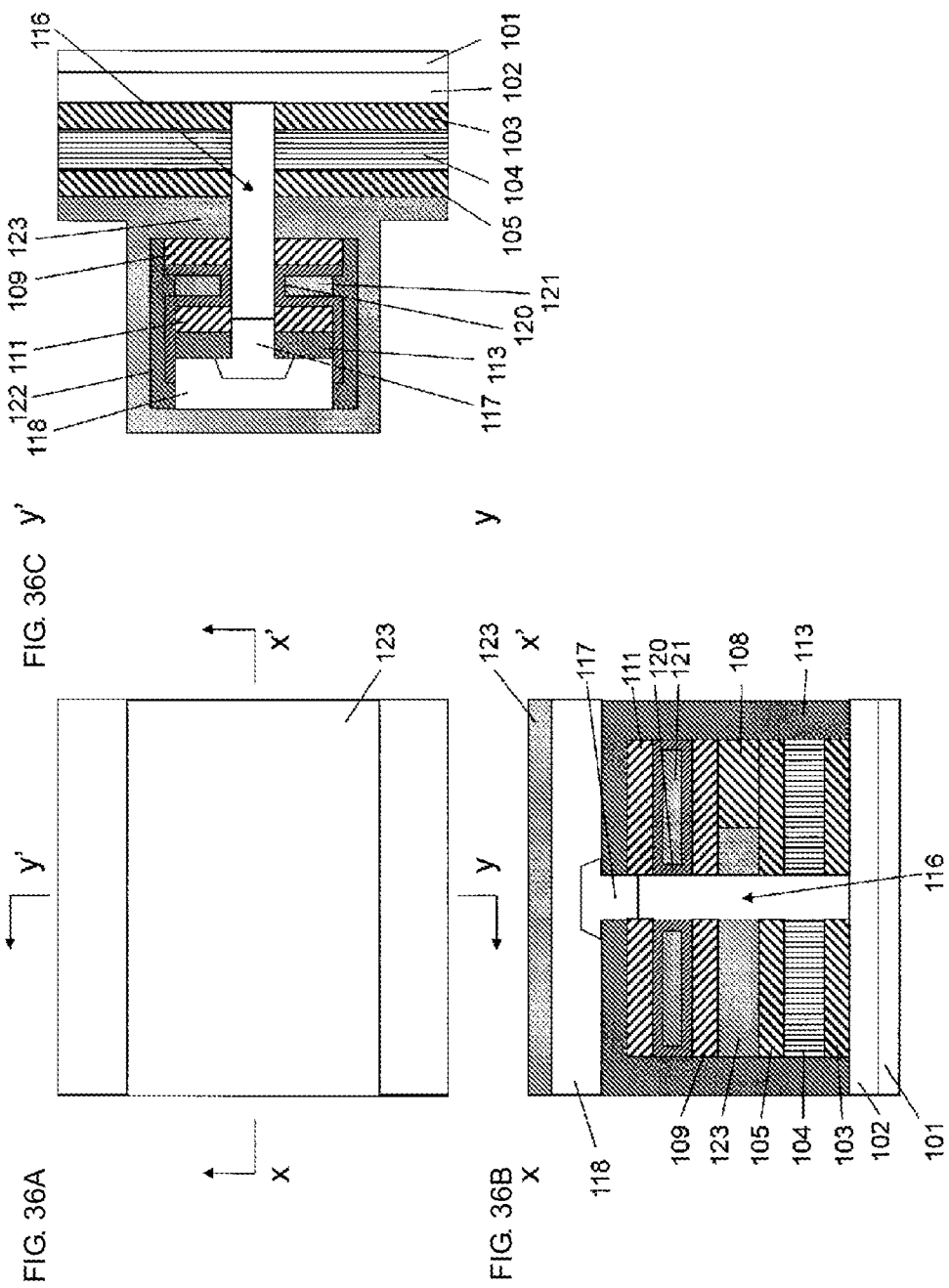

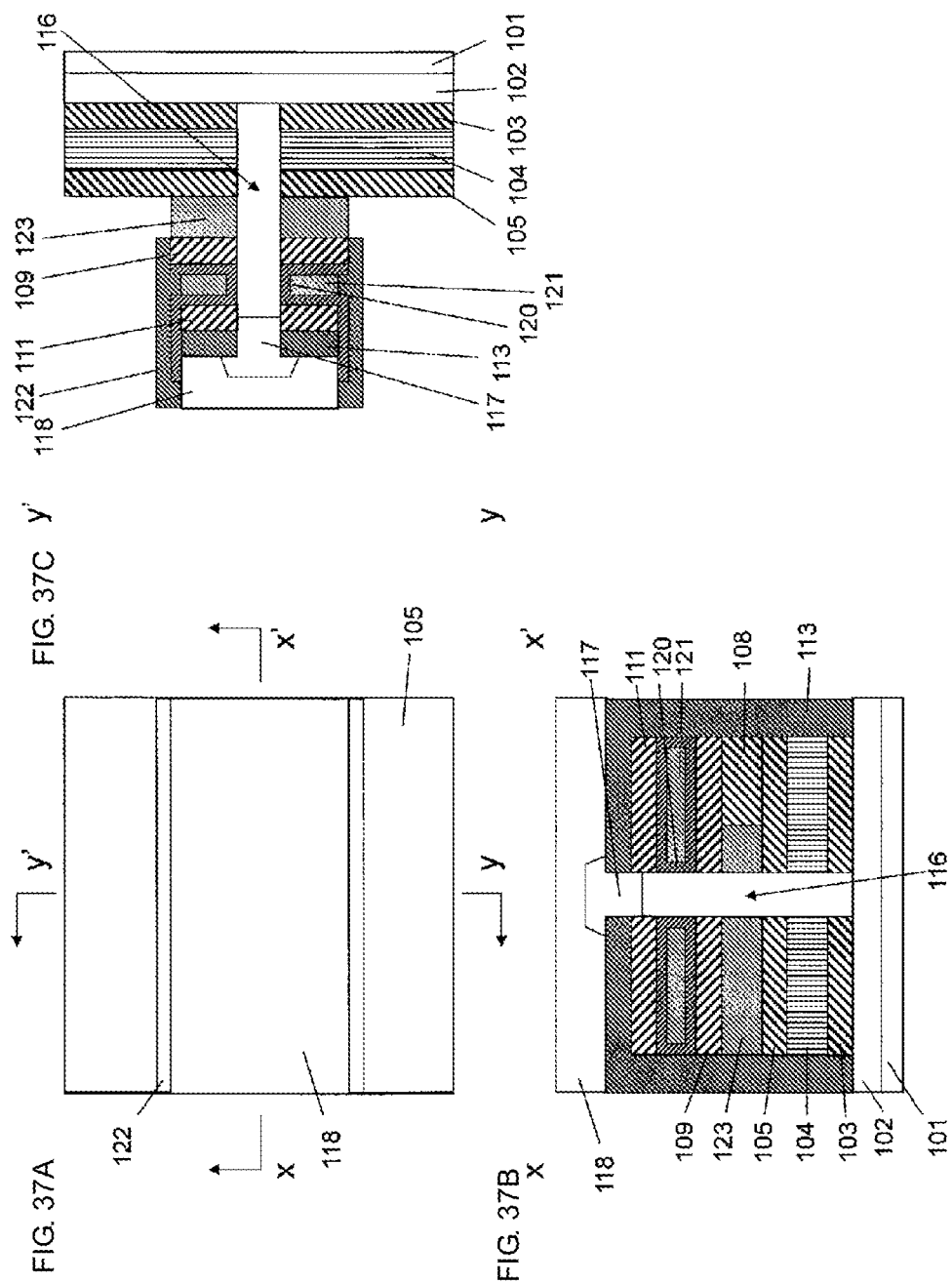

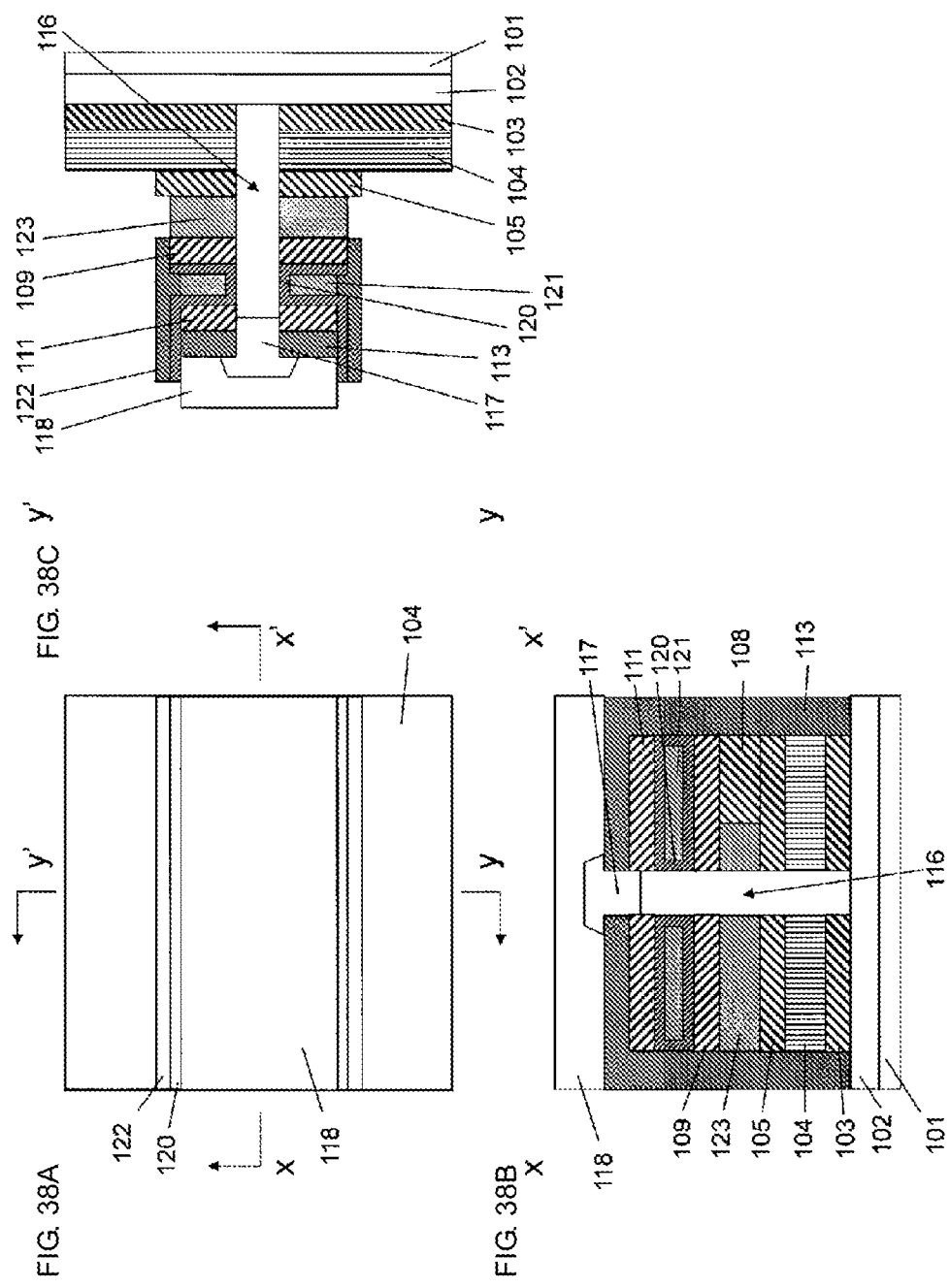

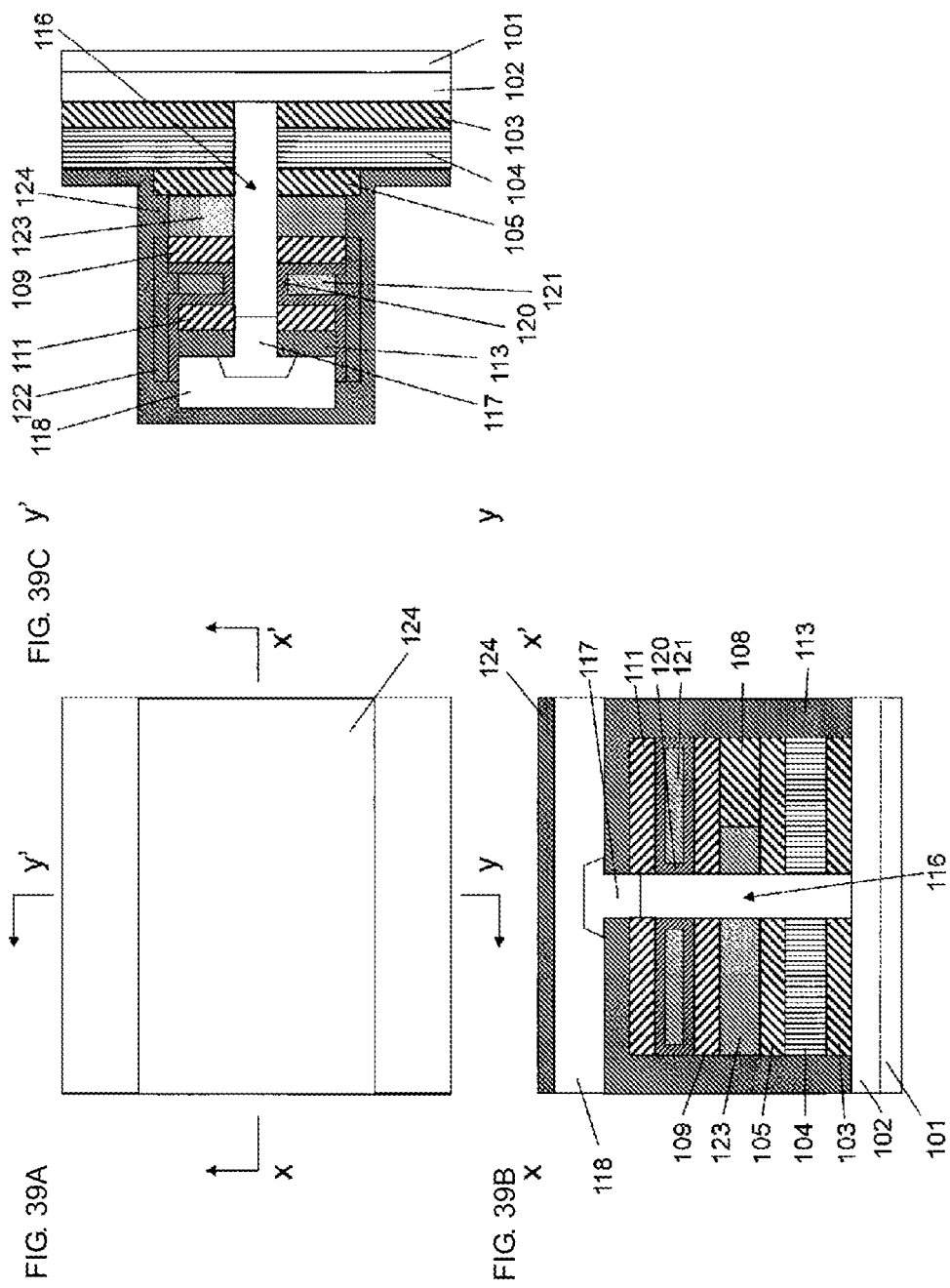

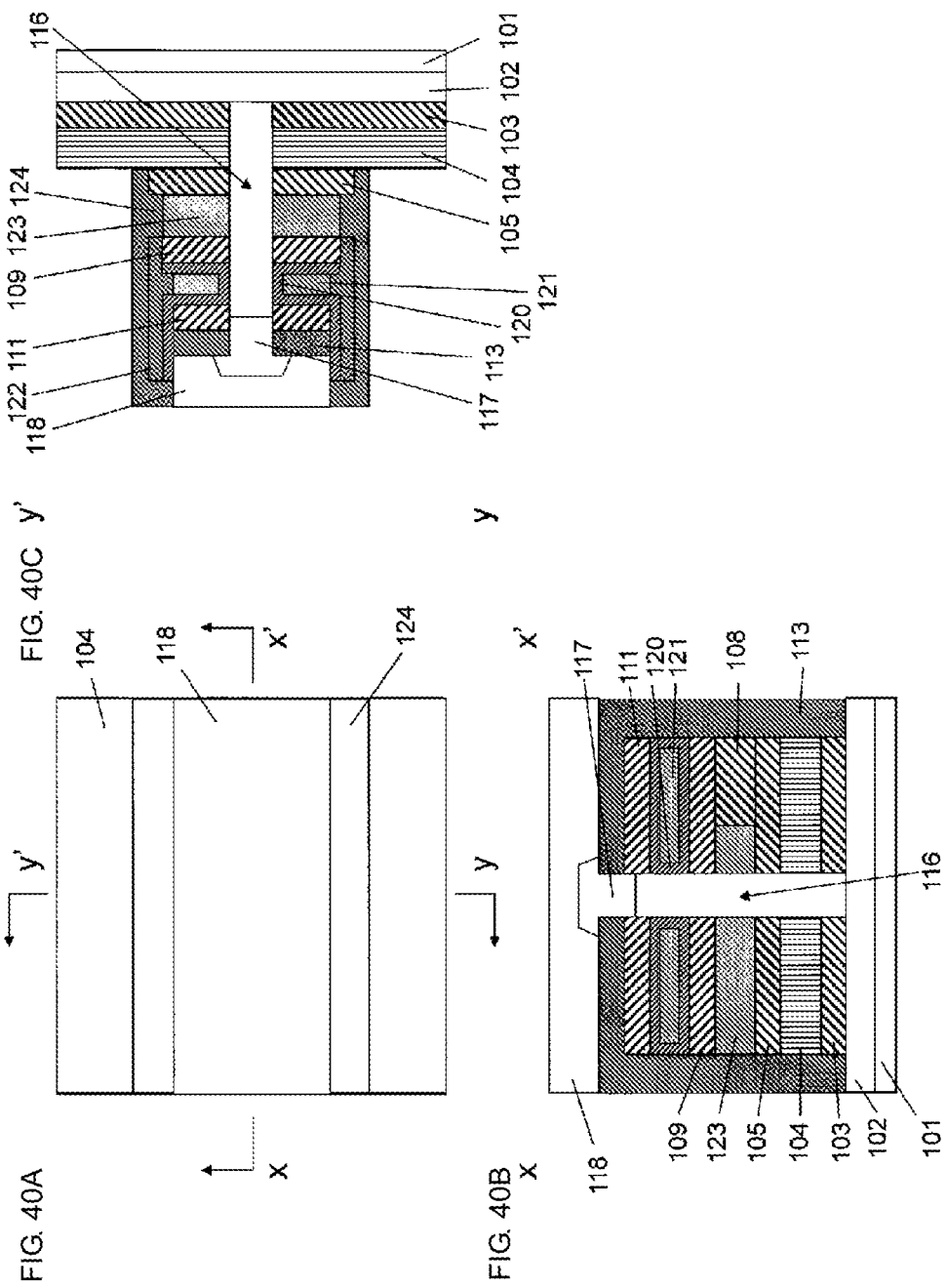

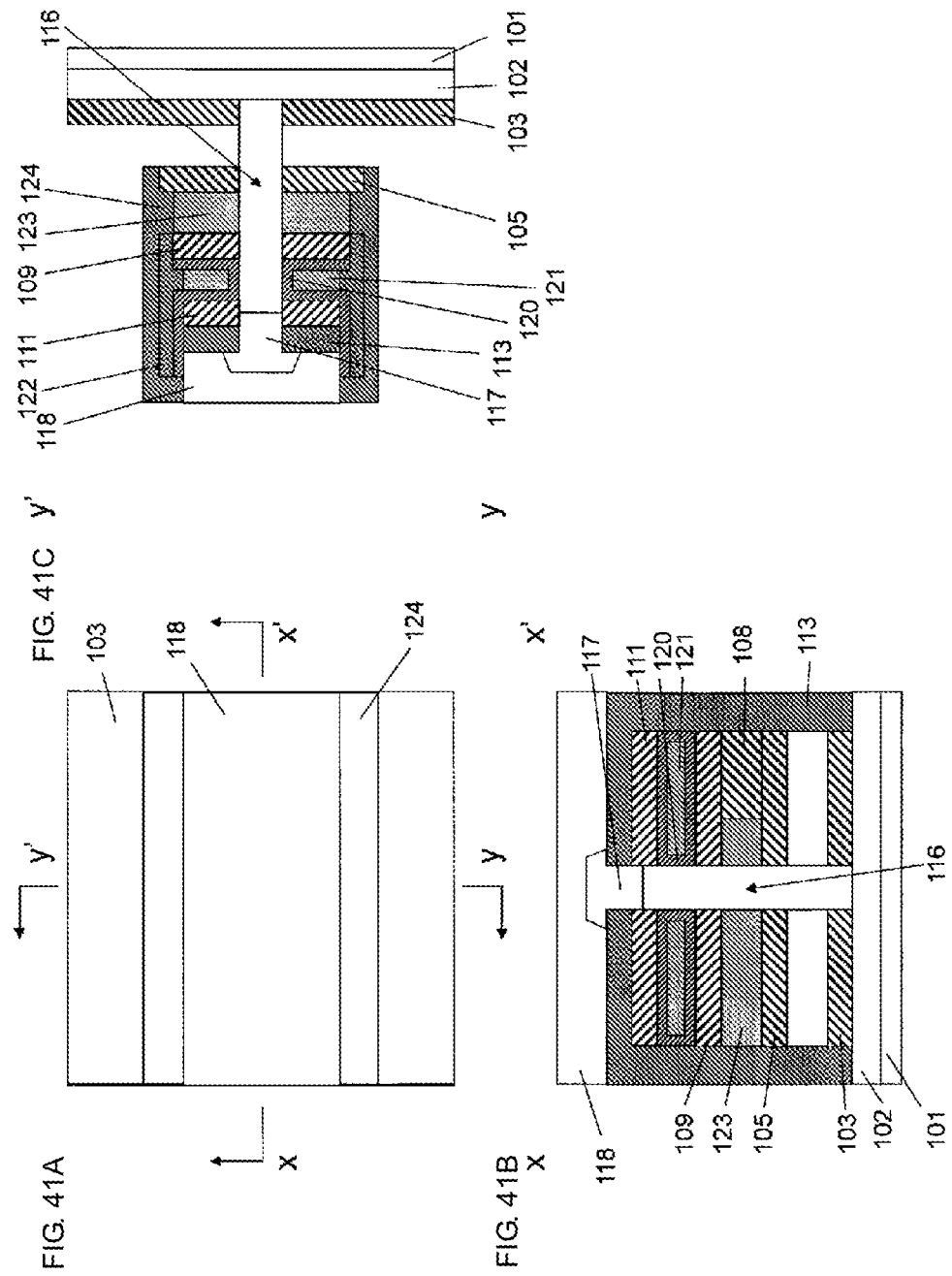

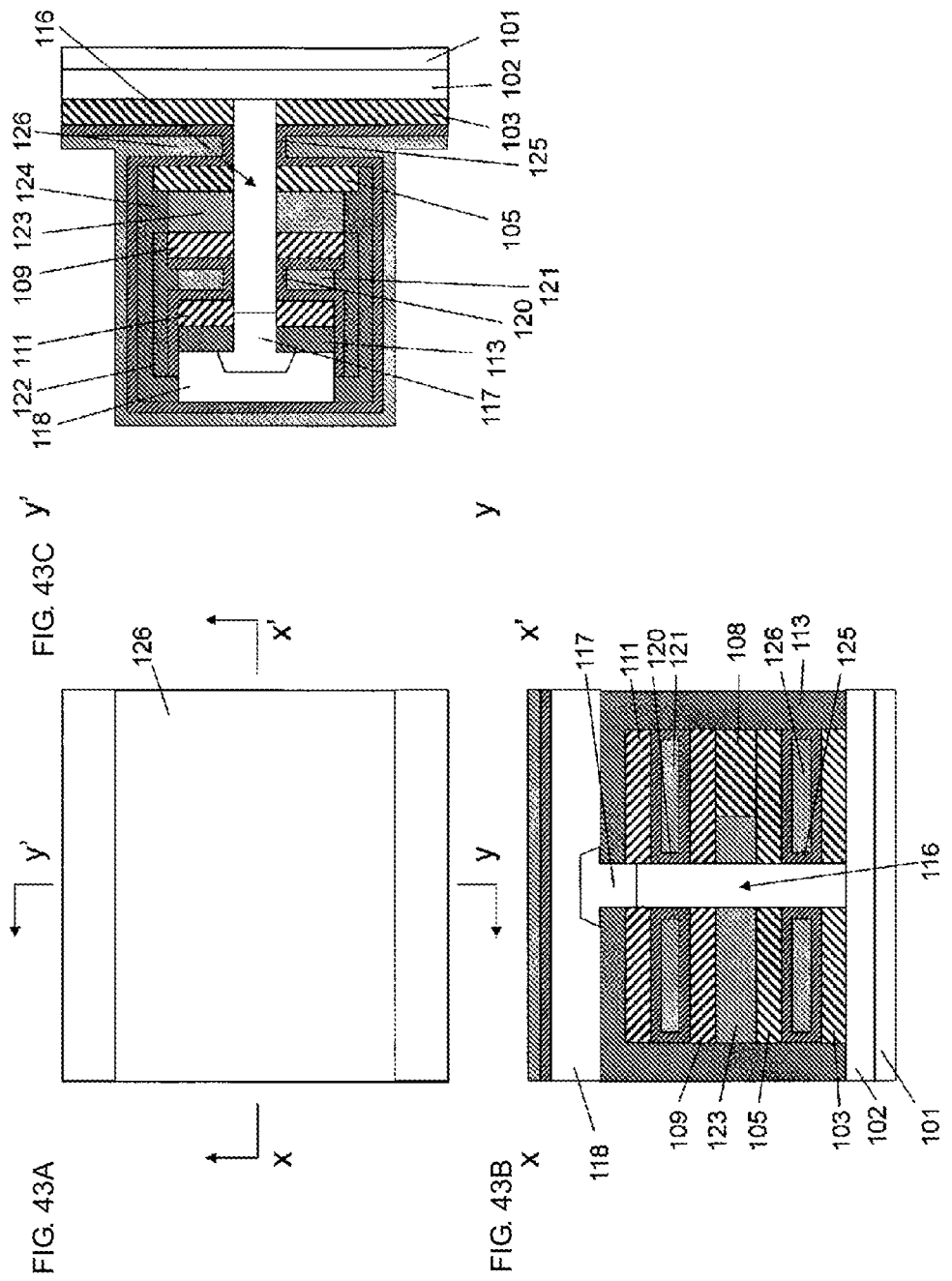

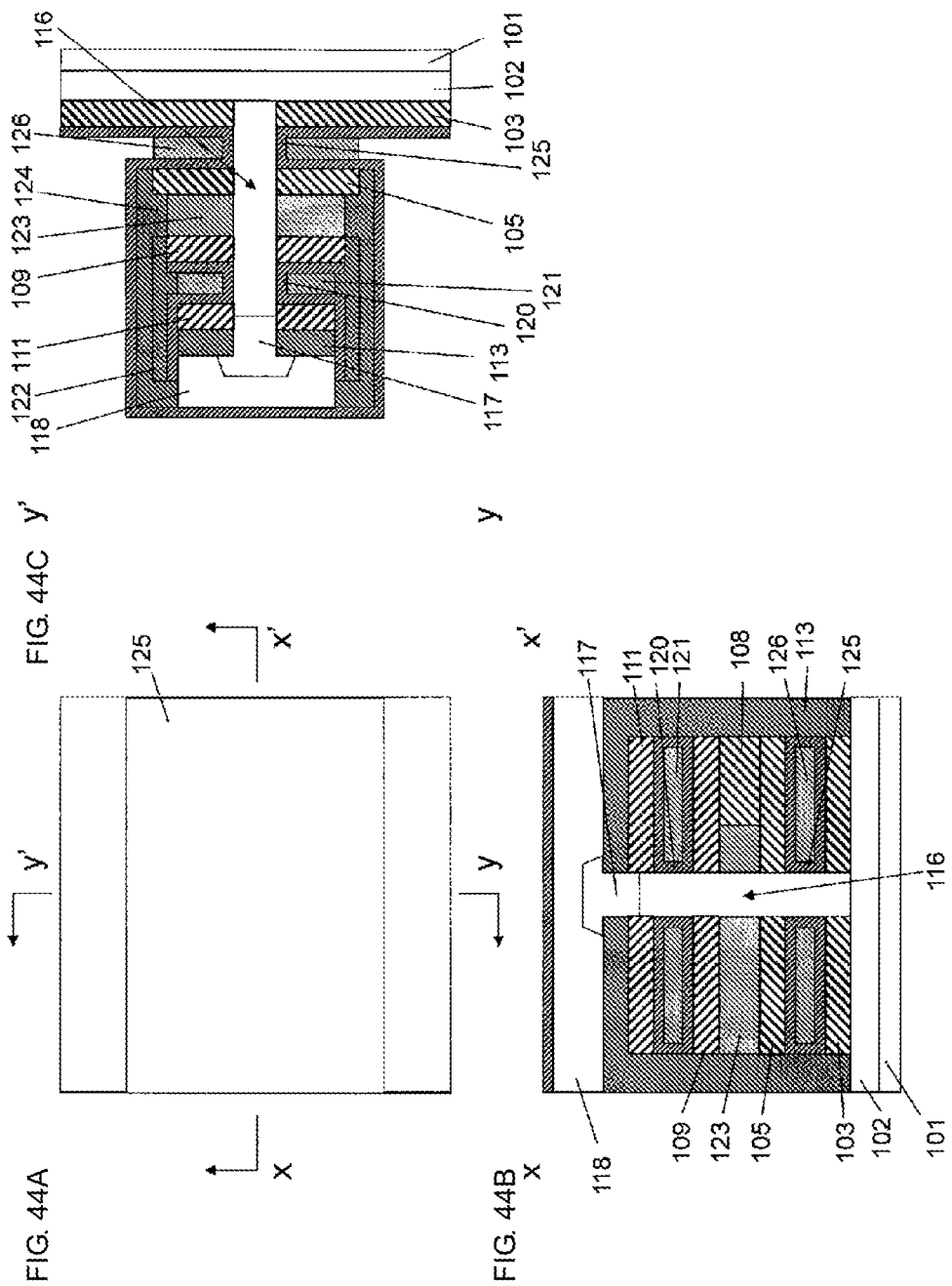

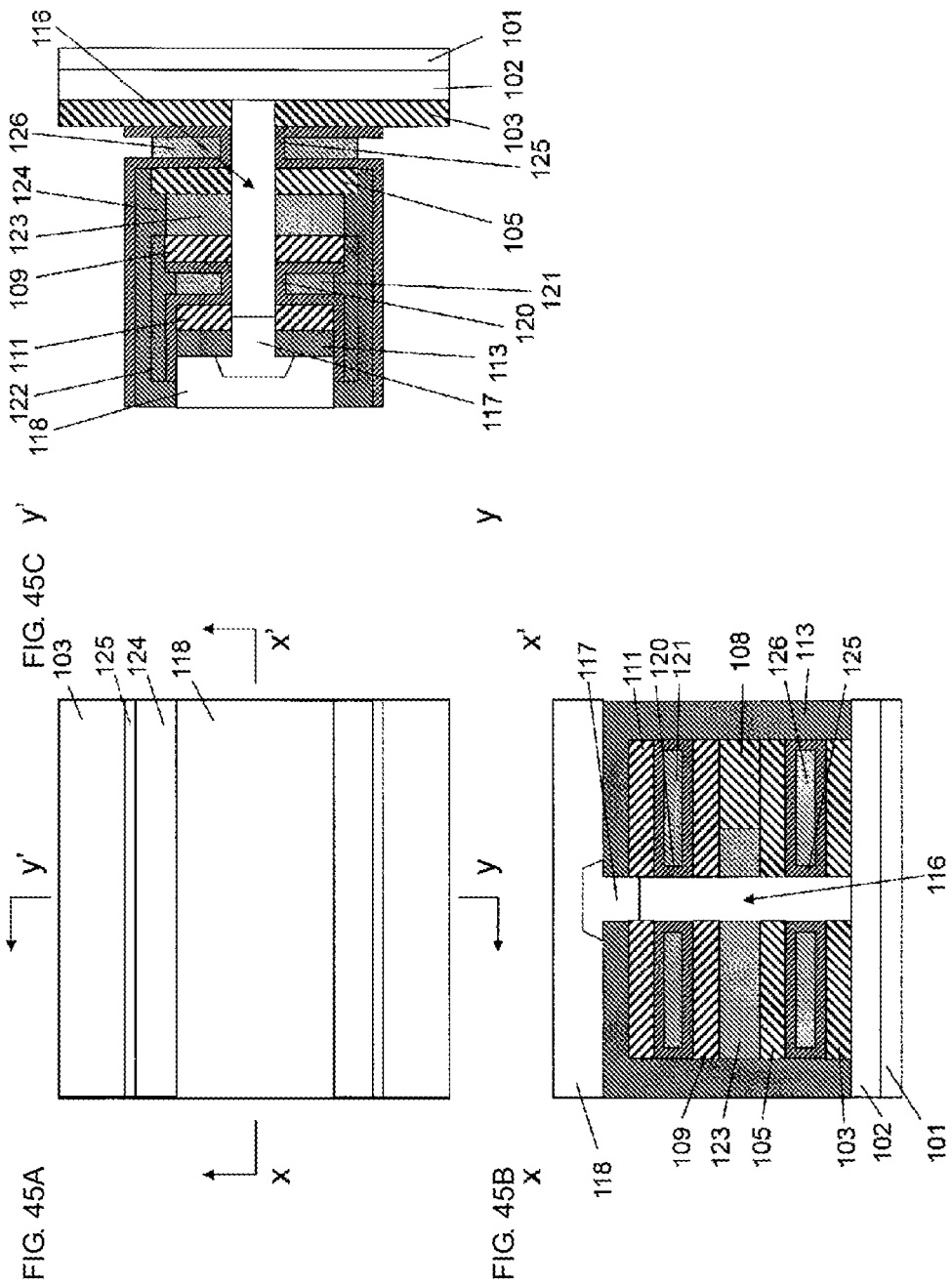

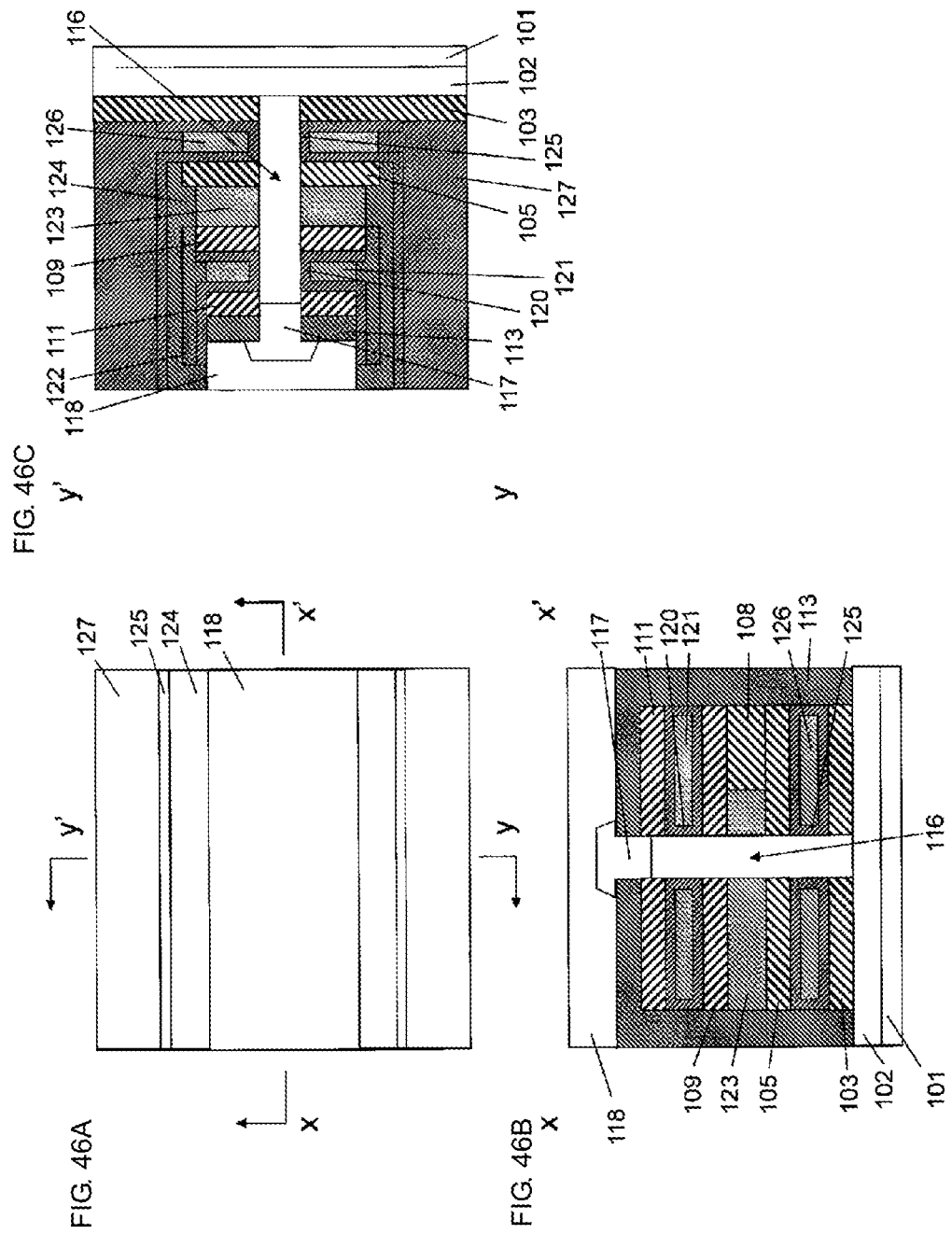

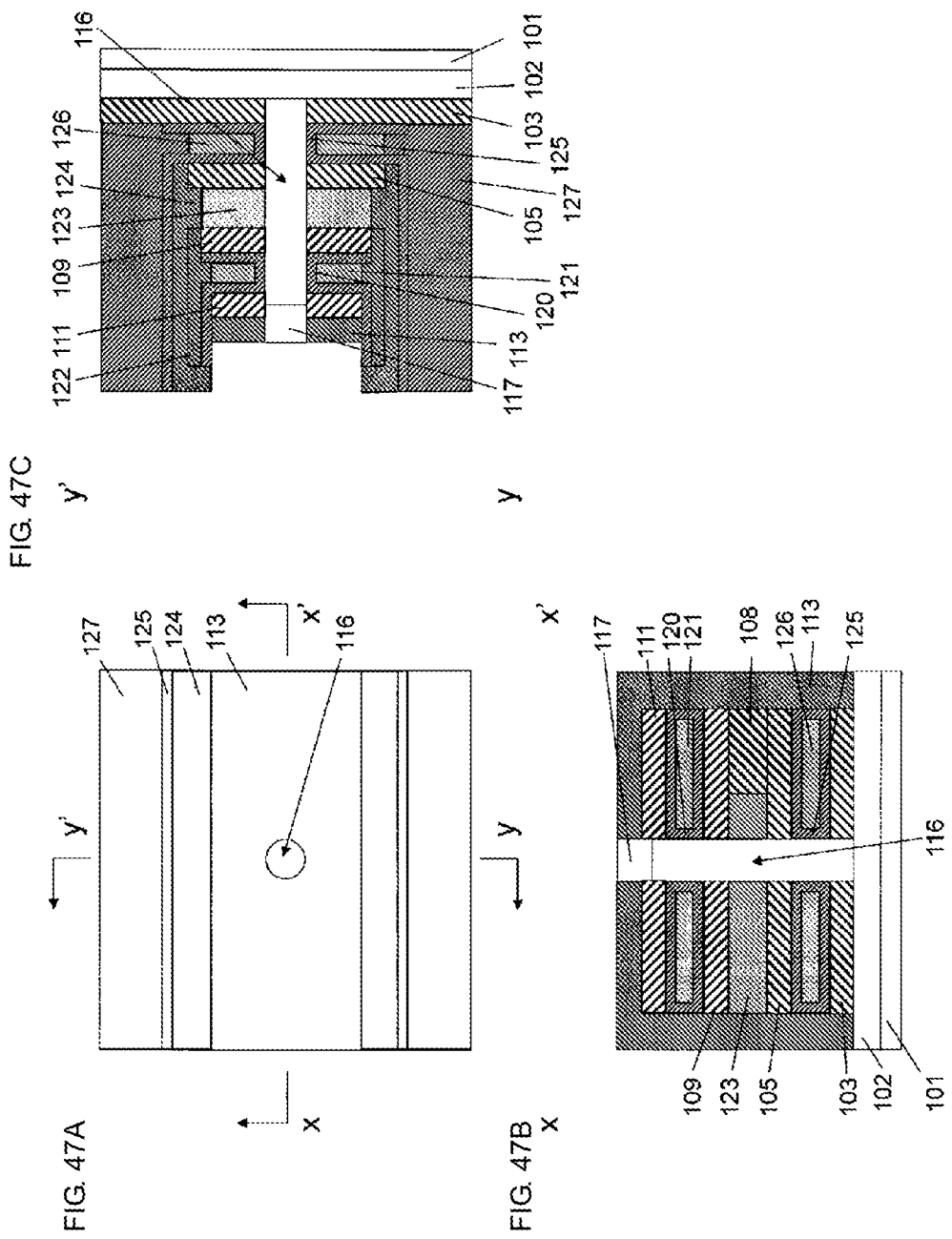

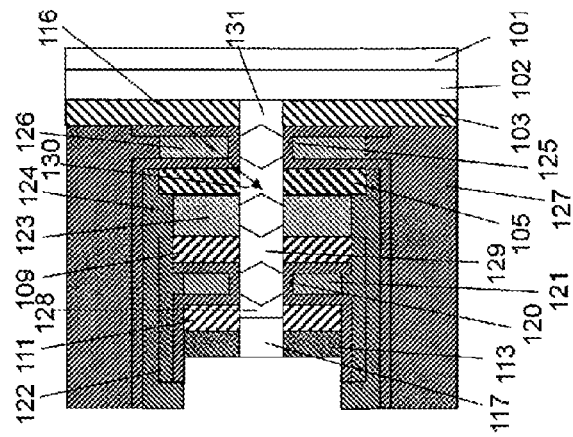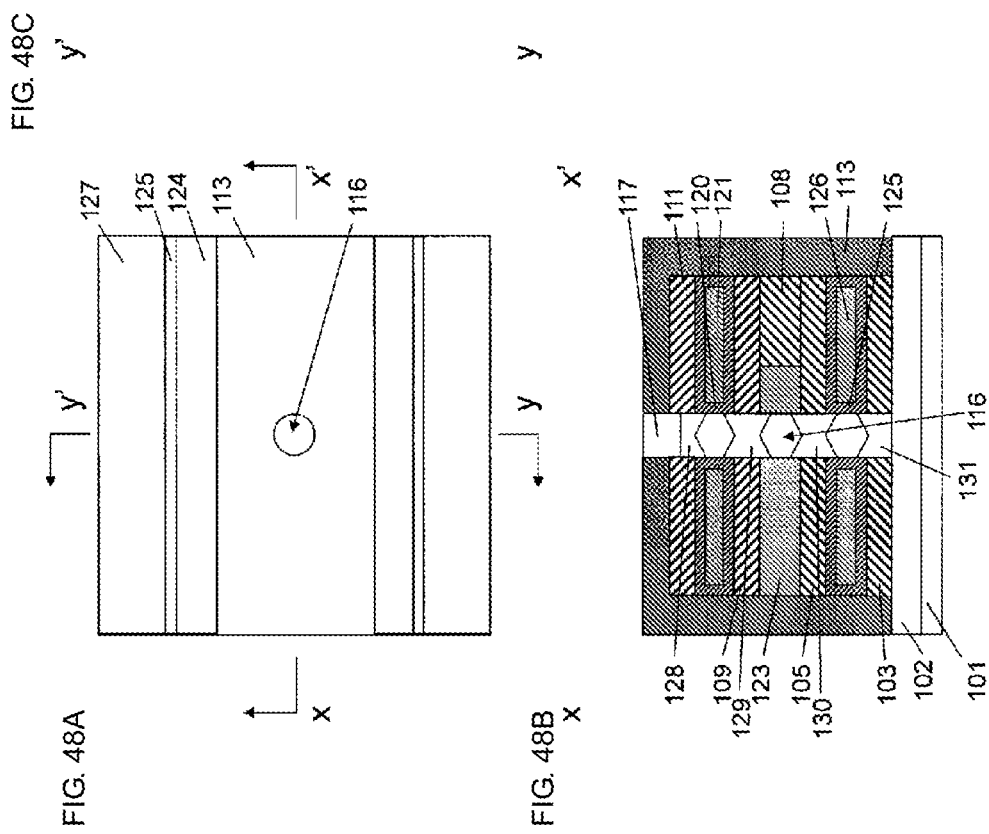
FIG. 48A
FIG. 48B
FIG. 48C

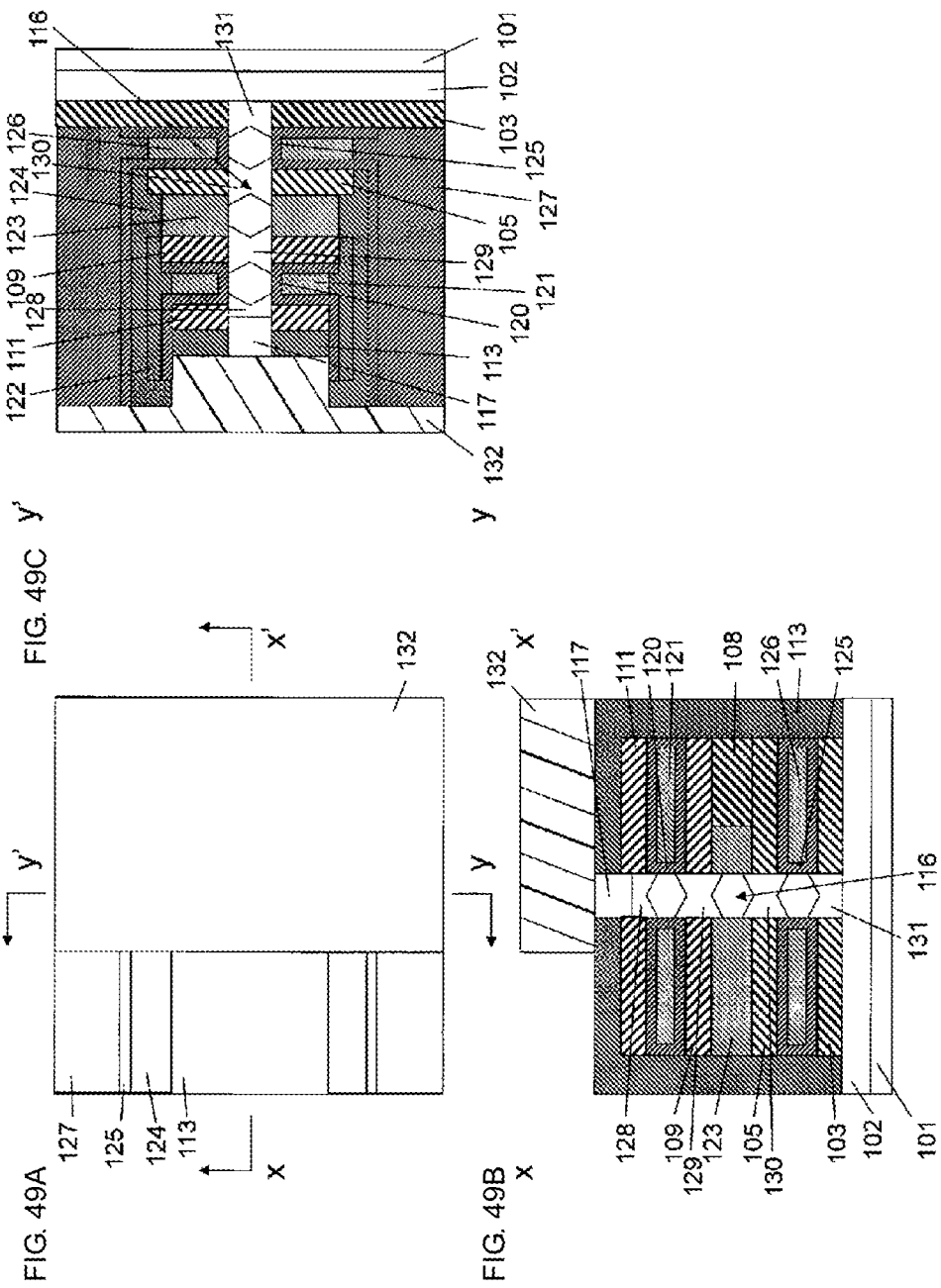

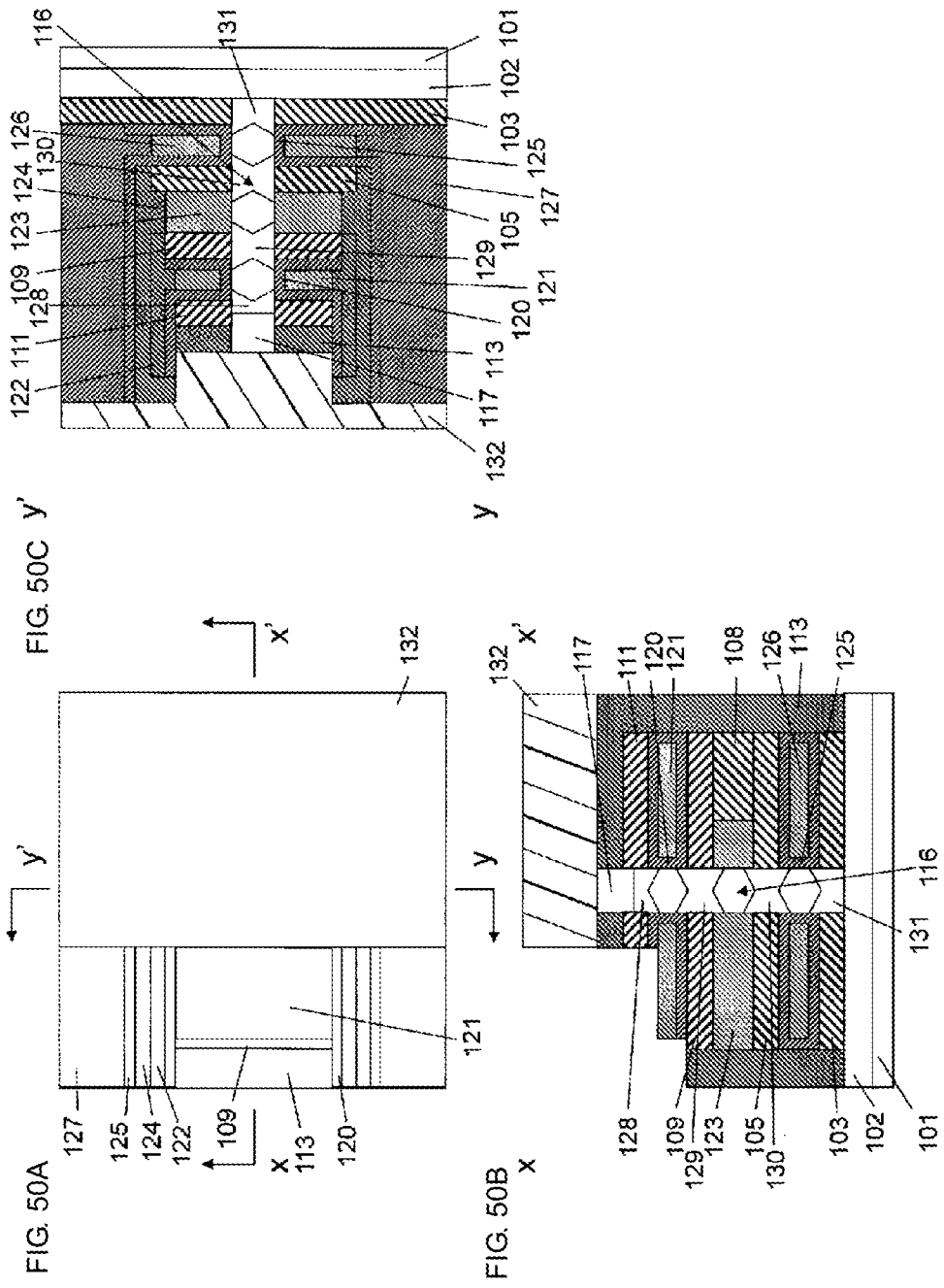

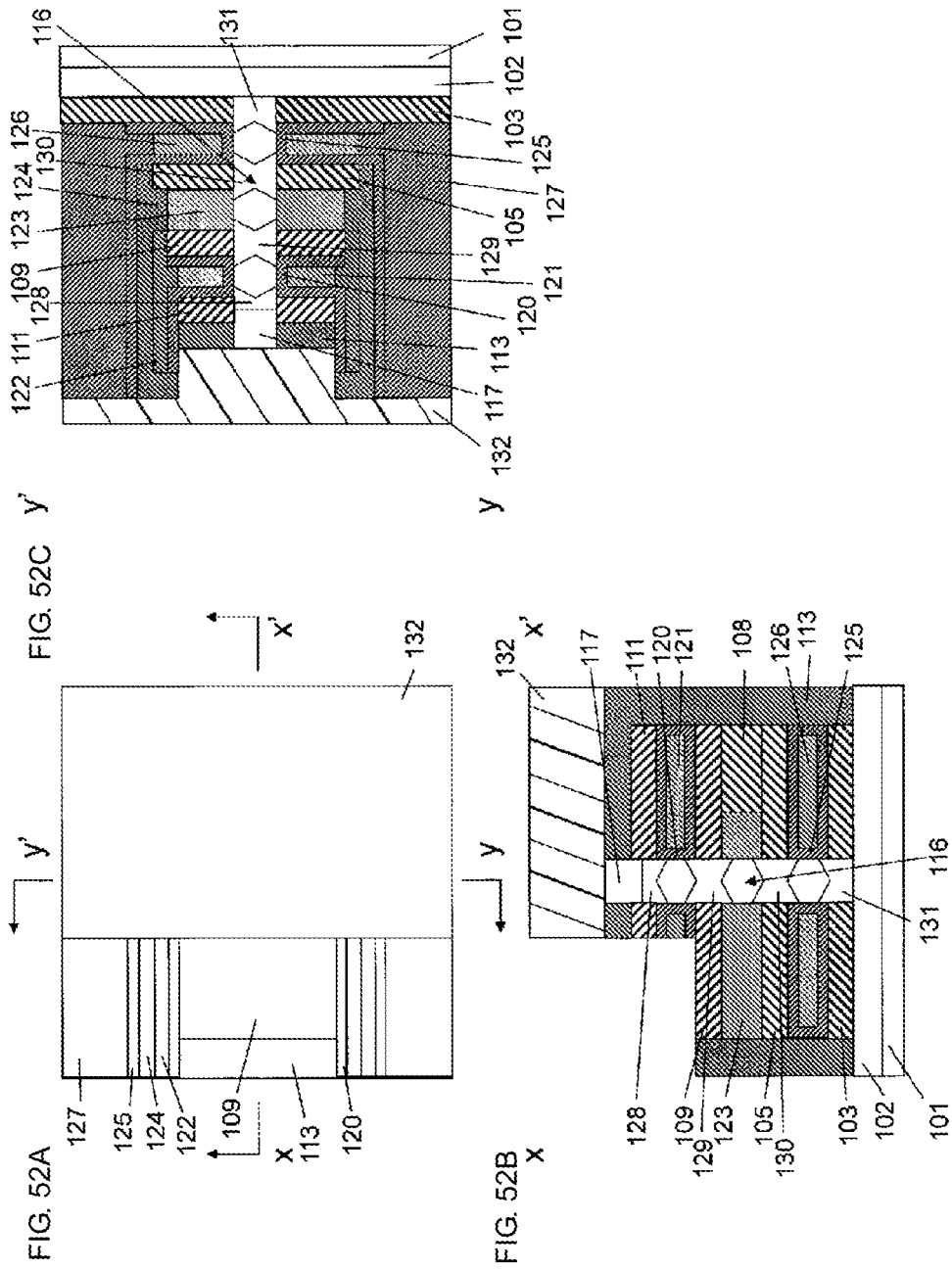

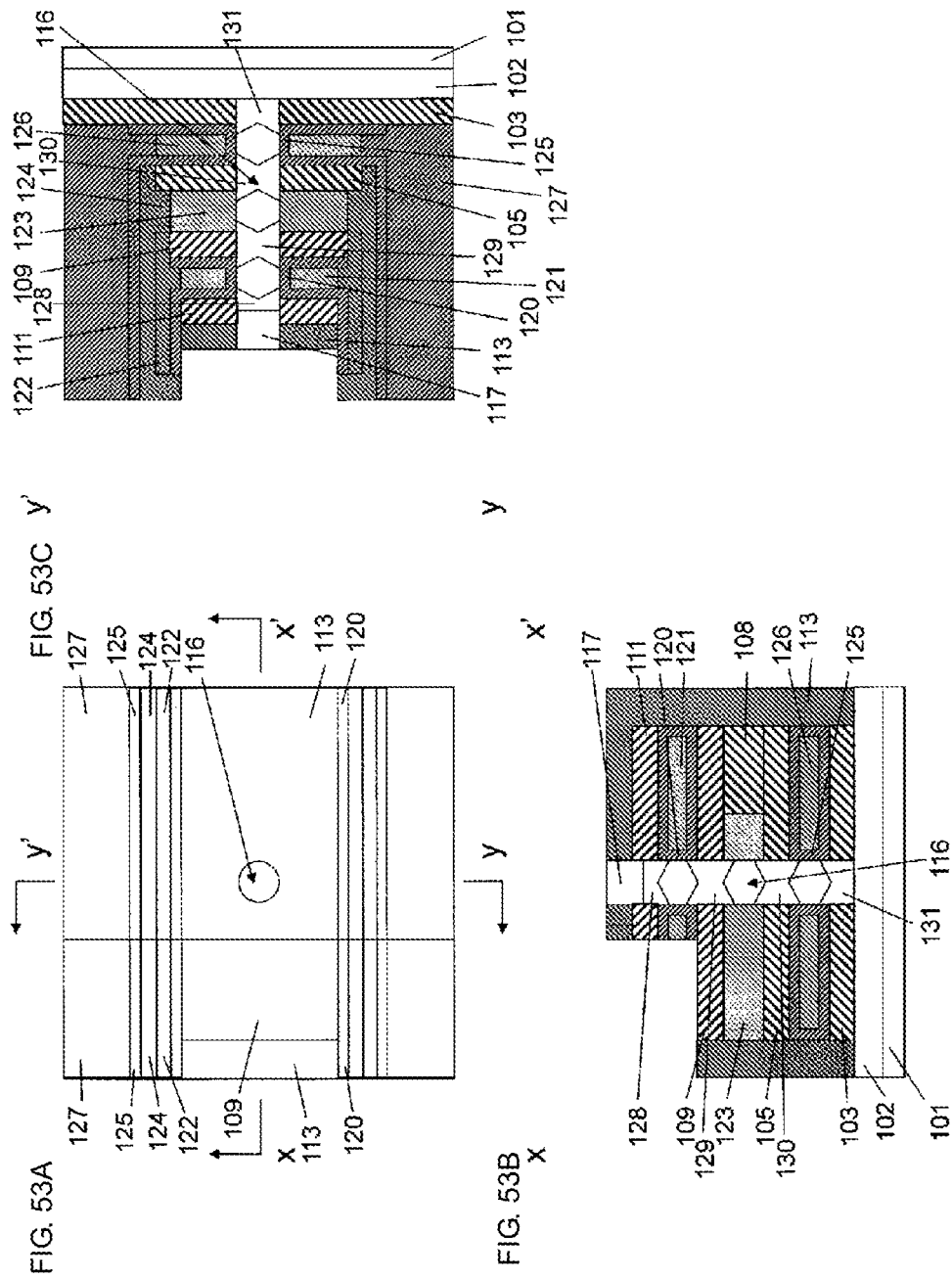

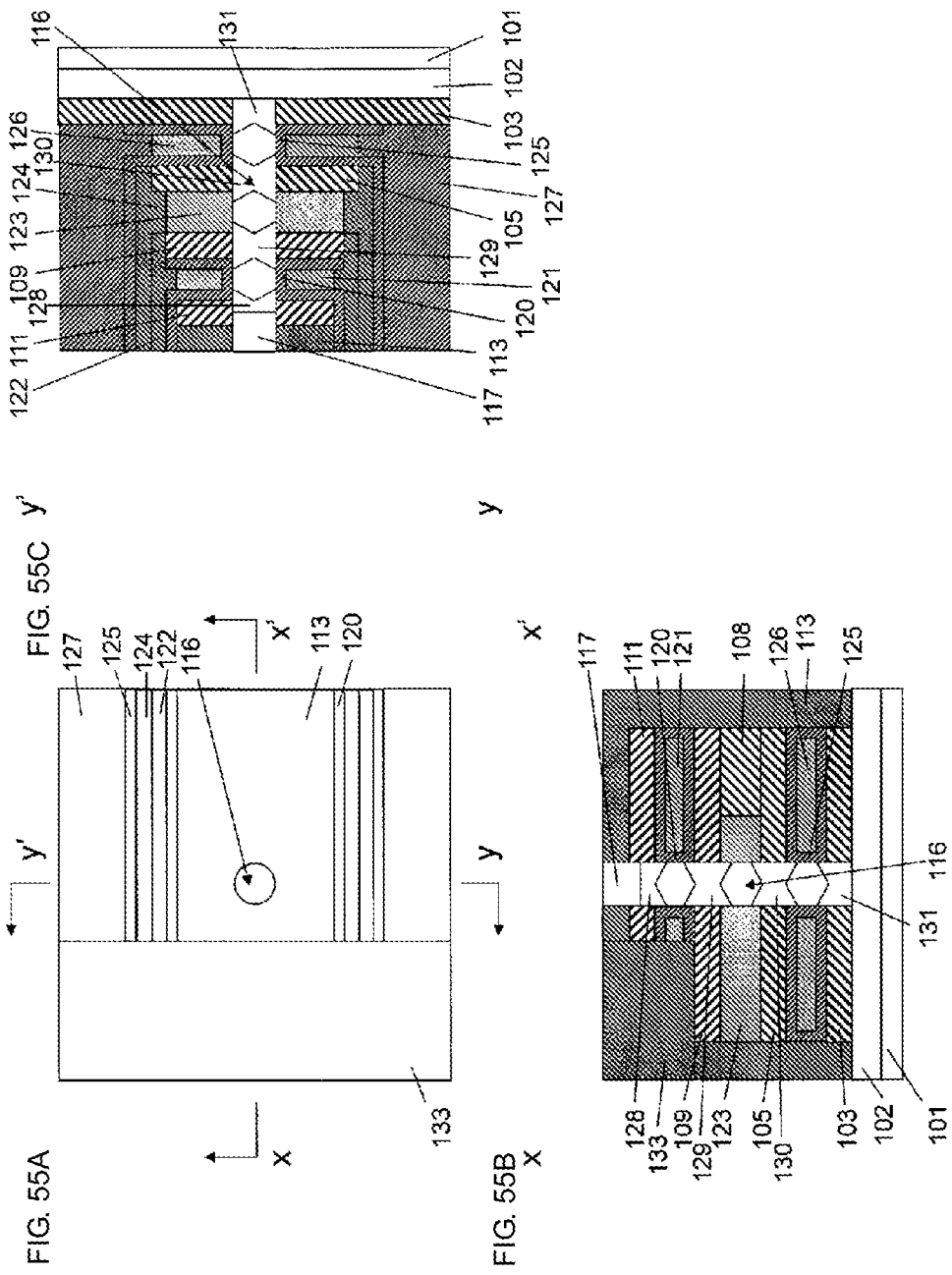

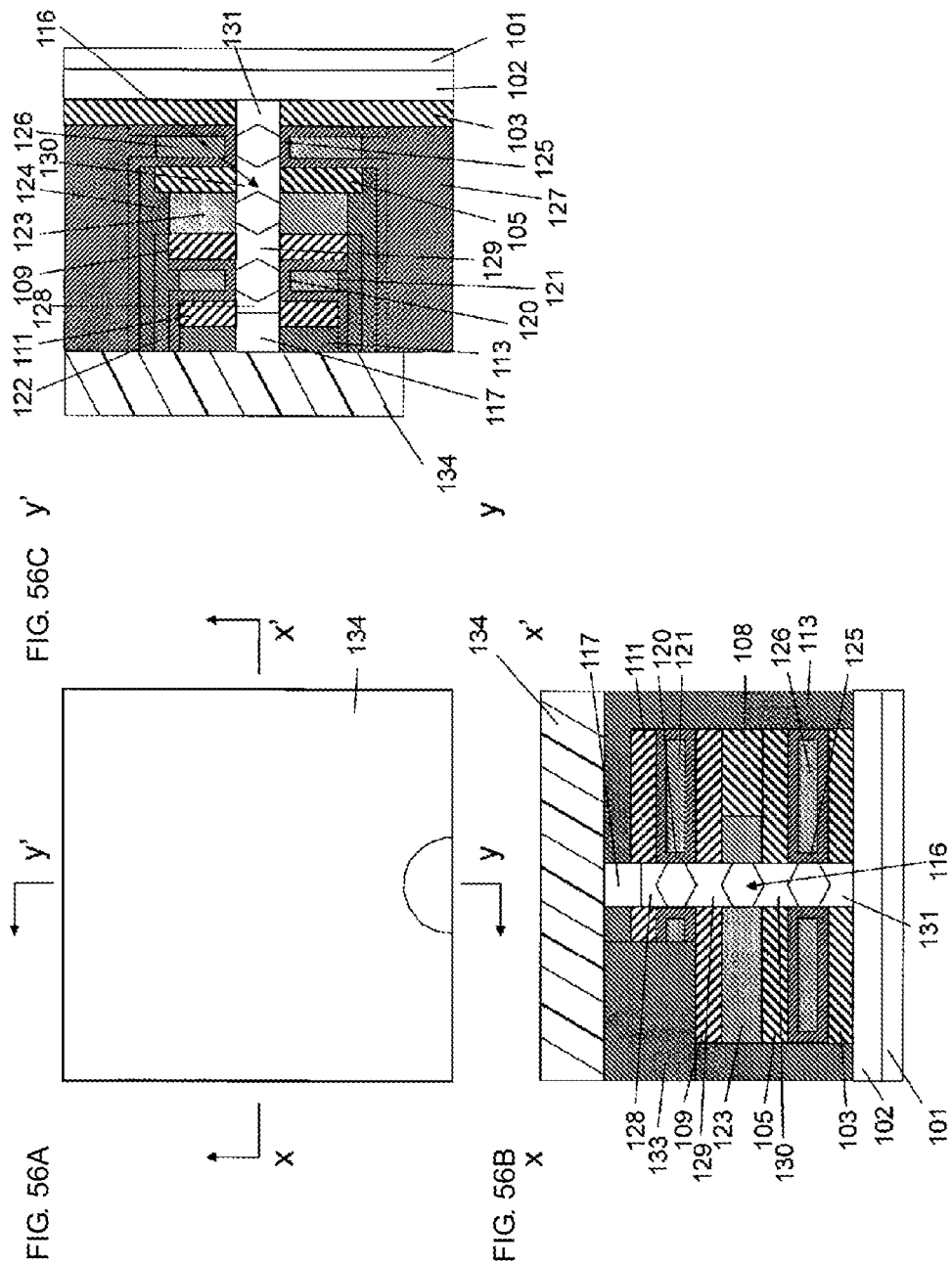

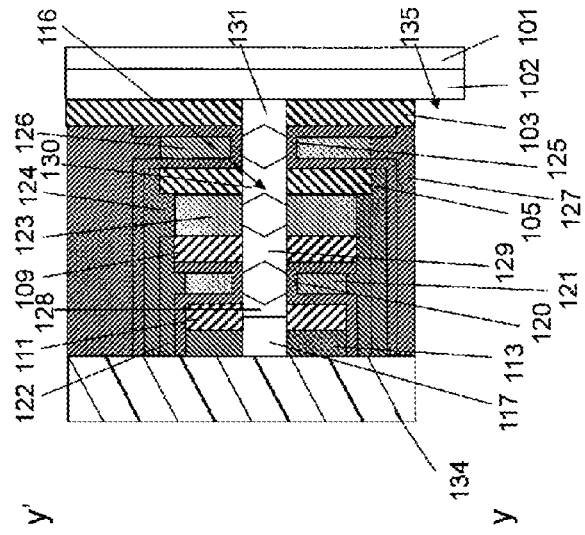
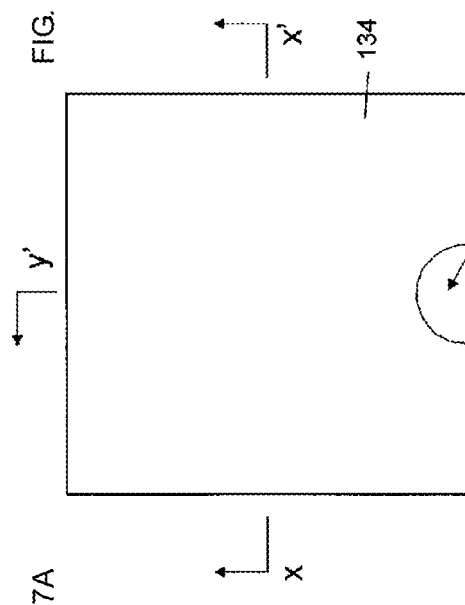
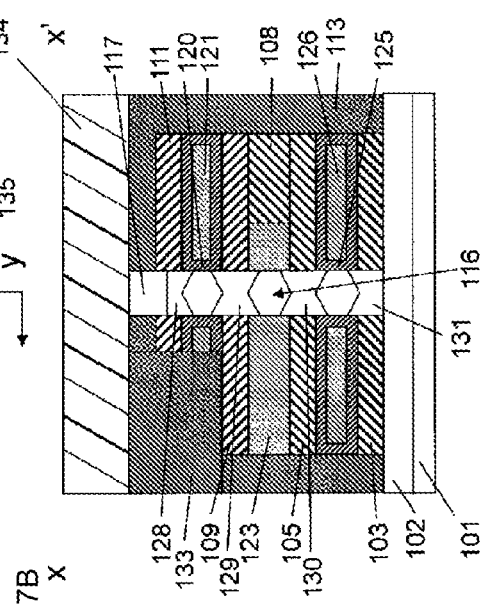
FIG. 57A
FIG. 57B
FIG. 57C

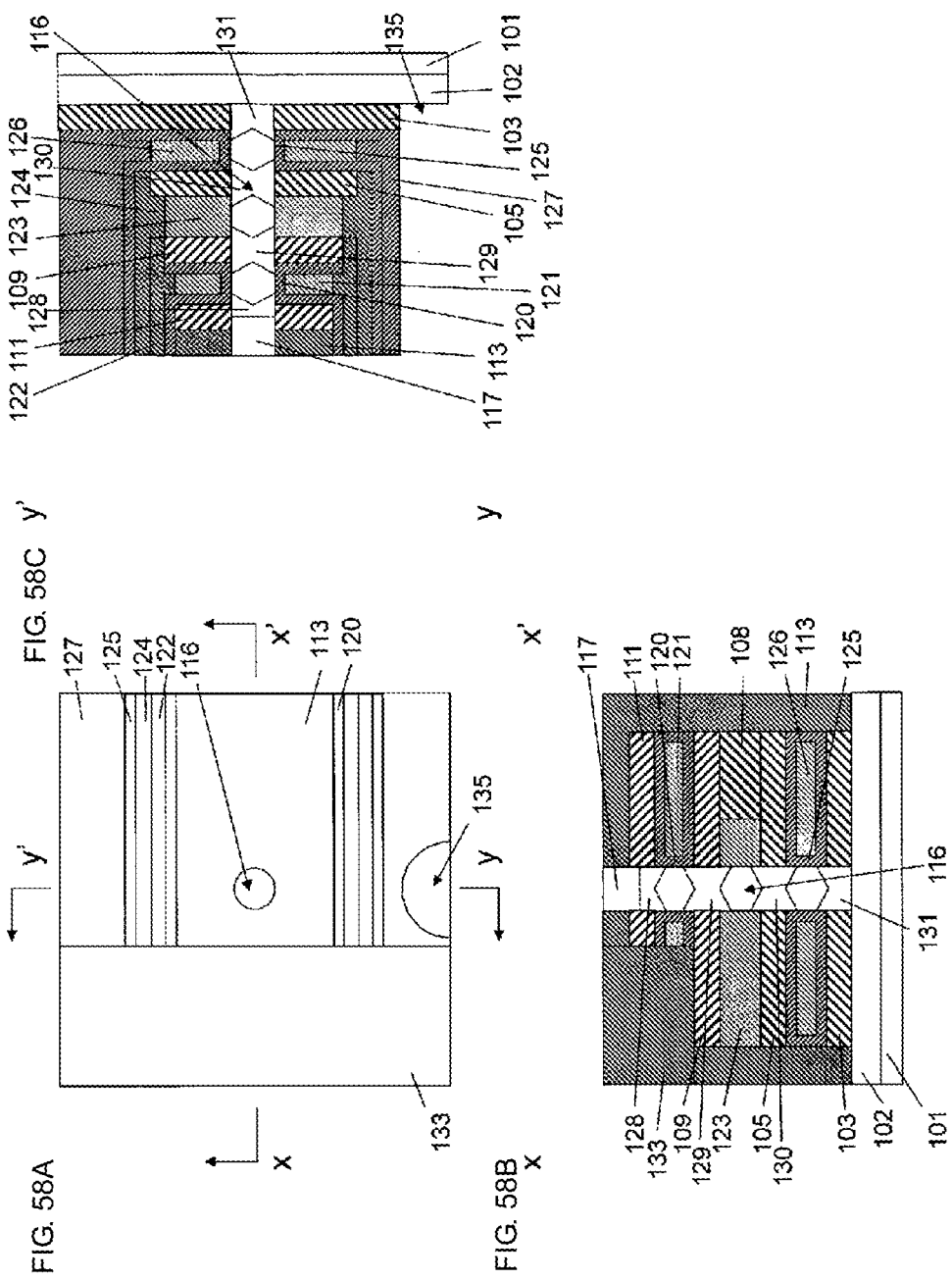

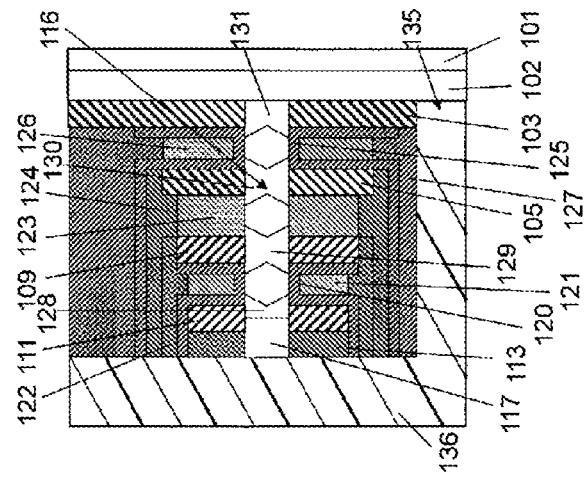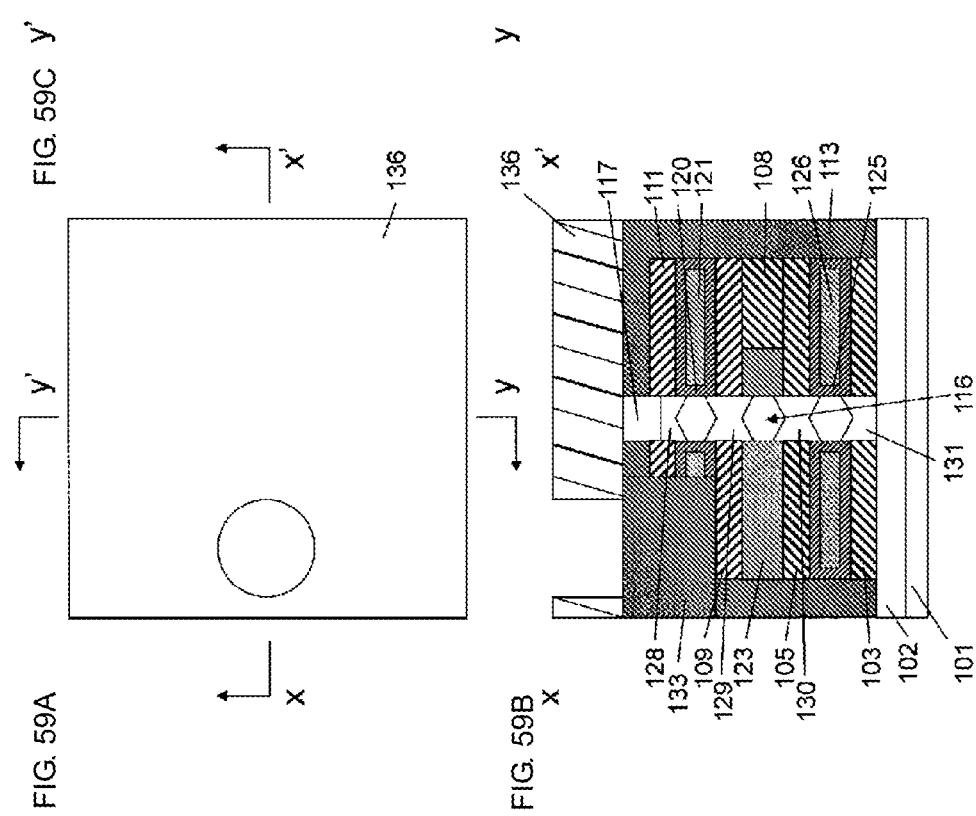

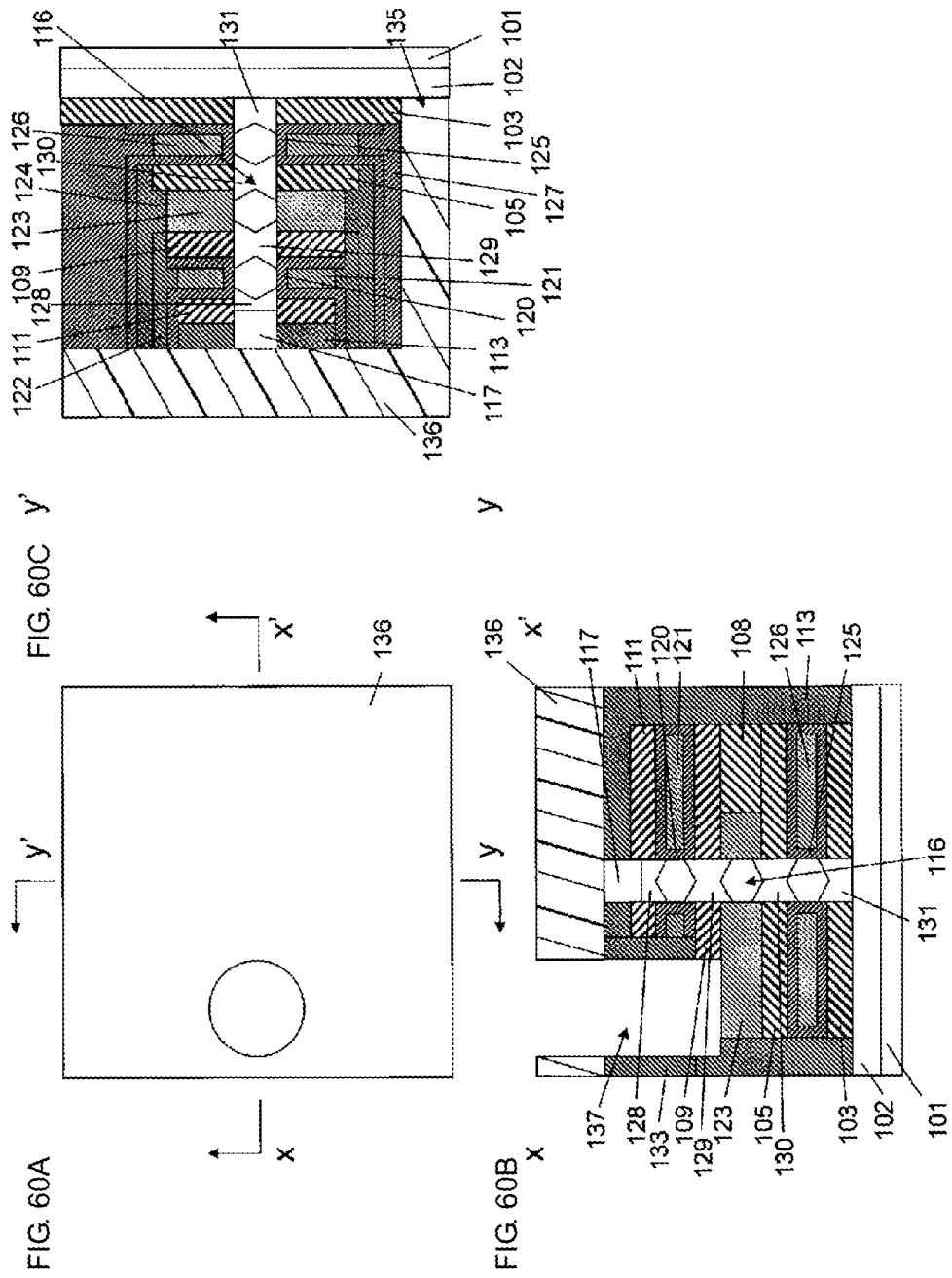

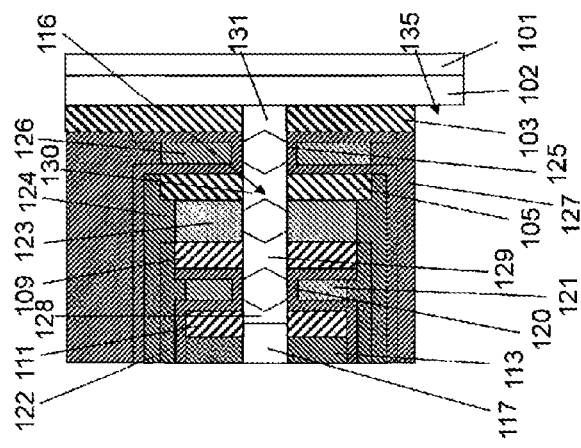
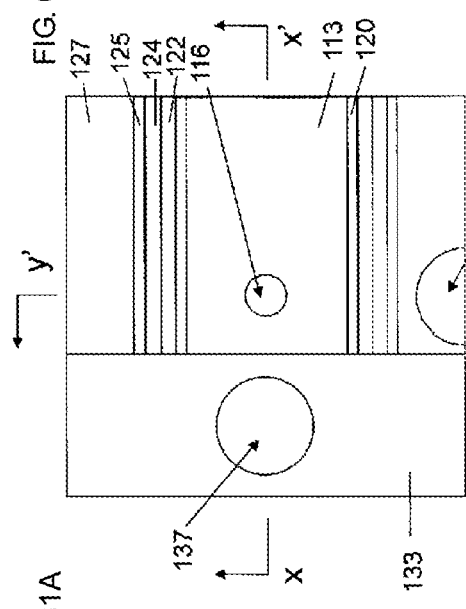
FIG. 61C
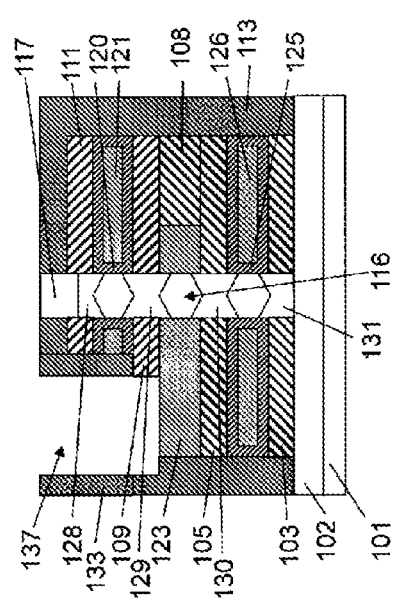
FIG. 61A
FIG. 61B

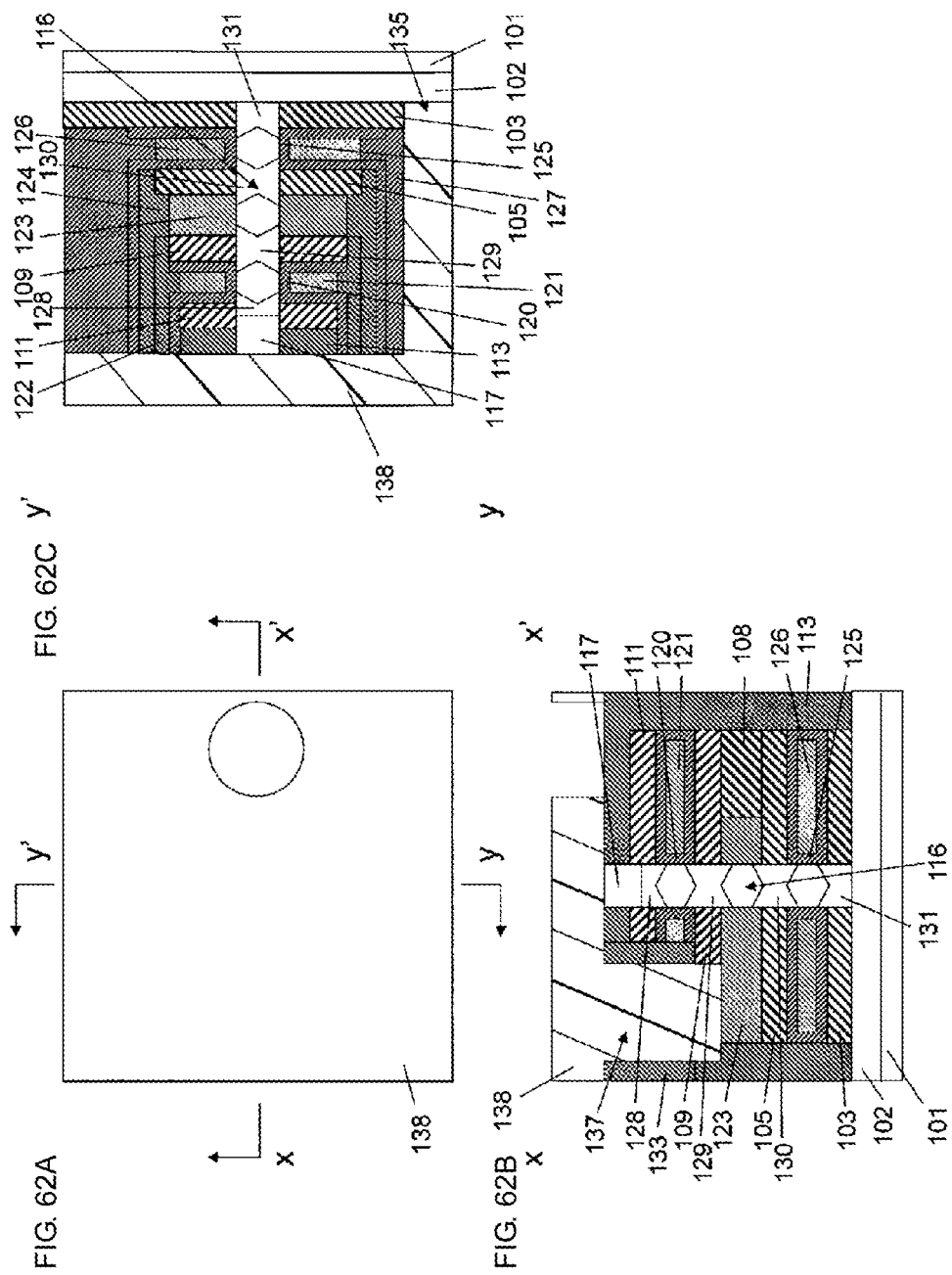

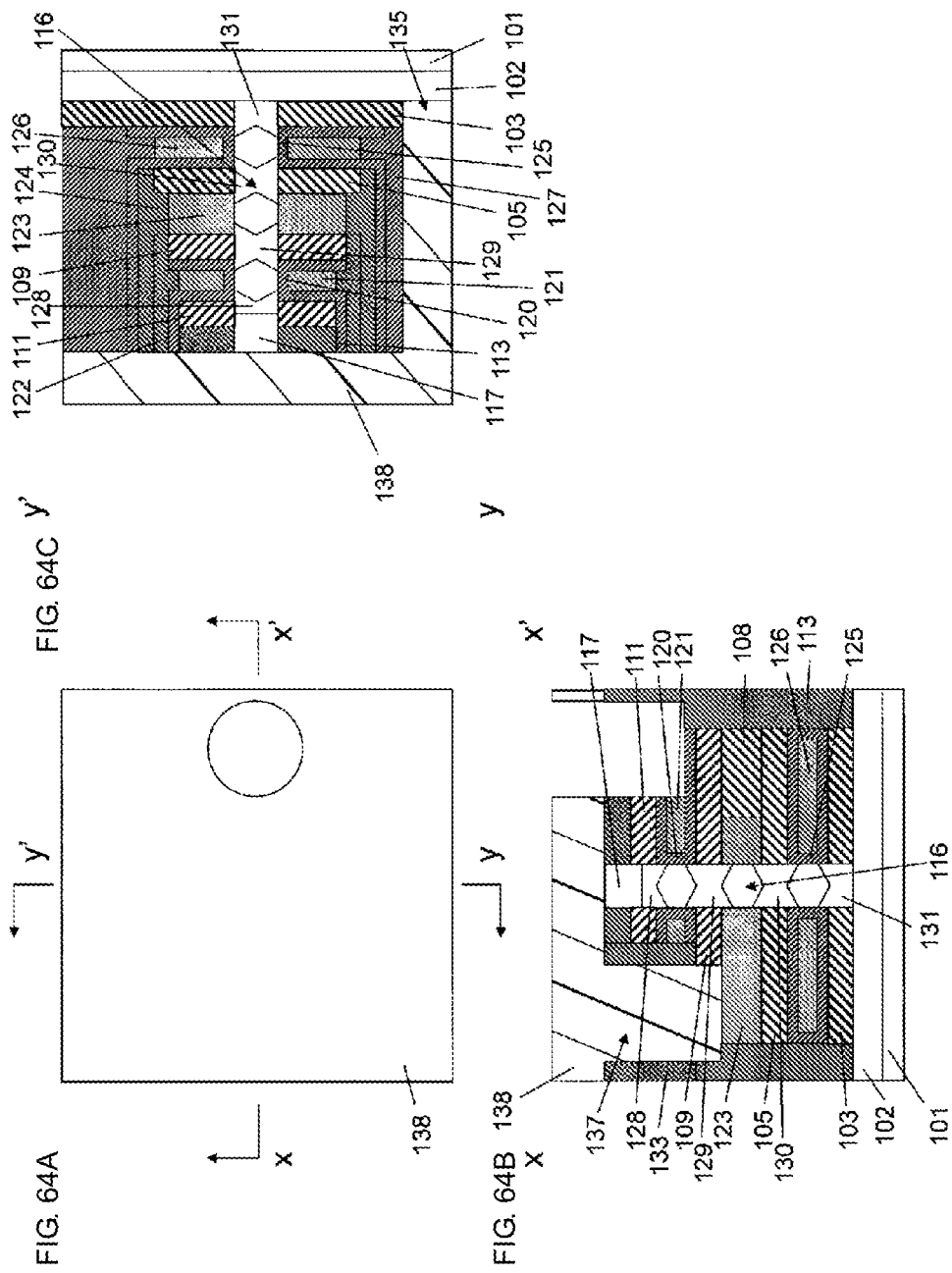

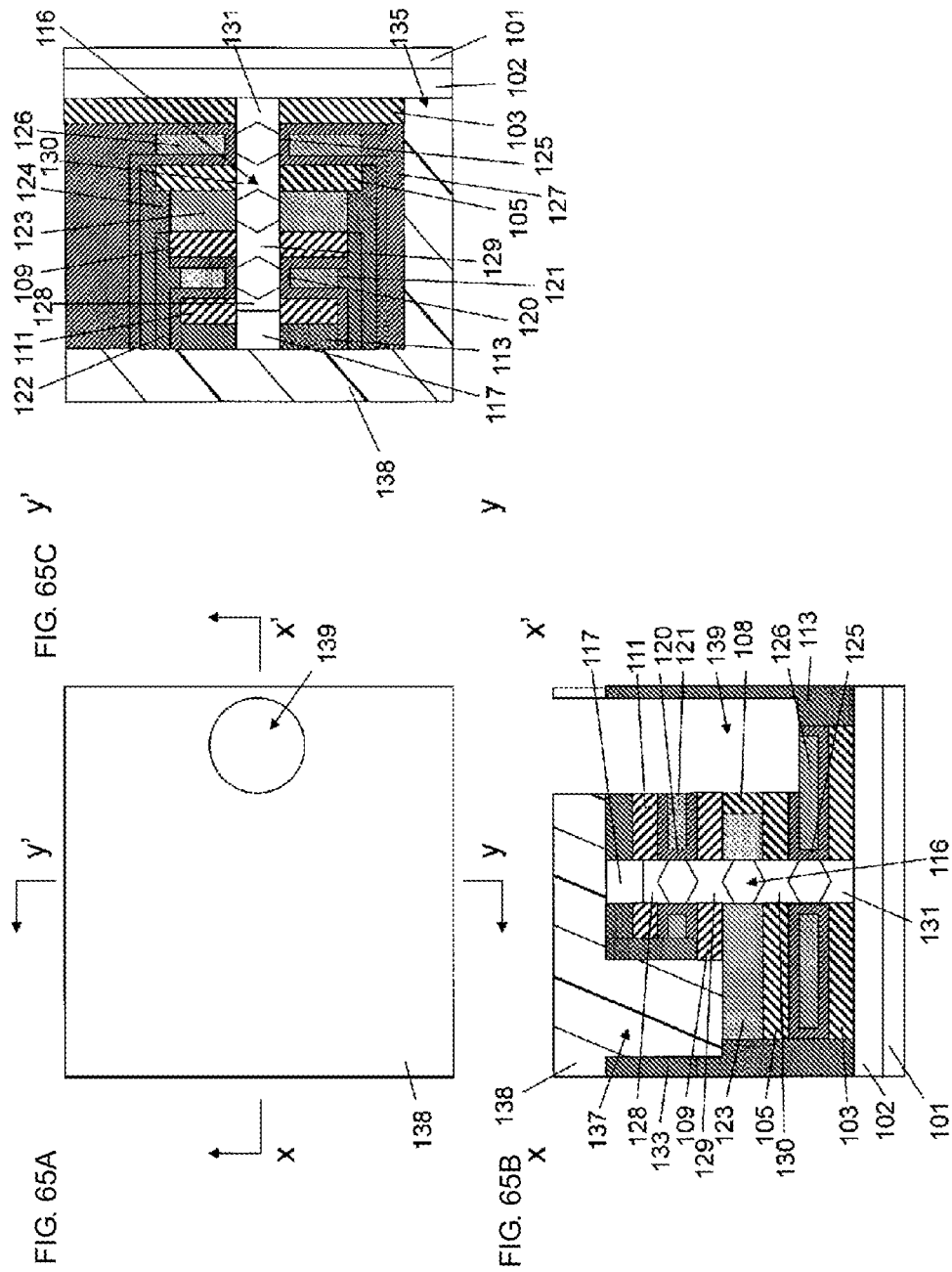

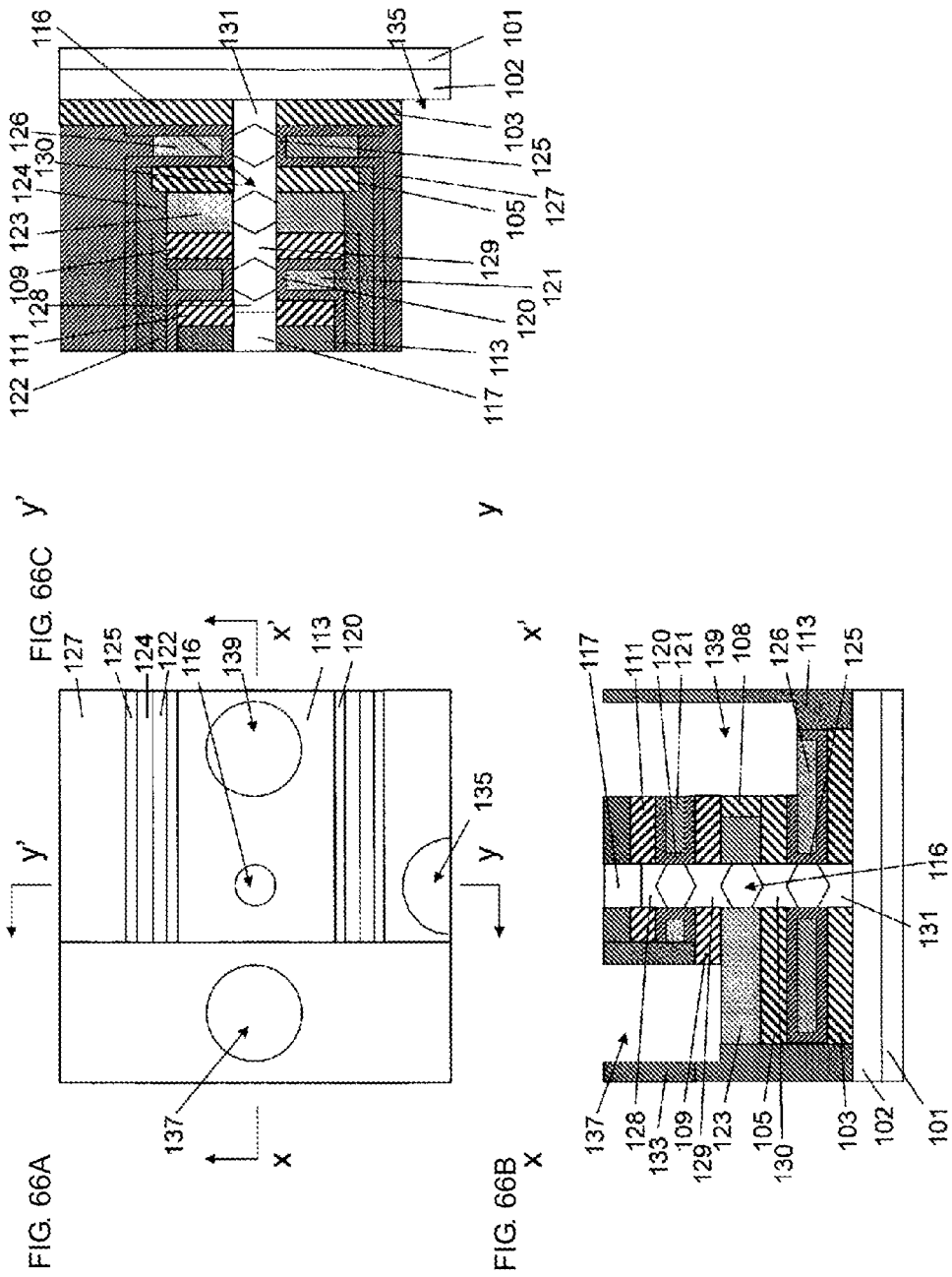

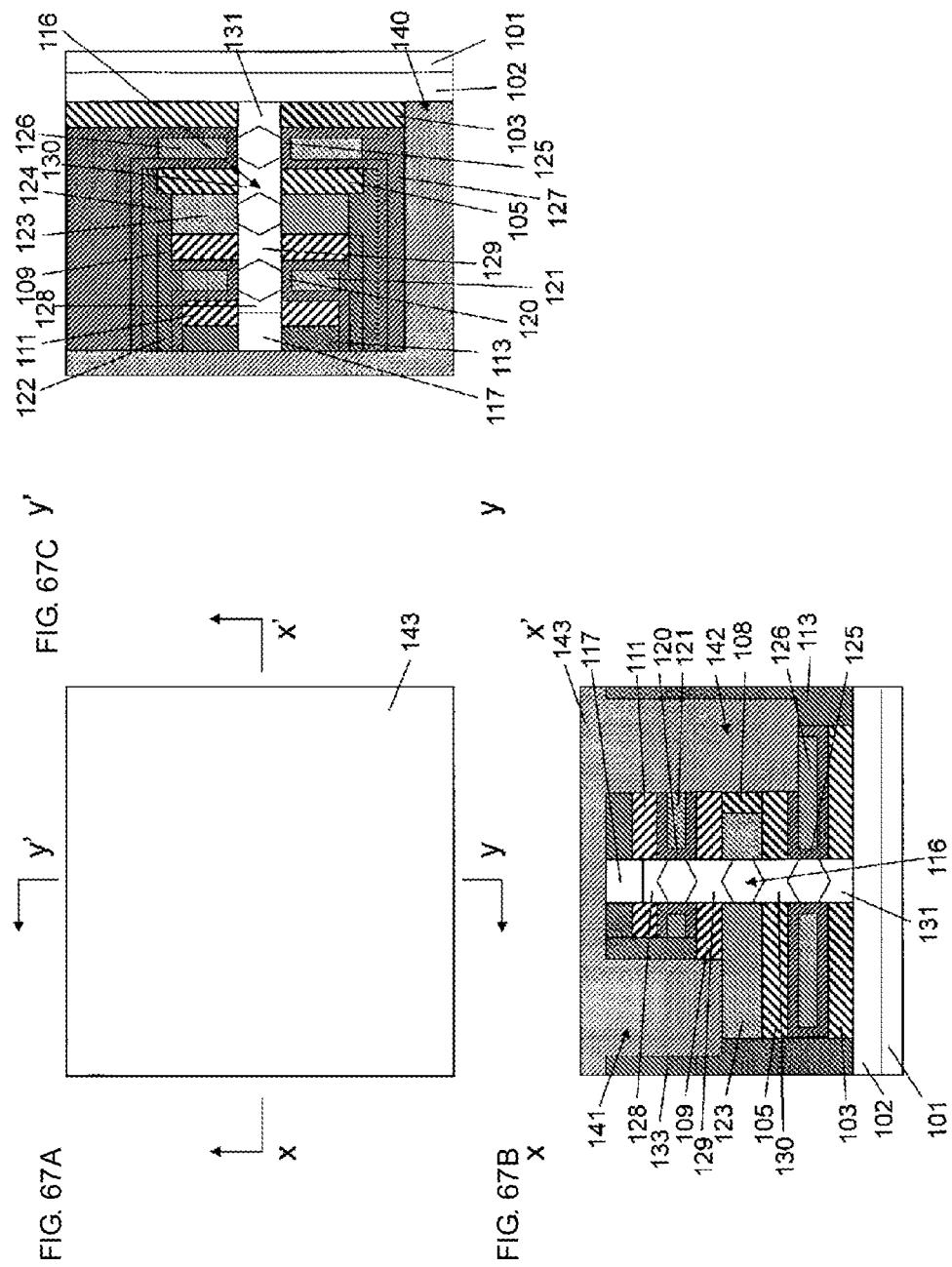

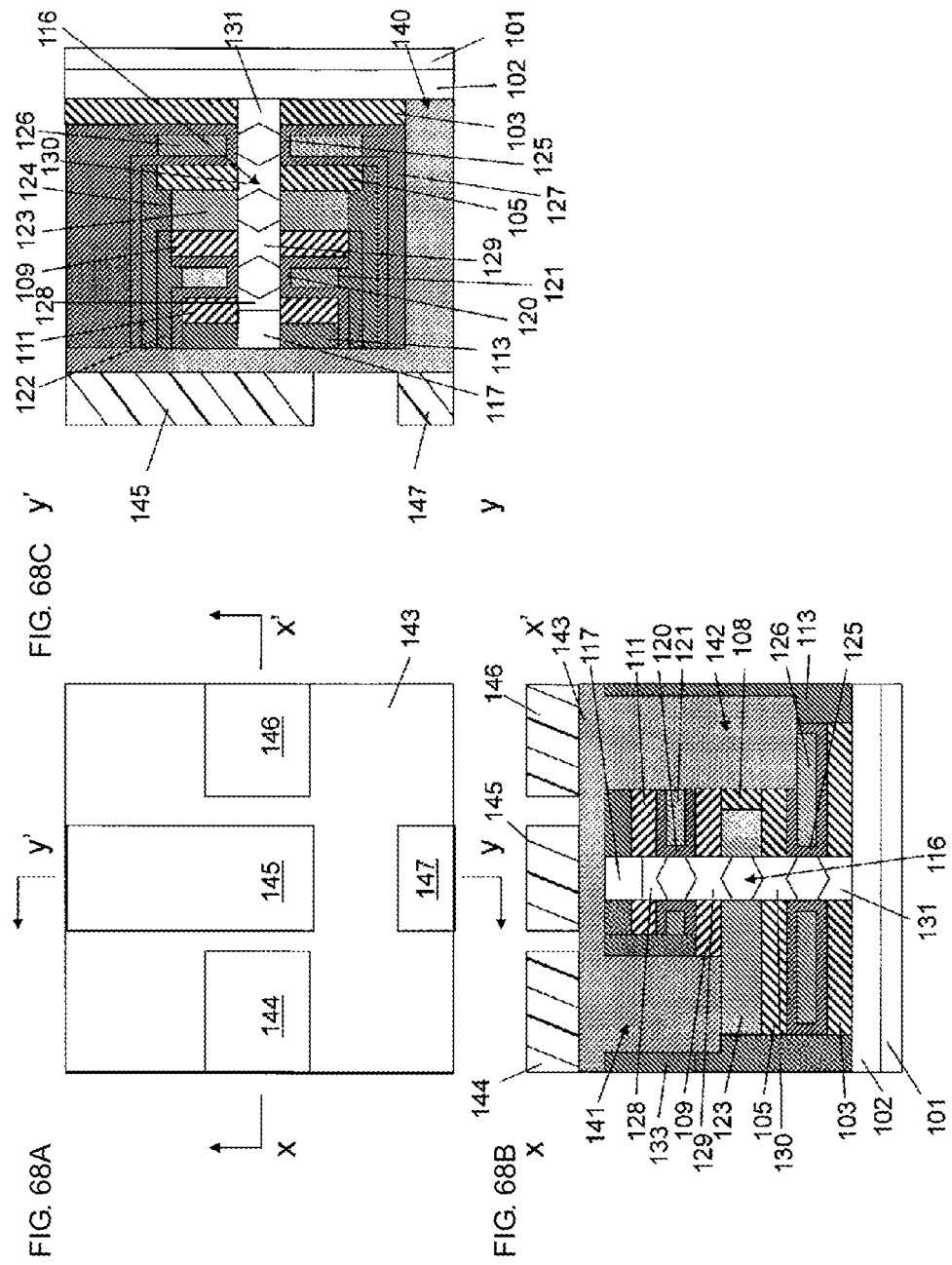

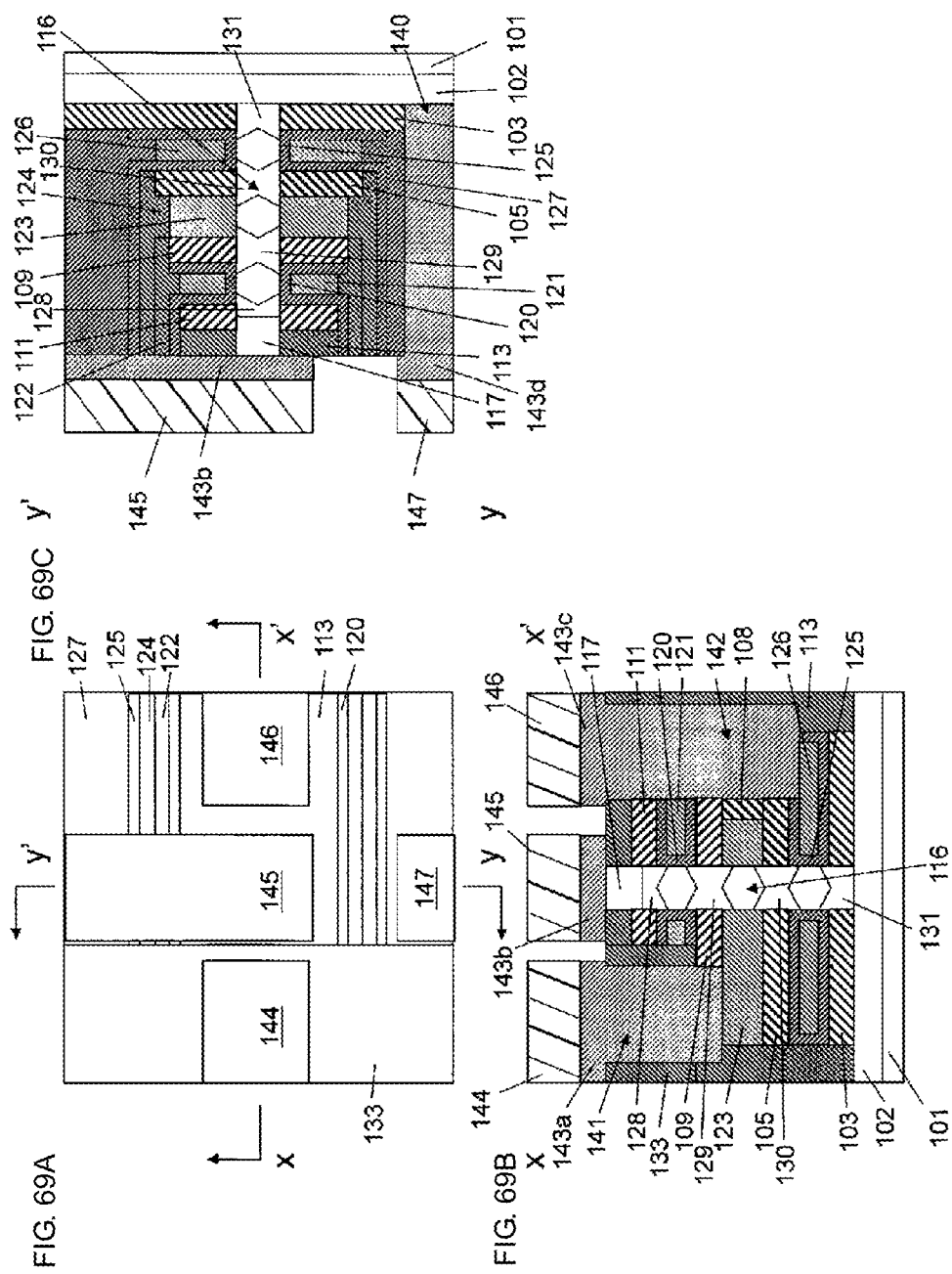

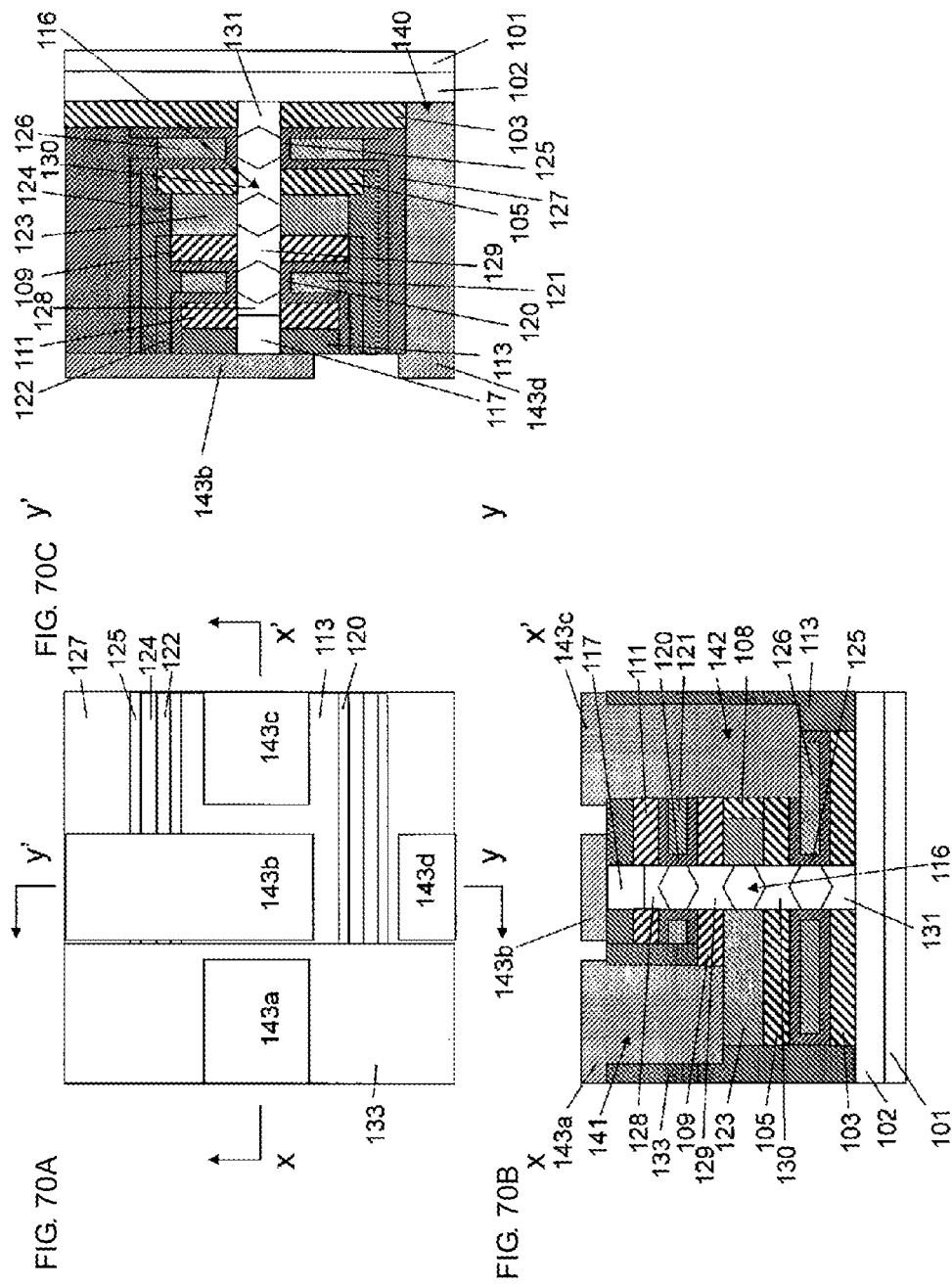

SEMICONDUCTOR DEVICE

RELATED APPLICATIONS

The present application is a continuation application of Ser. No. 14/743,570 filed Jun. 18, 2015, which claims priority to PCT/JP2014/068707, filed Jul. 14, 2014, the entire contents of which are incorporated herein by reference.

BACKGROUND

1. Technical Field

The present invention relates to a semiconductor device.

2. Description of the Related Art

The degree of integration of semiconductor integrated circuits, in particular, integrated circuits using MOS transistors has been increasing. With the increasing degree of integration, the size of MOS transistors used in integrated circuits has been decreased to nano-scale dimensions. Such a decrease in the size of MOS transistors causes difficulty in suppressing leak currents, which poses a problem in that it is hard to reduce the area occupied by the circuits because of the requirements of the secure retention of necessary currents. To address the problem, a surrounding gate transistor (hereinafter referred to as an "SGT") having a structure in which a source, a gate, and a drain are arranged vertically with respect to a substrate and a gate electrode surrounds a pillar-shaped semiconductor layer has been proposed (e.g., refer to Japanese Unexamined Patent Application Publication Nos. 2-71556, 2-188966, and 3-145761).

In known inverters that use an SGT, a single transistor is formed in a single silicon pillar, and an nMOS transistor constituted by a single silicon pillar and a pMOS transistor constituted by a single silicon pillar are formed on a plane (e.g., refer to Japanese Unexamined Patent Application Publication No. 2008-300558). Since at least two silicon pillars are formed on a plane, an area corresponding to the at least two silicon pillars is required.

In known nonvolatile memories, a plurality of gates are formed in a single silicon pillar (e.g., refer to Japanese Unexamined Patent Application Publication No. 2014-57068). A gate insulating film is formed on a sidewall of the silicon pillar, and a source line and a bit line are connected to an upper end and a lower end of the silicon pillar, respectively.

SUMMARY

Accordingly, an object is to provide an inverter circuit formed of a single semiconductor pillar.

A semiconductor device according to an embodiment of the present invention includes a third first-conductivity-type semiconductor layer formed on a semiconductor substrate; a first pillar-shaped semiconductor layer formed on the semiconductor substrate, the first pillar-shaped semiconductor layer including a first first-conductivity-type semiconductor layer, a first body region, a second first-conductivity-type semiconductor layer, a first second-conductivity-type semiconductor layer, a second body region, a second second-conductivity-type semiconductor layer, and a third second-conductivity-type semiconductor layer formed from a substrate side in that order; a first gate insulating film formed around the first body region; a first gate formed around the first gate insulating film; a second gate insulating film formed around the second body region; a second gate formed around the second gate insulating film; an output terminal connected to the second first-conductivity-type semiconductor layer and the first second-conductivity-type semiconductor layer; and a first contact that connects the first gate and the second gate.

The first gate insulating film may be further formed on an upper surface and a lower surface of the first gate, and the second gate insulating film may be further formed on an upper surface and a lower surface of the second gate.

The semiconductor device may include a first connection region formed between the second first-conductivity-type semiconductor layer and the first second-conductivity-type semiconductor layer.

The semiconductor device may include a first insulating film that surrounds the first first-conductivity-type semiconductor layer, a second insulating film that surrounds the second first-conductivity-type semiconductor layer, a third insulating film that surrounds the first second-conductivity-type semiconductor layer, and a fourth insulating film that surrounds the second second-conductivity-type semiconductor layer. The first insulating film contains the same impurity as that of the first first-conductivity-type semiconductor layer, the second insulating film contains the same impurity as that of the second first-conductivity-type semiconductor layer, the third insulating film contains the same impurity as that of the first second-conductivity-type semiconductor layer, and the fourth insulating film contains the same impurity as that of the second second-conductivity-type semiconductor layer.

A method for producing a semiconductor device according to an embodiment of the present invention includes depositing a second insulating film that is an oxide film containing an impurity having a first conductivity type on a substrate, depositing a sixth insulating film that is a nitride film, depositing a third insulating film that is an oxide film containing an impurity having a second conductivity type which is a conductivity type different from the first conductivity type, etching the second insulating film, the sixth insulating film, and the third insulating film to form a contact hole, performing epitaxial growth in the contact hole to form a first pillar-shaped silicon layer; and removing the sixth insulating film and depositing a metal to form an output terminal.

By performing a heat treatment after the step of performing epitaxial growth in the contact hole to form a first pillar-shaped silicon layer, a second first-conductivity-type semiconductor layer and a first second-conductivity-type semiconductor layer may be formed in the first pillar-shaped silicon layer.

According to the present invention, there can be provided an inverter circuit formed of a single semiconductor pillar.

An inverter formed of a single semiconductor pillar is constituted by a third first-conductivity-type semiconductor layer formed on a semiconductor substrate; a first pillar-shaped semiconductor layer formed on the semiconductor substrate, the first pillar-shaped semiconductor layer including a first first-conductivity-type semiconductor layer, a first body region, a second first-conductivity-type semiconductor layer, a first second-conductivity-type semiconductor layer, a second body region, a second second-conductivity-type semiconductor layer, and a third second-conductivity-type semiconductor layer formed from a substrate side in that order; a first gate insulating film formed around the first body region; a first gate formed around the first gate insulating film; a second gate insulating film formed around the second body region; a second gate formed around the second gate insulating film; an output terminal connected to the second first-conductivity-type semiconductor layer and the first second-conductivity-type semiconductor layer; and a first contact that connects the first gate and the second gate. Therefore, an inverter can be achieved in an area corresponding to a single semiconductor pillar.

The first gate insulating film is further formed on an upper surface and a lower surface of the first gate, and the second gate insulating film is further formed on an upper surface and a lower surface of the second gate. Therefore, insulation of the first gate in a vertical direction and insulation of the second gate in a vertical direction can be achieved with certainty.

The semiconductor device includes a first connection region formed between the second first-conductivity-type semiconductor layer and the first second-conductivity-type semiconductor layer. Therefore, the second first-conductivity-type semiconductor layer and the first second-conductivity-type semiconductor layer can be separated from each other, and the second first-conductivity-type semiconductor layer that extends to the connection region and the first second-conductivity-type semiconductor layer that extends to the connection region can be connected to the output terminal.

The semiconductor device includes a first insulating film that surrounds the first first-conductivity-type semiconductor layer, a second insulating film that surrounds the second first-conductivity-type semiconductor layer, a third insulating film that surrounds the first second-conductivity-type semiconductor layer, and a fourth insulating film that surrounds the second second-conductivity-type semiconductor layer. The first insulating film contains the same impurity as that of the first first-conductivity-type semiconductor layer, the second insulating film contains the same impurity as that of the second first-conductivity-type semiconductor layer, the third insulating film contains the same impurity as that of the first second-conductivity-type semiconductor layer, and the fourth insulating film contains the same impurity as that of the second second-conductivity-type semiconductor layer. Therefore, semiconductor layers having different conductivity types can be formed in a single pillar-shaped semiconductor layer through solid-state diffusion.

BRIEF DESCRIPTION OF THE DRAWING

FIG. 1A is a plan view illustrating a semiconductor device according to an embodiment of the present invention, FIG. 1B is a sectional view taken along line x-x' of FIG. 1A, and FIG. 1C is a sectional view taken along line y-y' of FIG. 1A;

FIG. 2A is a plan view illustrating a method for producing a semiconductor device according to an embodiment of the present invention, FIG. 2B is a sectional view taken along line x-x' of FIG. 2A, and FIG. 2C is a sectional view taken along line y-y' of FIG. 2A;

FIG. 3A is a plan view illustrating a method for producing a semiconductor device according to an embodiment of the present invention, FIG. 3B is a sectional view taken along line x-x' of FIG. 3A, and FIG. 3C is a sectional view taken along line y-y' of FIG. 3A;

FIG. 4A is a plan view illustrating a method for producing a semiconductor device according to an embodiment of the present invention, FIG. 4B is a sectional view taken along line x-x' of FIG. 4A, and FIG. 4C is a sectional view taken along line y-y' of FIG. 4A;

FIG. 5A is a plan view illustrating a method for producing a semiconductor device according to an embodiment of the present invention, FIG. 5B is a sectional view taken along line x-x' of FIG. 5A, and FIG. 5C is a sectional view taken along line y-y' of FIG. 5A;

FIG. 6A is a plan view illustrating a method for producing a semiconductor device according to an embodiment of the present invention, FIG. 6B is a sectional view taken along line x-x' of FIG. 6A, and FIG. 6C is a sectional view taken along line y-y' of FIG. 6A;

FIG. 7A is a plan view illustrating a method for producing a semiconductor device according to an embodiment of the present invention, FIG. 7B is a sectional view taken along line x-x' of FIG. 7A, and FIG. 7C is a sectional view taken along line y-y' of FIG. 7A;

FIG. 8A is a plan view illustrating a method for producing a semiconductor device according to an embodiment of the present invention, FIG. 8B is a sectional view taken along line x-x' of FIG. 8A, and FIG. 8C is a sectional view taken along line y-y' of FIG. 8A;

FIG. 9A is a plan view illustrating a method for producing a semiconductor device according to an embodiment of the present invention, FIG. 9B is a sectional view taken along line x-x' of FIG. 9A, and FIG. 9C is a sectional view taken along line y-y' of FIG. 9A;

FIG. 10A is a plan view illustrating a method for producing a semiconductor device according to an embodiment of the present invention, FIG. 10B is a sectional view taken along line x-x' of FIG. 10A, and FIG. 10C is a sectional view taken along line y-y' of FIG. 10A;

FIG. 11A is a plan view illustrating a method for producing a semiconductor device according to an embodiment of the present invention, FIG. 11B is a sectional view taken along line x-x' of FIG. 11A, and FIG. 11C is a sectional view taken along line y-y' of FIG. 11A;

FIG. 12A is a plan view illustrating a method for producing a semiconductor device according to an embodiment of the present invention, FIG. 12B is a sectional view taken along line x-x' of FIG. 12A, and FIG. 12C is a sectional view taken along line y-y' of FIG. 12A;

FIG. 13A is a plan view illustrating a method for producing a semiconductor device according to an embodiment of the present invention, FIG. 13B is a sectional view taken along line x-x' of FIG. 13A, and FIG. 13C is a sectional view taken along line y-y' of FIG. 13A;

FIG. 14A is a plan view illustrating a method for producing a semiconductor device according to an embodiment of the present invention, FIG. 14B is a sectional view taken along line x-x' of FIG. 14A, and FIG. 14C is a sectional view taken along line y-y' of FIG. 14A;

FIG. 15A is a plan view illustrating a method for producing a semiconductor device according to an embodiment of the present invention, FIG. 15B is a sectional view taken along line x-x' of FIG. 15A, and FIG. 15C is a sectional view taken along line y-y' of FIG. 15A;

FIG. 16A is a plan view illustrating a method for producing a semiconductor device according to an embodiment of the present invention, FIG. 16B is a sectional view taken along line x-x' of FIG. 16A, and FIG. 16C is a sectional view taken along line y-y' of FIG. 16A;

FIG. 17A is a plan view illustrating a method for producing a semiconductor device according to an embodiment of the present invention, FIG. 17B is a sectional view taken along line x-x' of FIG. 17A, and FIG. 17C is a sectional view taken along line y-y' of FIG. 17A;

FIG. 18A is a plan view illustrating a method for producing a semiconductor device according to an embodiment of the present invention, FIG. 18B is a sectional view taken along line x-x' of FIG. 18A, and FIG. 18C is a sectional view taken along line y-y' of FIG. 18A;

FIG. 20A is a plan view illustrating a method for producing a semiconductor device according to an embodiment of the present invention, FIG. 20B is a sectional view taken along line x-x' of FIG. 20A, and FIG. 20C is a sectional view taken along line y-y' of FIG. 20A;

FIG. 21A is a plan view illustrating a method for producing a semiconductor device according to an embodiment of the present invention, FIG. 21B is a sectional view taken along line x-x' of FIG. 21A, and FIG. 21C is a sectional view taken along line y-y' of FIG. 21A;

FIG. 24A is a plan view illustrating a method for producing a semiconductor device according to an embodiment of the present invention, FIG. 24B is a sectional view taken along line x-x' of FIG. 24A, and FIG. 24C is a sectional view taken along line y-y' of FIG. 24A;

FIG. 25A is a plan view illustrating a method for producing a semiconductor device according to an embodiment of the present invention, FIG. 25B is a sectional view taken along line x-x' of FIG. 25A, and FIG. 25C is a sectional view taken along line y-y' of FIG. 25A;

FIG. 26A is a plan view illustrating a method for producing a semiconductor device according to an embodiment of the present invention, FIG. 26B is a sectional view taken along line x-x' of FIG. 26A, and FIG. 26C is a sectional view taken along line y-y' of FIG. 26A;

FIG. 27A is a plan view illustrating a method for producing a semiconductor device according to an embodiment of the present invention, FIG. 27B is a sectional view taken along line x-x' of FIG. 27A, and FIG. 27C is a sectional view taken along line y-y' of FIG. 27A;

FIG. 28A is a plan view illustrating a method for producing a semiconductor device according to an embodiment of the present invention, FIG. 28B is a sectional view taken along line x-x' of FIG. 28A, and FIG. 28C is a sectional view taken along line y-y' of FIG. 28A;

FIG. 29A is a plan view illustrating a method for producing a semiconductor device according to an embodiment of the present invention, FIG. 29B is a sectional view taken along line x-x' of FIG. 29A, and FIG. 29C is a sectional view taken along line y-y' of FIG. 29A;

FIG. 30A is a plan view illustrating a method for producing a semiconductor device according to an embodiment of the present invention, FIG. 30B is a sectional view taken along line x-x' of FIG. 30A, and FIG. 30C is a sectional view taken along line y-y' of FIG. 30A;

FIG. 31A is a plan view illustrating a method for producing a semiconductor device according to an embodiment of the present invention, FIG. 31B is a sectional view taken along line x-x' of FIG. 31A, and FIG. 31C is a sectional view taken along line y-y' of FIG. 31A;

FIG. 32A is a plan view illustrating a method for producing a semiconductor device according to an embodiment of the present invention, FIG. 32B is a sectional view taken along line x-x' of FIG. 32A, and FIG. 32C is a sectional view taken along line y-y' of FIG. 32A;

FIG. 33A is a plan view illustrating a method for producing a semiconductor device according to an embodiment of the present invention, FIG. 33B is a sectional view taken along line x-x' of FIG. 33A, and FIG. 33C is a sectional view taken along line y-y' of FIG. 33A;

FIG. 34A is a plan view illustrating a method for producing a semiconductor device according to an embodiment of the present invention, FIG. 34B is a sectional view taken along line x-x' of FIG. 34A, and FIG. 34C is a sectional view taken along line y-y' of FIG. 34A;

FIG. 35A is a plan view illustrating a method for producing a semiconductor device according to an embodiment of the present invention, FIG. 35B is a sectional view taken along line x-x' of FIG. 35A, and FIG. 35C is a sectional view taken along line y-y' of FIG. 35A;

FIG. 36A is a plan view illustrating a method for producing a semiconductor device according to an embodiment of the present invention, FIG. 36B is a sectional view taken along line x-x' of FIG. 36A, and FIG. 36C is a sectional view taken along line y-y' of FIG. 36A;

FIG. 37A is a plan view illustrating a method for producing a semiconductor device according to an embodiment of the present invention, FIG. 37B is a sectional view taken along line x-x' of FIG. 37A, and FIG. 37C is a sectional view taken along line y-y' of FIG. 37A;

FIG. 38A is a plan view illustrating a method for producing a semiconductor device according to an embodiment of the present invention, FIG. 38B is a sectional view taken along line x-x' of FIG. 38A, and FIG. 38C is a sectional view taken along line y-y' of FIG. 38A;

FIG. 39A is a plan view illustrating a method for producing a semiconductor device according to an embodiment of the present invention, FIG. 39B is a sectional view taken along line x-x' of FIG. 39A, and FIG. 39C is a sectional view taken along line y-y' of FIG. 39A;

FIG. 40A is a plan view illustrating a method for producing a semiconductor device according to an embodiment of the present invention, FIG. 40B is a sectional view taken along line x-x' of FIG. 40A, and FIG. 40C is a sectional view taken along line y-y' of FIG. 40A;

FIG. 41A is a plan view illustrating a method for producing a semiconductor device according to an embodiment of the present invention, FIG. 41B is a sectional view taken along line x-x' of FIG. 41A, and FIG. 41C is a sectional view taken along line y-y' of FIG. 41A;

FIG. 43A is a plan view illustrating a method for producing a semiconductor device according to an embodiment of the present invention, FIG. 43B is a sectional view taken along line x-x' of FIG. 43A, and FIG. 43C is a sectional view taken along line y-y' of FIG. 43A;

FIG. 44A is a plan view illustrating a method for producing a semiconductor device according to an embodiment of the present invention, FIG. 44B is a sectional view taken along line x-x' of FIG. 44A, and FIG. 44C is a sectional view taken along line y-y' of FIG. 44A;

FIG. 45A is a plan view illustrating a method for producing a semiconductor device according to an embodiment of the present invention, FIG. 45B is a sectional view taken along line x-x' of FIG. 45A, and FIG. 45C is a sectional view taken along line y-y' of FIG. 45A;

FIG. 46A is a plan view illustrating a method for producing a semiconductor device according to an embodiment of the present invention, FIG. 46B is a sectional view taken along line x-x' of FIG. 46A, and FIG. 46C is a sectional view taken along line y-y' of FIG. 46A;

FIG. 47A is a plan view illustrating a method for producing a semiconductor device according to an embodiment of the present invention, FIG. 47B is a sectional view taken along line x-x' of FIG. 47A, and FIG. 47C is a sectional view taken along line y-y' of FIG. 47A;

FIG. 48A is a plan view illustrating a method for producing a semiconductor device according to an embodiment of the present invention, FIG. 48B is a sectional view taken along line x-x' of FIG. 48A, and FIG. 48C is a sectional view taken along line y-y' of FIG. 48A;

FIG. 49A is a plan view illustrating a method for producing a semiconductor device according to an embodiment of the present invention, FIG. 49B is a sectional view taken along line x-x' of FIG. 49A, and FIG. 49C is a sectional view taken along line y-y' of FIG. 49A;

FIG. 50A is a plan view illustrating a method for producing a semiconductor device according to an embodiment of the present invention, FIG. 50B is a sectional view taken along line x-x' of FIG. 50A, and FIG. 50C is a sectional view taken along line y-y' of FIG. 50A;

FIG. 52A is a plan view illustrating a method for producing a semiconductor device according to an embodiment of the present invention, FIG. 52B is a sectional view taken along line x-x' of FIG. 52A, and FIG. 52C is a sectional view taken along line y-y' of FIG. 52A;

FIG. 53A is a plan view illustrating a method for producing a semiconductor device according to an embodiment of the present invention, FIG. 53B is a sectional view taken along line x-x' of FIG. 53A, and FIG. 53C is a sectional view taken along line y-y' of FIG. 53A;

FIG. 55A is a plan view illustrating a method for producing a semiconductor device according to an embodiment of the present invention, FIG. 55B is a sectional view taken along line x-x' of FIG. 55A, and FIG. 55C is a sectional view taken along line y-y' of FIG. 55A;

FIG. 56A is a plan view illustrating a method for producing a semiconductor device according to an embodiment of the present invention, FIG. 56B is a sectional view taken along line x-x' of FIG. 56A, and FIG. 56C is a sectional view taken along line y-y' of FIG. 56A;

FIG. 57A is a plan view illustrating a method for producing a semiconductor device according to an embodiment of the present invention, FIG. 57B is a sectional view taken along line x-x' of FIG. 57A, and FIG. 57C is a sectional view taken along line y-y' of FIG. 57A;

FIG. 58A is a plan view illustrating a method for producing a semiconductor device according to an embodiment of the present invention, FIG. 58B is a sectional view taken along line x-x' of FIG. 58A, and FIG. 58C is a sectional view taken along line y-y' of FIG. 58A;

FIG. 59A is a plan view illustrating a method for producing a semiconductor device according to an embodiment of the present invention, FIG. 59B is a sectional view taken along line x-x' of FIG. 59A, and FIG. 59C is a sectional view taken along line y-y' of FIG. 59A;

FIG. 60A is a plan view illustrating a method for producing a semiconductor device according to an embodiment of the present invention, FIG. 60B is a sectional view taken along line x-x' of FIG. 60A, and FIG. 60C is a sectional view taken along line y-y' of FIG. 60A;

FIG. 61A is a plan view illustrating a method for producing a semiconductor device according to an embodiment of the present invention, FIG. 61B is a sectional view taken along line x-x' of FIG. 61A, and FIG. 61C is a sectional view taken along line y-y' of FIG. 61A;

FIG. 62A is a plan view illustrating a method for producing a semiconductor device according to an embodiment of the present invention, FIG. 62B is a sectional view taken along line x-x' of FIG. 62A, and FIG. 62C is a sectional view taken along line y-y' of FIG. 62A;

FIG. 64A is a plan view illustrating a method for producing a semiconductor device according to an embodiment of the present invention, FIG. 64B is a sectional view taken along line x-x' of FIG. 64A, and FIG. 64C is a sectional view taken along line y-y' of FIG. 64A;

FIG. 65A is a plan view illustrating a method for producing a semiconductor device according to an embodiment of the present invention, FIG. 65B is a sectional view taken along line x-x' of FIG. 65A, and FIG. 65C is a sectional view taken along line y-y' of FIG. 65A;

FIG. 66A is a plan view illustrating a method for producing a semiconductor device according to an embodiment of the present invention, FIG. 66B is a sectional view taken along line x-x' of FIG. 66A, and FIG. 66C is a sectional view taken along line y-y' of FIG. 66A;

FIG. 67A is a plan view illustrating a method for producing a semiconductor device according to an embodiment of the present invention, FIG. 67B is a sectional view taken along line x-x' of FIG. 67A, and FIG. 67C is a sectional view taken along line y-y' of FIG. 67A;

FIG. 68A is a plan view illustrating a method for producing a semiconductor device according to an embodiment of the present invention, FIG. 68B is a sectional view taken along line x-x' of FIG. 68A, and FIG. 68C is a sectional view taken along line y-y' of FIG. 68A;

FIG. 69A is a plan view illustrating a method for producing a semiconductor device according to an embodiment of the present invention, FIG. 69B is a sectional view taken along line x-x' of FIG. 69A, and FIG. 69C is a sectional view taken along line y-y' of FIG. 69A; and FIG. 70A is a plan view illustrating a method for producing a semiconductor device according to an embodiment of the present invention, FIG. 70B is a sectional view taken along line x-x' of FIG. 70A, and FIG. 70C is a sectional view taken along line y-y' of FIG. 70A.

DETAILED DESCRIPTION OF THE PREFERRED EMBODIMENTS

Figure 19A:
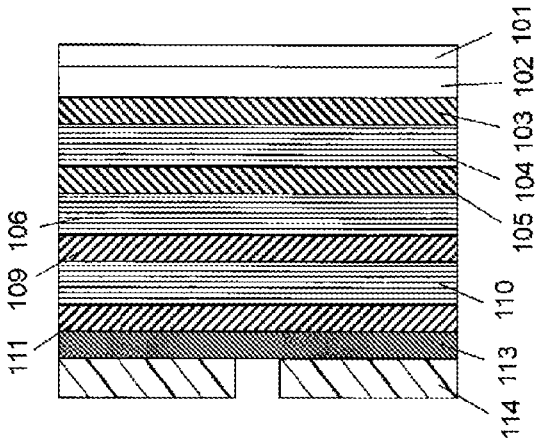
FIG. 19A is a plan view illustrating a method for producing a semiconductor device according to an embodiment of the present invention.

Hereafter, embodiments of the present invention will be described. FIGS. 1A to 1C illustrate a structure of a semiconductor device according to an embodiment of the present invention. In this embodiment, silicon is used as a semiconductor, but a material other than silicon may be used as a semiconductor.

The semiconductor device includes a third first-conductivity-type silicon layer 102 formed on a silicon substrate 101 and a first pillar-shaped silicon layer 116 formed on the silicon substrate 101. The first pillar-shaped silicon layer 116 includes a first first-conductivity-type silicon layer 131, a first body region 202, a second first-conductivity-type silicon layer 130, a first second-conductivity-type silicon layer 129, a second body region 201, a second second-conductivity-type silicon layer 128, and a third second-conductivity-type silicon layer 117 formed from the substrate side in that order. The semiconductor device also includes a first gate insulating film 125 formed around the first body region 202, a first gate 126 formed around the first gate insulating film 125, a second gate insulating film 120 formed around the second body region 201, a second gate 121 formed around the second gate insulating film 120, an output terminal 123 connected to the second first-conductivity-type silicon layer 130 and the first second-conductivity-type silicon layer 129, and a first contact 142 that connects the first gate 126 and the second gate 121.

The first gate 126 and the second gate 121 are preferably made of a metal to adjust the threshold of transistors. The metal is preferably titanium nitride or titanium aluminum nitride. The first gate insulating film 125 and the second gate insulating film 120 are each preferably an oxide film, an oxynitride film, or a high-K dielectric film.

The first gate insulating film 125 is also formed on the upper surface and lower surface of the first gate 126. The second gate insulating film 120 is also formed on the upper surface and lower surface of the second gate 121.

The semiconductor device includes a first connection region 203 formed between the second first-conductivity-type silicon layer 130 and the first second-conductivity-type silicon layer 129.

The semiconductor device also includes a first insulating film 103 that surrounds the first first-conductivity-type silicon layer 131 and a second insulating film 105 that surrounds the second first-conductivity-type silicon layer 130. The first insulating film 103 contains the same impurity as that of the first first-conductivity-type silicon layer 131, and the second insulating film 105 contains the same impurity as that of the second first-conductivity-type silicon layer 130. The semiconductor device also includes a third insulating film 109 that surrounds the first second-conductivity-type silicon layer 129 and a fourth insulating film 111 that surrounds the second second-conductivity-type silicon layer 128. The third insulating film 109 contains the same impurity as that of the first second-conductivity-type silicon layer 129, and the fourth insulating film 111 contains the same impurity as that of the second second-conductivity-type silicon layer 128.

When the transistor in a lower portion is an nMOS transistor, the first insulating film 103 and the second insulating film 105 are each preferably an oxide film containing phosphorus or arsenic in a high concentration. When the transistor in an upper portion is a pMOS transistor, the third insulating film 109 and the fourth insulating film 111 are each preferably an oxide film containing boron in a high concentration. When the transistor in a lower portion is a pMOS transistor, the first insulating film 103 and the second insulating film 105 are each preferably an oxide film containing boron in a high concentration. When the transistor in an upper portion is an nMOS transistor, the third insulating film 109 and the fourth insulating film 111 are each preferably an oxide film containing phosphorus or arsenic in a high concentration.

A production process for forming a structure of an SGT according to an embodiment of the present invention will be described with reference to FIG. 2A to FIG. 70C. In this embodiment, the substrate is made of silicon, but may be made of another semiconductor. In the process of this embodiment, nMOS is formed in a lower portion of a pillar-shaped semiconductor layer and pMOS is formed in an upper portion of the pillar-shaped semiconductor layer. However, pMOS may be formed in the lower portion and nMOS may be formed in the upper portion.

As illustrated in FIGS. 2A to 2C, an impurity is introduced into a silicon substrate 101 to form a third first-conductivity-type silicon layer 102.

As illustrated in FIGS. 3A to 3C, a first insulating film 103 is formed. The first insulating film 103 is preferably an oxide film and more preferably an oxide film containing phosphorus or arsenic in a high concentration. Alternatively, after the formation of the first insulating film 103, an impurity may be implanted to form an oxide film containing phosphorus or arsenic in a high concentration.

As illustrated in FIGS. 4A to 4C, a fifth insulating film 104 is formed. The fifth insulating film 104 is preferably a nitride film.

As illustrated in FIGS. 5A to 5C, a second insulating film 105 is formed. The second insulating film 105 is preferably an oxide film and more preferably an oxide film containing phosphorus or arsenic in a high concentration. Alternatively, after the formation of the second insulating film 105, an impurity may be implanted to form an oxide film containing phosphorus or arsenic in a high concentration.

As illustrated in FIGS. 6A to 6C, a sixth insulating film 106 is formed. The sixth insulating film 106 is preferably a nitride film.

As illustrated in FIGS. 7A to 7C, a first resist 107 is formed.

As illustrated in FIGS. 8A to 8C, the sixth insulating film 106 is etched.

As illustrated in FIGS. 9A to 9C, the first resist 107 is removed.

As illustrated in FIGS. 10A to 10C, a seventh insulating film 108 is formed to perform planarization. The seventh insulating film 108 is preferably an oxide film.

As illustrated in FIGS. 11A to 11C, the seventh insulating film 108 is etched back to expose the sixth insulating film 106.

As illustrated in FIGS. 12A to 12C, a third insulating film 109 is formed. The third insulating film 109 is preferably an oxide film and more preferably an oxide film containing boron in a high concentration. Alternatively, after the formation of the third insulating film 109, an impurity may be implanted to form an oxide film containing boron in a high concentration.

As illustrated in FIGS. 13A to 13C, an eighth insulating film 110 is formed. The eighth insulating film 110 is preferably a nitride film.

As illustrated in FIGS. 14A to 14C, a fourth insulating film 111 is formed. The fourth insulating film 111 is preferably an oxide film and more preferably an oxide film containing boron in a high concentration. Alternatively, after the formation of the fourth insulating film 111, an impurity may be implanted to form an oxide film containing boron in a high concentration.

As illustrated in FIGS. 15A to 15C, a second resist 112 is formed.

As illustrated in FIGS. 16A to 16C, the fourth insulating film 111, the eighth insulating film 110, the third insulating film 109, the seventh insulating film 108, the sixth insulating film 106, the second insulating film 105, the fifth insulating film 104, and the first insulating film 103 are etched.

As illustrated in FIGS. 17A to 17C, the second resist 112 is stripped.

As illustrated in FIGS. 18A to 18C, a ninth insulating film 113 is deposited to perform planarization. The ninth insulating film 113 is preferably an oxide film. The presence of the ninth insulating film 113 can prevent a pillar-shaped semiconductor layer from bending or toppling when the eighth insulating film 110, the sixth insulating film 106, and the fifth insulating film 104 are removed later.

Figure 19B:
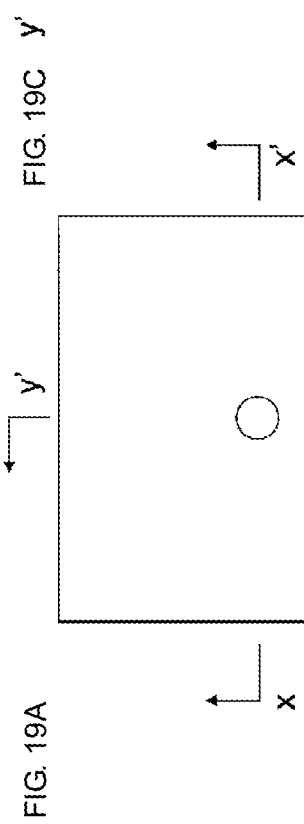
FIG. 19B is a sectional view taken along line x-x' of FIG. 19A.
Figure 19C:
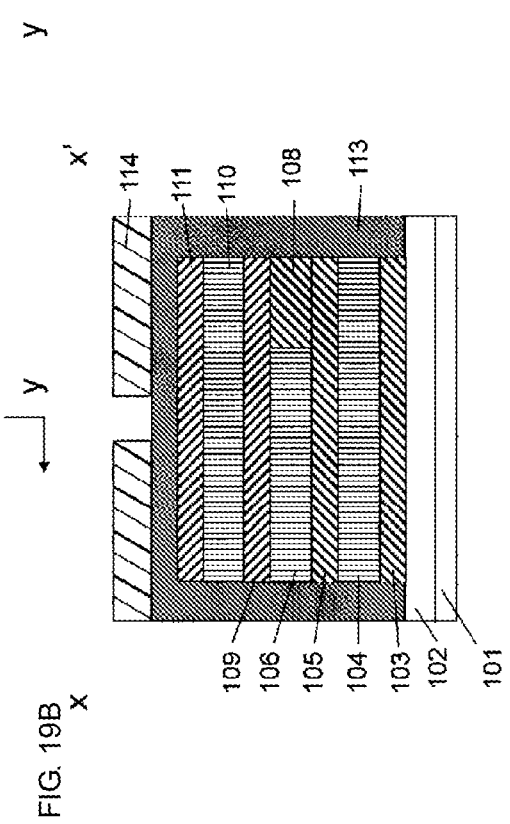
FIG. 19C is a sectional view taken along line y-y' of FIG. 19A.

As illustrated in FIGS. 19A to 19C, a third resist 114 is formed.

As illustrated in FIGS. 20A to 20C, the ninth insulating film 113, the fourth insulating film 111, the eighth insulating film 110, the third insulating film 109, the sixth insulating film 106, the second insulating film 105, the fifth insulating film 104, and the first insulating film 103 are etched to form a contact hole 115.

As illustrated in FIGS. 21A to 21C, the third resist 114 is removed.

Figure 22C:
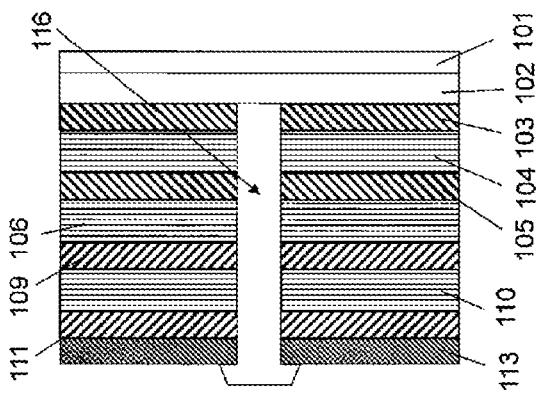
FIG. 22C is a sectional view taken along line y-y' of FIG. 22A.
Figure 22A:
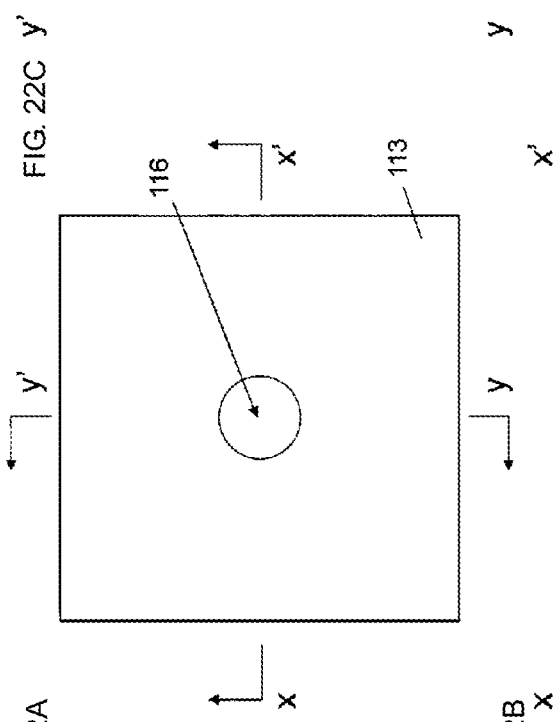
FIG. 22A is a plan view illustrating a method for producing a semiconductor device according to an embodiment of the present invention.
Figure 22B:
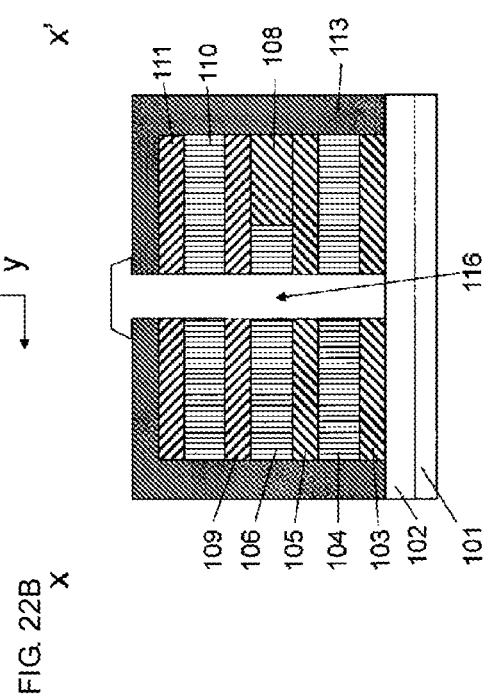
FIG. 22B is a sectional view taken along line x-x' of FIG. 22A.

As illustrated in FIGS. 22A to 22C, a first pillar-shaped silicon layer 116 is formed by performing epitaxial growth. A polysilicon may be deposited.

Figure 23A:
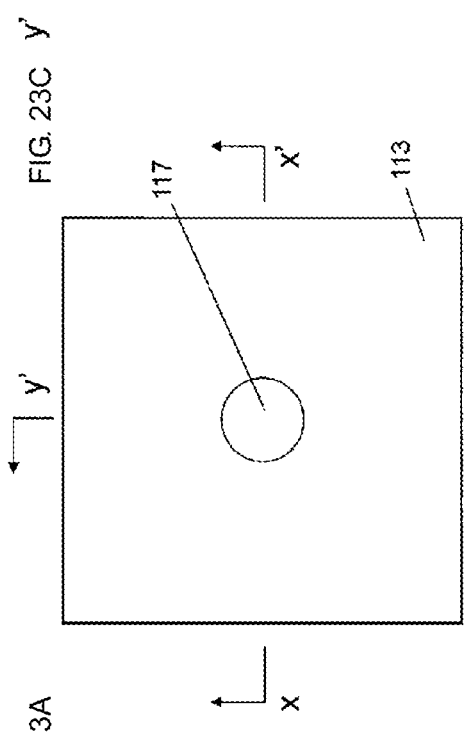
FIG. 23A is a plan view illustrating a method for producing a semiconductor device according to an embodiment of the present invention.
Figure 23C:
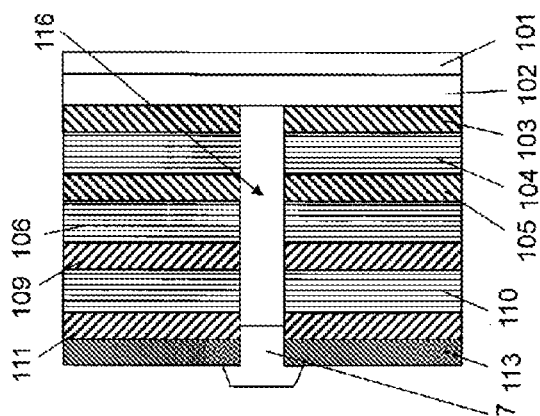
FIG. 23C is a sectional view taken along line y-y' of FIG. 23A.
Figure 23B:
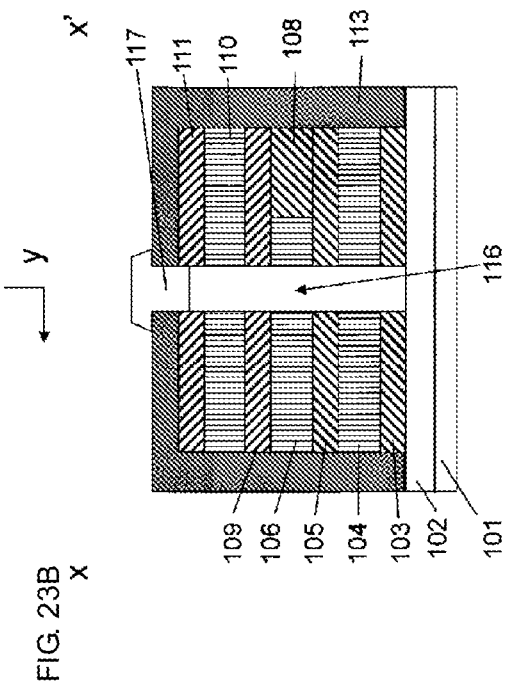
FIG. 23B is a sectional view taken along line x-x' of FIG. 23A.

As illustrated in FIGS. 23A to 23C, boron is introduced as an impurity to form a third second-conductivity-type silicon layer 117.

As illustrated in FIGS. 24A to 24C, a polysilicon 118 is deposited. A polysilicon is used herein, but any material that serves as a hard mask may be used.

As illustrated in FIGS. 25A to 25C, a fourth resist 119 is formed.

As illustrated in FIGS. 26A to 26C, the polysilicon 118, the ninth insulating film 113, and the fourth insulating film 111 are etched.

As illustrated in FIGS. 27A to 27C, the fourth resist 119 is removed.

As illustrated in FIGS. 28A to 28C, the eighth insulating film 110 is etched. Wet etching is preferably employed.

As illustrated in FIGS. 29A to 29C, a second gate insulating film 120 is formed. The second gate insulating film 120 is preferably an oxide film, an oxynitride film, or a high-K dielectric film.

As illustrated in FIGS. 30A to 30C, a metal 121 to be a second gate 121 is formed. The metal 121 is preferably titanium nitride or titanium aluminum nitride.

As illustrated in FIGS. 31A to 31C, the metal 121 is etched to form a second gate 121.

As illustrated in FIGS. 32A to 32C, the exposed second gate insulating film 120 and the third insulating film 109 are etched to expose the sixth insulating film 106.

As illustrated in FIGS. 33A to 33C, a tenth insulating film 122 is deposited. The tenth insulating film 122 is preferably an oxide film.

As illustrated in FIGS. 34A to 34C, the tenth insulating film 122 is etched so as to be left as a sidewall.

As illustrated in FIGS. 35A to 35C, the sixth insulating film 106 is etched. Wet etching is preferably employed.

As illustrated in FIGS. 36A to 36C, a metal 123 to be an output terminal 123 is formed. The metal 123 is preferably titanium nitride, titanium aluminum nitride, or tungsten.

As illustrated in FIGS. 37A to 37C, the metal 123 is etched to form an output terminal 123.

As illustrated in FIGS. 38A to 38C, the second insulating film 105 is etched to expose the fifth insulating film 104.

As illustrated in FIGS. 39A to 39C, an eleventh insulating film 124 is deposited. The eleventh insulating film 124 is preferably an oxide film.

As illustrated in FIGS. 40A to 40C, the eleventh insulating film 124 is etched so as to be left as a sidewall.

As illustrated in FIGS. 41A to 41C, the fifth insulating film 104 is etched. Wet etching is preferably employed.

Figures 42A, 42B, 42C:
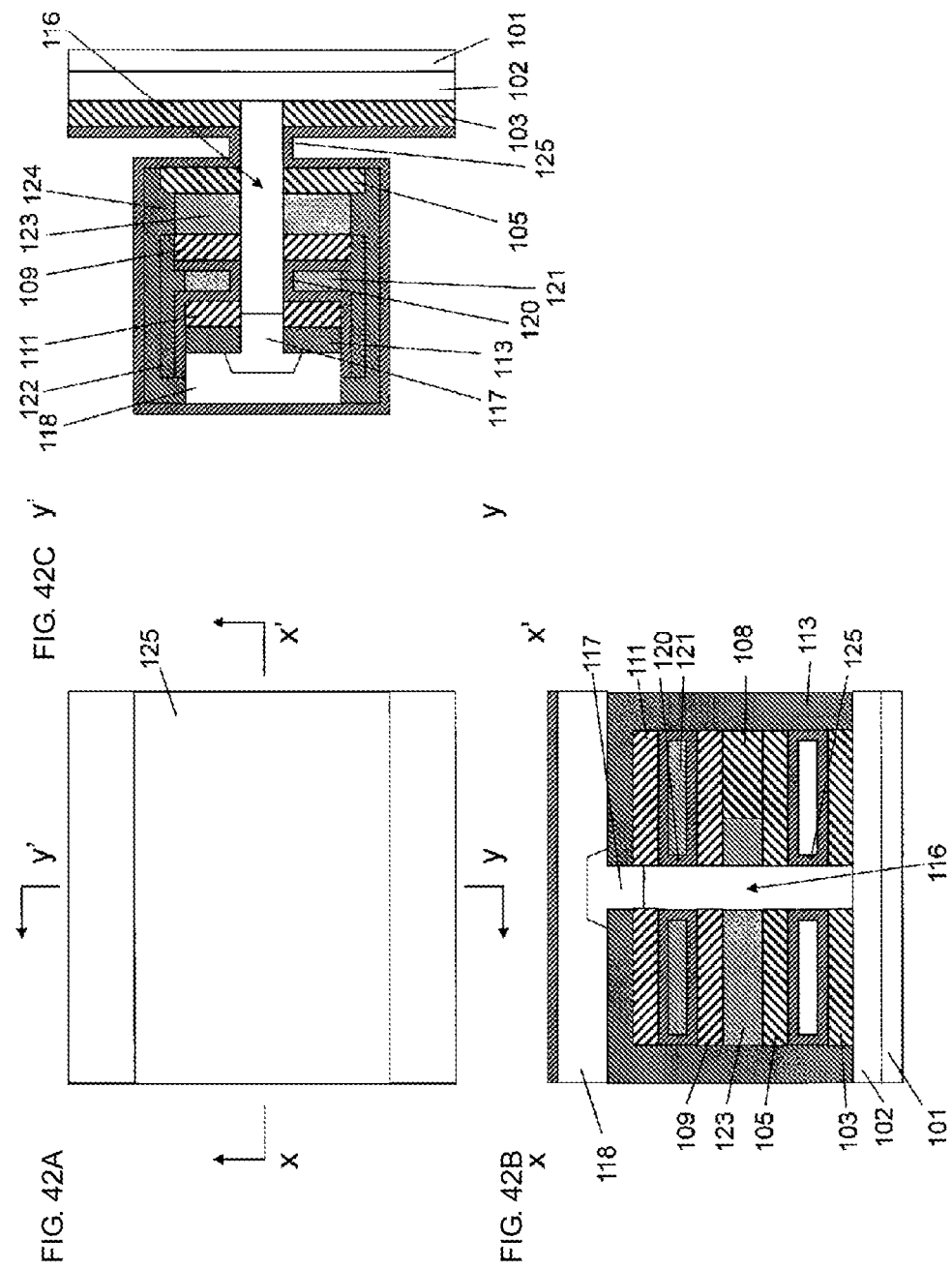
FIG. 42A is a plan view illustrating a method for producing a semiconductor device according to an embodiment of the present invention.
FIG. 42B is a sectional view taken along line x-x' of FIG. 42A.
FIG. 42C is a sectional view taken along line y-y' of FIG. 42A.

As illustrated in FIGS. 42A to 42C, a first gate insulating film 125 is formed. The first gate insulating film 125 is preferably an oxide film, an oxynitride film, or a high-K dielectric film.

As illustrated in FIGS. 43A to 43C, a metal 126 to be a first gate 126 is formed. The metal 126 is preferably titanium nitride or titanium aluminum nitride.

As illustrated in FIGS. 44A to 44C, the metal 126 is etched to form a first gate 126.

As illustrated in FIGS. 45A to 45C, the exposed first gate insulating film 125 is etched.

As illustrated in FIGS. 46A to 46C, a first interlayer insulating film 127 is deposited to perform planarization. Thus, the polysilicon 118 is exposed.

As illustrated in FIGS. 47A to 47C, the polysilicon 118 is etched. Herein, part of the third second-conductivity-type silicon layer 117 is etched.

As illustrated in FIGS. 48A to 48C, a heat treatment is performed to form a first first-conductivity-type silicon layer 131, a second first-conductivity-type silicon layer 130, a first second-conductivity-type silicon layer 129, and a second second-conductivity-type silicon layer 128 through solid-state diffusion. The heat treatment may be performed before the formation of the second gate 121.

As illustrated in FIGS. 49A to 49C, a fifth resist 132 is formed.

As illustrated in FIGS. 50A to 50C, the ninth insulating film 113 and the second gate insulating film 120 are etched.

Figure 51C:
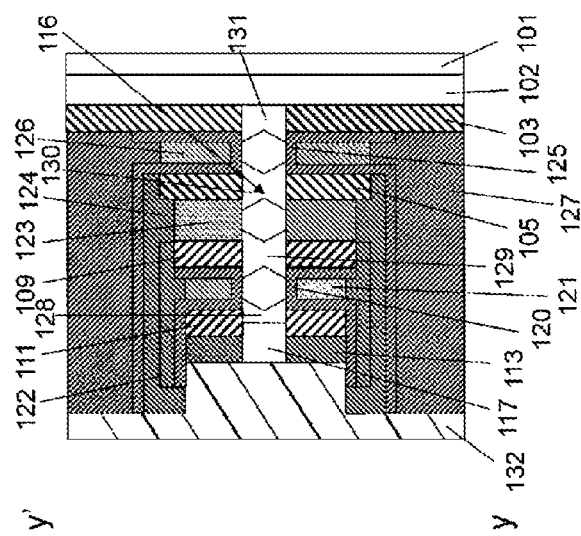
FIG. 51C is a sectional view taken along line y-y' of FIG. 51A.
Figure 51A:
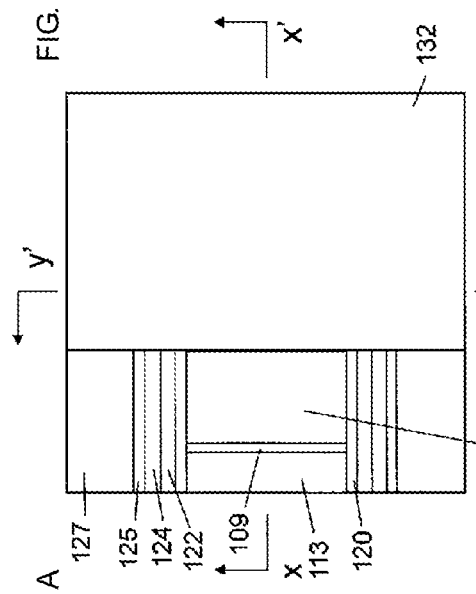
FIG. 51A is a plan view illustrating a method for producing a semiconductor device according to an embodiment of the present invention.
Figure 51B:
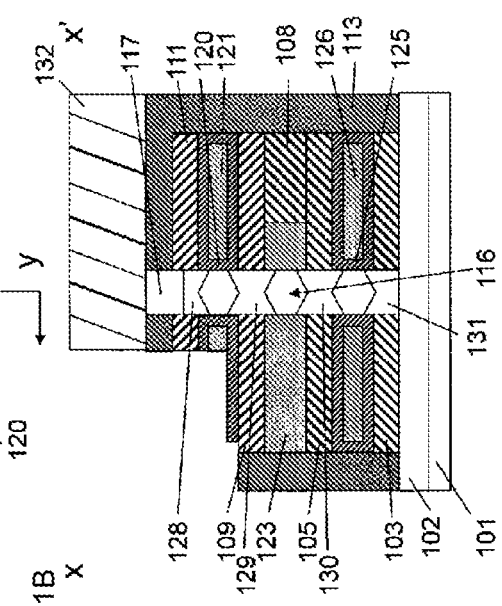
FIG. 51B is a sectional view taken along line x-x' of FIG. 51A.

As illustrated in FIGS. 51A to 51C, the second gate 121 is etched.

As illustrated in FIGS. 52A to 52C, the second gate insulating film 120 is etched.

As illustrated in FIGS. 53A to 53C, the fifth resist 132 is removed.

Figure 54C:
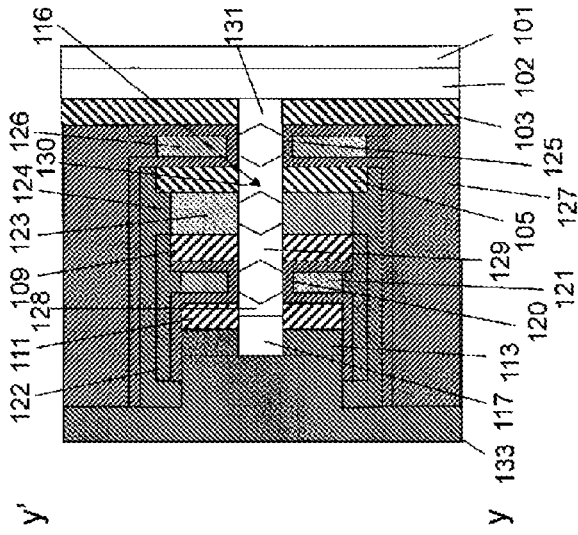
FIG. 54C is a sectional view taken along line y-y' of FIG. 54A.
Figure 54A:
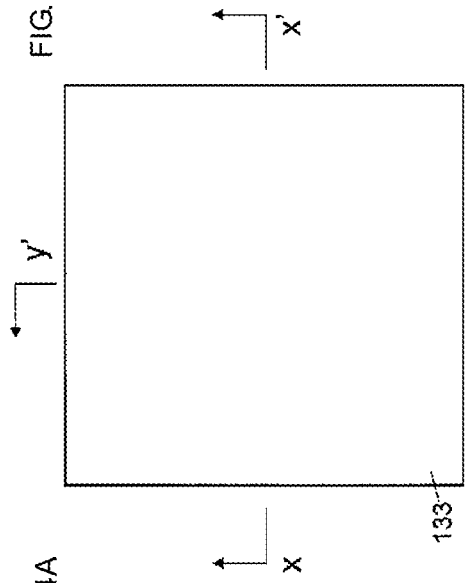
FIG. 54A is a plan view illustrating a method for producing a semiconductor device according to an embodiment of the present invention.
Figure 54B:
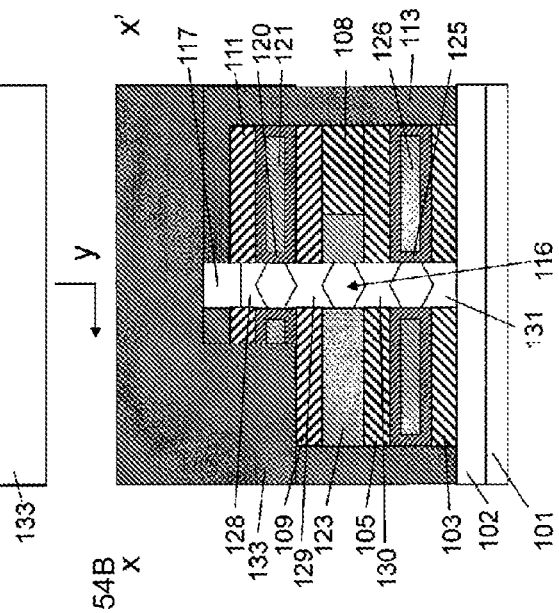
FIG. 54B is a sectional view taken along line x-x' of FIG. 54A.

As illustrated in FIGS. 54A to 54C, a second interlayer insulating film 133 is deposited to perform planarization.

As illustrated in FIGS. 55A to 55C, the second interlayer insulating film 133 is etched back to expose the third second-conductivity-type silicon layer 117.

As illustrated in FIGS. 56A to 56C, a sixth resist 134 is formed.

As illustrated in FIGS. 57A to 57C, the first interlayer insulating film 127 is etched to form a contact hole 135.

As illustrated in FIGS. 58A to 58C, the sixth resist 134 is removed.

As illustrated in FIGS. 59A to 59C, a seventh resist 136 is formed.

As illustrated in FIGS. 60A to 60C, the second interlayer insulating film 133 is etched to form a contact hole 137.

As illustrated in FIGS. 61A to 61C, the seventh resist 136 is removed.

As illustrated in FIGS. 62A to 62C, an eighth resist 138 is formed.

Figure 63C:
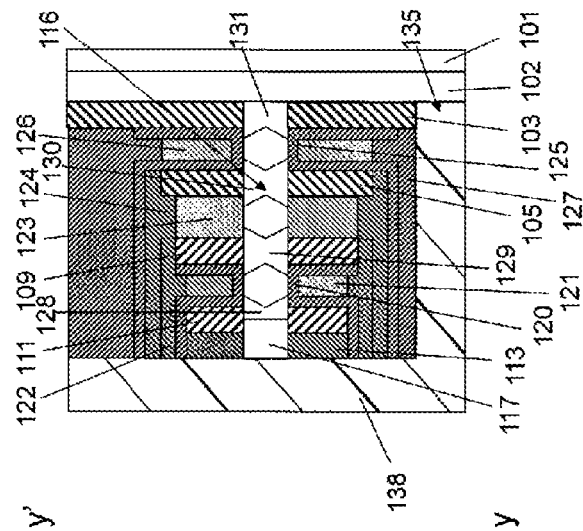
FIG. 63C is a sectional view taken along line y-y' of FIG. 63A.
Figure 63A:
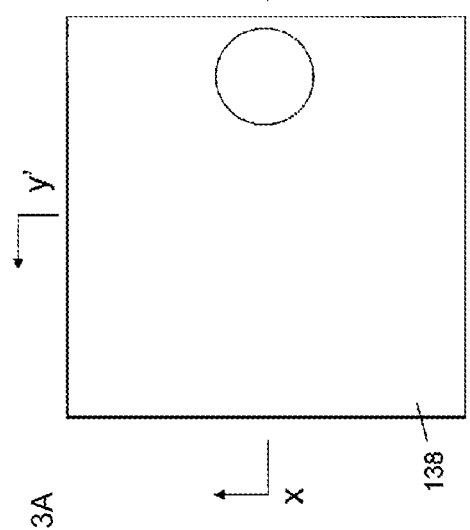
FIG. 63A is a plan view illustrating a method for producing a semiconductor device according to an embodiment of the present invention.
Figure 63B:
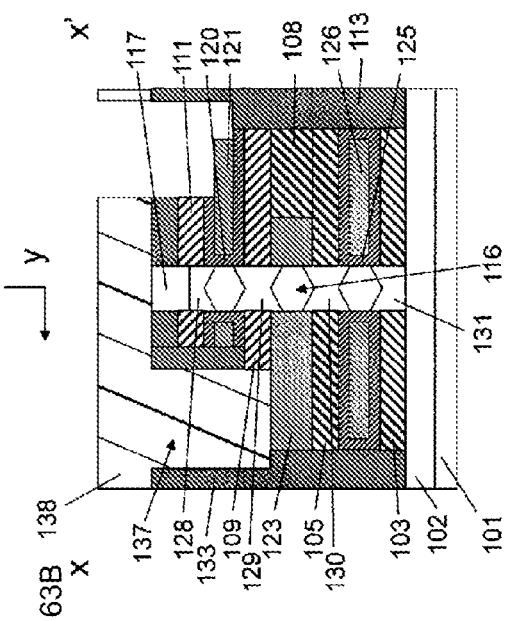
FIG. 63B is a sectional view taken along line x-x' of FIG. 63A.

As illustrated in FIGS. 63A to 63C, the ninth insulating film 113 and the second gate insulating film 120 are etched.

As illustrated in FIGS. 64A to 64C, the second gate 121 is etched.

As illustrated in FIGS. 65A to 65C, the second gate insulating film 120, the third insulating film 109, the seventh insulating film 108, the second insulating film 105, and the first gate insulating film 125 are etched to form a contact hole 139.

As illustrated in FIGS. 66A to 66C, the eighth resist 138 is removed.

As illustrated in FIGS. 67A to 67C, a metal 143 is deposited to form contacts 140 and 141 and a first contact 142.

As illustrated in FIGS. 68A to 68C, ninth resists 144, 145, 146, and 147 are formed.

As illustrated in FIGS. 69A to 69C, the metal 143 is etched to form metal wirings 143a, 143b, 143c, and 143d.

As illustrated in FIGS. 70A to 70C, the ninth resists 144, 145, 146, and 147 are removed.

The method for producing a semiconductor device according to an embodiment of the present invention has been described above.

In the present invention, various embodiments and modifications can be made without departing from the broad spirit and scope of the present invention. Furthermore, the above-described embodiment is provided to describe one embodiment of the present invention, and the scope of the present invention is not limited thereto.

For example, a method for producing a semiconductor device in which the p-type (including the p$^+$-type) and the n-type (including the n$^+$-type) are each changed to the opposite conductivity type in the above embodiment, and a semiconductor device produced by the method are also obviously included in the technical scope of the present invention.

The invention claimed is:

1. A semiconductor device comprising:
    a third first-conductivity-type semiconductor layer on a semiconductor substrate;
    a first pillar-shaped semiconductor structure vertically extending from a surface of the semiconductor substrate, the first pillar-shaped semiconductor structure including, in sequence,
    a first first-conductivity-type semiconductor layer,
    a first body region,
    a second first-conductivity-type semiconductor layer,
    a first second-conductivity-type semiconductor layer;
    a second body region,
    a second second-conductivity-type semiconductor layer, and
    a third second-conductivity-type semiconductor layer,
    each layer and region vertically aligned within the first pillar-shaped semiconductor structure;
    the semiconductor device further comprising:
    a first gate insulating film around the first body region;
    a first metal gate around the first gate insulating film;
    a second gate insulating film around the second body region;
    a second metal gate around the second gate insulating film;
    an output terminal connected to the second first-conductivity-type semiconductor layer and the first second-conductivity-type semiconductor layer; and
    a first contact connecting the first metal gate and the second metal gate;
    a first insulating film surrounding the first first-conductivity-type semiconductor layer and a second insulating film surrounding the second first-conductivity-type semiconductor layer;
    a third insulating film surrounding the first second-conductivity-type semiconductor layer and a fourth insulating film surrounding the second second-conductivity-type semiconductor layer;
    wherein the first insulating film and the second insulating film contain a same impurity as the first and second first-conductivity-type semiconductor layers, respectively; and
    wherein the third insulating film and the fourth insulating film contain a same impurity as the first and second second-conductivity-type semiconductor layers, respectively.

* * * * *